(12) United States Patent
Tanaka et al.

(10) Patent No.: US 7,968,453 B2
(45) Date of Patent: Jun. 28, 2011

(54) METHOD FOR MANUFACTURING DISPLAY DEVICE, AND ETCHING APPARATUS

(75) Inventors: Koichiro Tanaka, Kanagawa (JP); Masafumi Morisue, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 137 days.

(21) Appl. No.: 11/870,530

(22) Filed: Oct. 11, 2007

(65) Prior Publication Data

US 2008/0090341 A1     Apr. 17, 2008

(30) Foreign Application Priority Data

Oct. 12, 2006   (JP) ................................. 2006-279206

(51) Int. Cl.
*H01L 21/4763* (2006.01)

(52) U.S. Cl. ........ 438/637; 438/639; 438/640; 438/700; 438/701

(58) Field of Classification Search .................. 438/639, 438/748; 156/345.29; 216/92–104
See application file for complete search history.

(56) References Cited

U.S. PATENT DOCUMENTS

| | | | |
|---|---|---|---|
| 5,779,928 A * | 7/1998 | Yamashita et al. ............. 216/92 |
| 5,880,038 A | 3/1999 | Yamazaki et al. | |
| 6,372,636 B1 * | 4/2002 | Chooi et al. .................. 438/639 |
| 6,475,836 B1 | 11/2002 | Suzawa et al. | |
| 6,586,329 B1 * | 7/2003 | Tanaka et al. .................. 438/629 |
| 6,683,009 B2 * | 1/2004 | Adler et al. .................... 438/748 |
| 6,686,228 B2 | 2/2004 | Suzawa et al. | |
| 6,861,670 B1 | 3/2005 | Ohtani et al. | |
| 6,900,462 B2 | 5/2005 | Suzawa et al. | |
| 7,176,069 B2 | 2/2007 | Yamazaki et al. | |
| 7,189,654 B2 | 3/2007 | Yamazaki et al. | |
| 2004/0134878 A1 * | 7/2004 | Matsushita et al. ............. 216/23 |
| 2004/0253896 A1 | 12/2004 | Yamazaki | |
| 2004/0266073 A1 | 12/2004 | Yamazaki | |
| 2005/0013927 A1 | 1/2005 | Yamazaki | |
| 2005/0064091 A1 | 3/2005 | Yamazaki | |
| 2005/0074963 A1 | 4/2005 | Fujii et al. | |
| 2005/0090029 A1 | 4/2005 | Yamazaki et al. | |
| 2005/0167404 A1 | 8/2005 | Yamazaki | |
| 2005/0200767 A1 | 9/2005 | Suzawa et al. | |
| 2005/0250308 A1 * | 11/2005 | Yamaguchi et al. .......... 438/618 |
| 2005/0266693 A1 | 12/2005 | Maekawa | |
| 2007/0172972 A1 | 7/2007 | Yamazaki et al. | |

FOREIGN PATENT DOCUMENTS

| | | |
|---|---|---|
| JP | 2000-133636 | 5/2000 |
| JP | 2006-245138 | 9/2006 |

* cited by examiner

*Primary Examiner* — Andy Huynh
*Assistant Examiner* — Aaron A Dehne
(74) *Attorney, Agent, or Firm* — Nixon Peabody LLP; Jeffrey L. Costellia

(57) ABSTRACT

A tube is arranged to be in contact with an insulating layer in an opening formation region, and a treatment agent (etching gas or etchant) is discharged to the insulating layer through the tube. With the discharged treatment agent (etching gas or etchant), the insulating layer is selectively removed to form an opening in the insulating layer. Therefore, the insulating layer provided with the opening is formed over a first conductive layer, and the first conductive layer below the insulating layer is exposed at the bottom of the opening. A second conductive layer is formed in the opening to be in contact with an exposed part of the first conductive layer, so that the first conductive layer and the second conductive layer are electrically connected in the opening provided in the insulating layer.

24 Claims, 42 Drawing Sheets

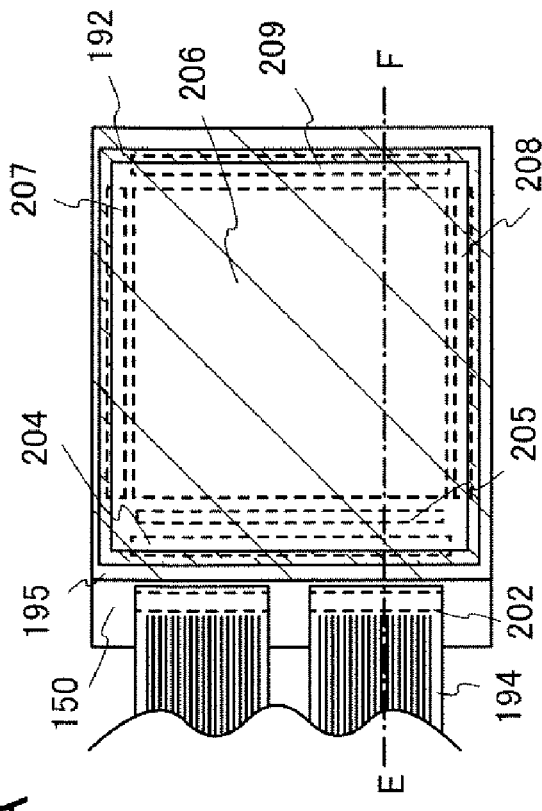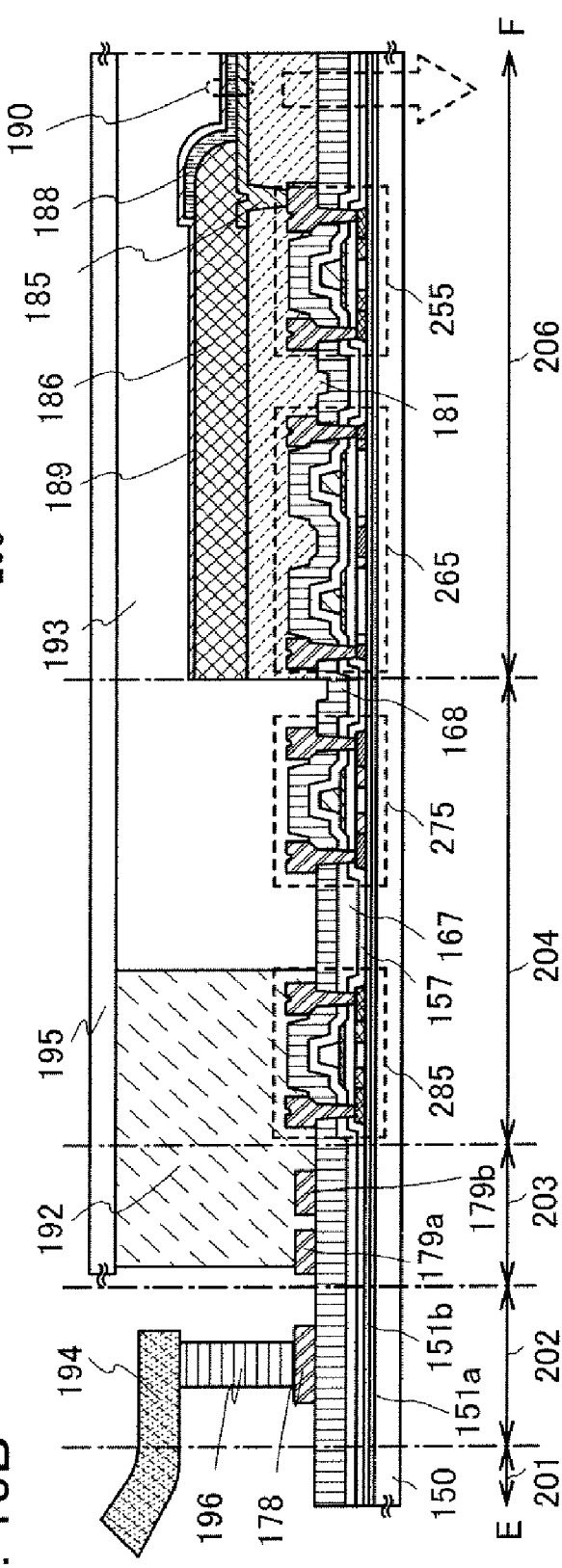

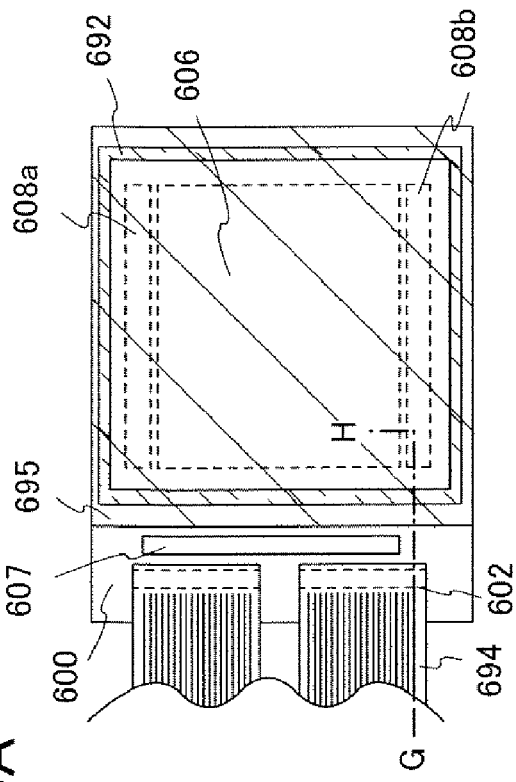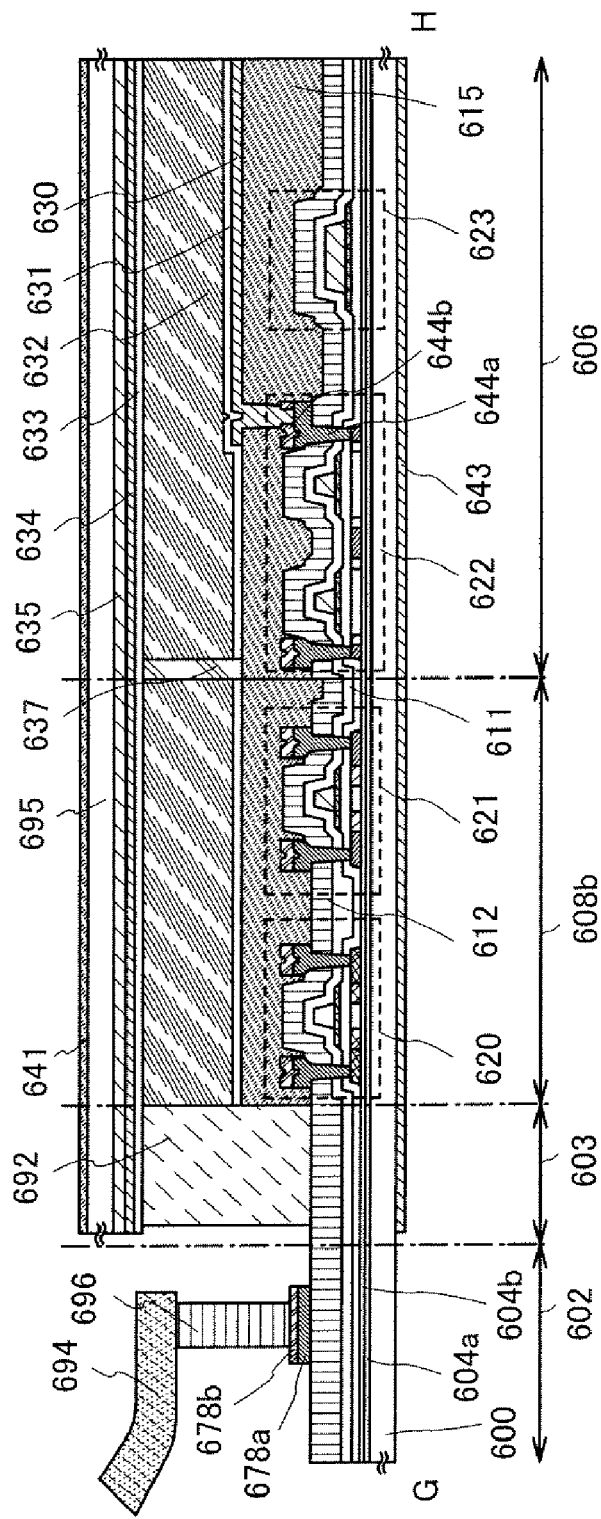
FIG. 19A
FIG. 19B

FIG. 28A
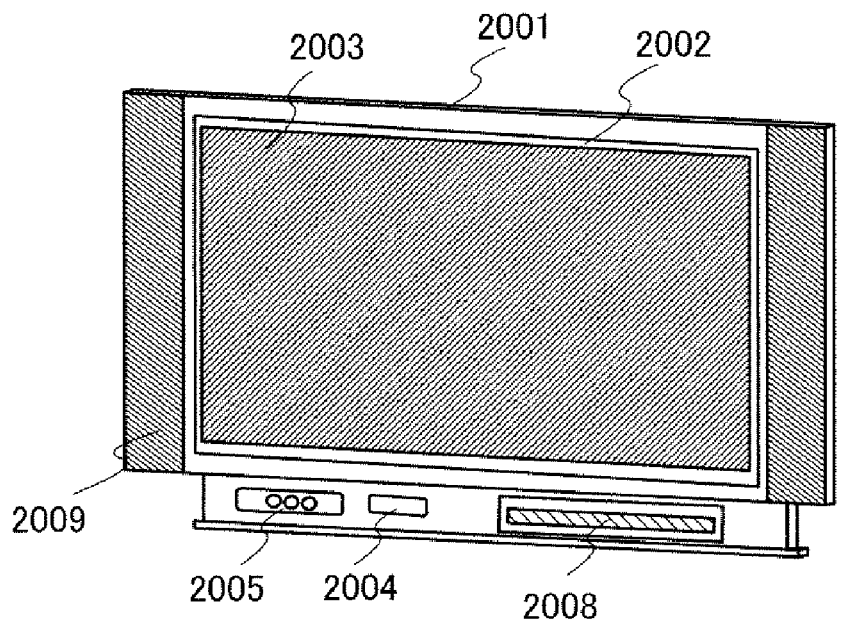
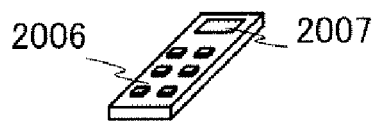
FIG. 28B
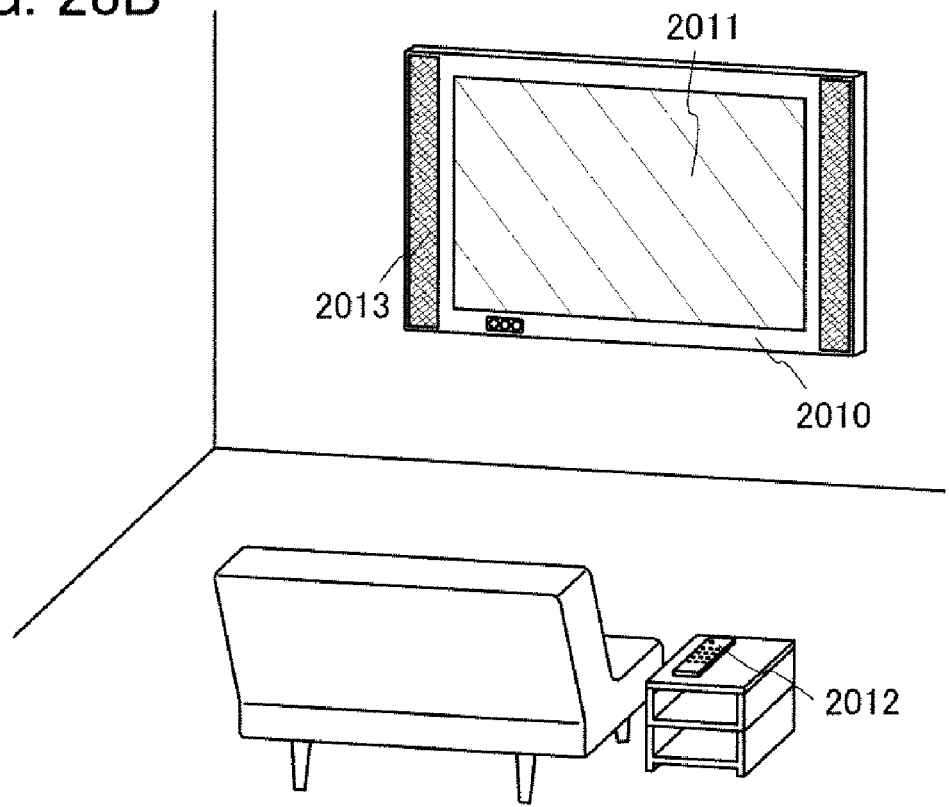

780 781 788 795a 782a 795b 782b 786a 796a    783 784    786b 796b 789    785 786

787

METHOD FOR MANUFACTURING DISPLAY DEVICE, AND ETCHING APPARATUS

BACKGROUND OF THE INVENTION

1. Field of the Invention

The present invention relates to a manufacturing technique for selectively etching a minute region. In particular, the present invention relates to a manufacturing technique of an integrated circuit substrate, in which a minute opening is formed, used for display devices such as flat panel displays.

2. Description of the Related Art

Thin film transistors (also referred to as "TFTs") and electronic circuits having TFTs are manufactured by the steps of stacking various thin films such as a semiconductor film, an insulating film, and a conductive film over a substrate, and appropriately forming the films into predetermined patterns by a photolithography technique. A photolithography technique is a technique of transferring a circuit pattern or the like, which is called a photomask and is formed from a non-light-transmitting material on a transparent flat plate, onto a substrate utilizing light-exposure, and is widely used in the process of manufacturing semiconductor integrated circuits and the like.

A conventional manufacturing process using a photolithography technique involves a number of steps such as light-exposure, development, baking, and peeling, for handling a mask pattern which is formed from a photosensitive organic resin material called a photoresist. Therefore, the more the number of photolithography steps is increased, the more the manufacturing cost is inevitably increased. In order to overcome such drawbacks, a manufacturing process of TFTs with a reduced number of photolithography steps has been studied (refer to Reference 1: Japanese Published Patent Application No. 2000-133636). In Reference 1, a resist mask formed by photolithography steps which is used once is subjected to cubical expansion by swelling, so that the mask can be used again as a resist mask with a different shape.

SUMMARY OF THE INVENTION

As described above, in the manufacturing process of the semiconductor integrated circuits and the like, a photolithography step is essential. With a photolithography step, the number of steps in the manufacturing process is increased and the process becomes complicated. Moreover, an expensive photomask is necessary, which increases the cost. Further, since a large amount of photoresist and organic solvent such as a developing solution and a stripper are used, high cost is required for the disposal of waste fluid, in order to protect the environment.

It is an object of the present invention to provide a technique of manufacturing semiconductor integrated circuits with a reduced number of photolithography steps.

In the present invention, an opening is selectively formed in a thin film using a tube. The tube used in the present invention means a narrow pipe having a hollow structure, and an end of the pipe opens. Therefore, since the tube is a hollow pipe provided with an orifice at the end, a material such as a treatment agent can flow through the inside of the tube and flow out from the tube through the orifice. By providing the tube to be in contact with a film to be processed, the thin film in a part inside the tube and the thin film in a part outside the tube can be separated. In the present invention, a substance is discharged or sucked through the inside of the tube. With the use of the tube of the present invention, an opening or a conductive layer can be selectively formed.

In the present invention, a tube is arranged to be in contact with an insulating layer in an opening formation region, and a treatment agent (etching gas or etchant) is discharged (jetted) to the insulating layer through the tube. With the treatment agent (etching gas or etchant) that is discharged (jetted), the insulating layer is selectively removed to form an opening in the insulating layer. Therefore, the insulating layer provided with an opening is formed over a conductive layer, and the conductive layer below the insulating layer is exposed at the bottom of the opening. A conductive film is formed in the opening to be in contact with an exposed part of the conductive layer, so that the conductive layer and the conductive film are electrically connected to each other in the opening provided in the insulating layer.

It is also possible that the tube is arranged so as to be partially embedded in the insulating layer, and a first opening is formed in the insulating layer by physical force. Then, an etching gas is jetted from the tube to remove the insulating layer selectively, so that a second opening is formed. In other words, the first opening may be formed by physical force using the tube in advance, and the second opening may be formed by chemical force using the etching gas jetted from the tube. Alternatively, the first opening may be formed by discharging the etching gas from the tube and the tube may be stuck into the insulating layer to form the second opening, or the etching gas may be discharged and the tube may be stuck into the insulating layer to form the opening at the same time.

A treatment agent (etching gas or etchant) discharged from the tube can be appropriately selected depending on a thin film that is etched as long as the tube can resist the treatment agent. For example, when a multilayer wiring including stacked layers or the like is formed, the present invention can be used in forming a continuous opening in multiple different thin films that are stacked.

Further, after the opening is formed in the insulating layer using the tube of the present invention, a material for forming a film (such as a conductive composition) in a liquid state may be discharged to the opening through the tube to form a conductive layer. With a minute opening, it may be difficult to fill the opening assuredly with a liquid material for forming a film by the surface tension; however, in the present invention, the opening is assuredly filled with a material for forming a film by the tube stuck into the opening, and thus, a film can be formed without a defective shape.

Since the shape of the opening reflects the shapes of the tube and its discharging outlet for discharging an etching substance, the shape of the tube may be selected so that a desired shape of the opening can be obtained. The tube may have a columnar shape (prism, cylinder, or triangular prism) or a needle shape. The depth of the opening can be determined by force at a time when the tube is provided and intensity of the conductive layer over which the tube is placed. In addition, the depth in a thickness direction may also be determined by setting etching conditions such as etching time. When a needle-shaped tube whose end has a sharp point is provided so as to be partially embedded in the conductive layer, an opening with a recessed portion in the conductive layer can be formed. Further, after the opening is formed, an exposed part of the conductive layer at the bottom of the opening may be removed by etching, using the insulating layer provided with the opening as a mask.

In the present invention, the tube (a narrow pipe) is arranged to be in contact with the insulating layer in the opening formation region. Therefore, the opening formation region of the insulating layer can be provided physically, so that the opening can be assuredly formed in a desired position. Therefore, a semiconductor device and a display device can be manufactured with high yield by using the present invention.

According to the present invention, the opening can be selectively formed in a thin film without using a photolithography step. Therefore, the number of steps and materials can be reduced.

One aspect of the present invention is a method for manufacturing a display device, including the steps of forming a first conductive layer; forming an insulating layer over the first conductive layer; arranging a narrow pipe to be in contact with the insulating layer; forming an opening, which reaches the first conductive layer, in the insulating layer by supplying a treatment agent to the insulating layer through the narrow pipe; and forming a second conductive layer in the opening so as to be in contact with the first conductive layer.

Another aspect of the present invention is a method for manufacturing a display device, including the steps of forming a first conductive layer; forming an insulating layer over the first conductive layer; arranging a narrow pipe to be in contact with the insulating layer; forming an opening, which reaches the first conductive layer, in the insulating layer by supplying a treatment agent through the narrow pipe; and forming a second conductive layer in the opening so as to be in contact with the first conductive layer by supplying a composition including a conductive material in the opening through the narrow pipe.

Another aspect of the present invention is a method for manufacturing a display device, including the steps of forming a first conductive layer; forming a first insulating layer over the first conductive layer; forming a second insulating layer over the first insulating layer; sticking a narrow pipe into the second insulating layer to form a first opening; forming a second opening, which reaches the first conductive layer, in the first insulating layer by supplying a treatment agent through the narrow pipe; and forming a second conductive layer in the first opening and the second opening so as to be in contact with the first conductive layer.

Another aspect of the present invention is a method for manufacturing a display device, including the steps of forming a first conductive layer; forming a first insulating layer over the first conductive layer; forming a second insulating layer over the first insulating layer; sticking a narrow pipe into the second insulating layer to form a first opening; forming a second opening, which reaches the first conductive layer, in the first insulating layer by supplying a treatment agent through the narrow pipe; and forming a second conductive layer in the first opening and the second opening so as to be in contact with the first conductive layer by supplying a composition including a conductive material through the narrow pipe.

Another aspect of the present invention is a method for manufacturing a display device, including the steps of forming a gate electrode layer, a gate insulating layer adjacent to the gate electrode layer, a semiconductor layer adjacent to the gate insulating layer, a source electrode layer and a drain electrode layer adjacent to the semiconductor layer; forming an insulating layer over the source electrode layer and the drain electrode layer; arranging a narrow pipe so as to be in contact with the insulating layer; forming an opening, which reaches the source electrode layer or the drain electrode layer, in the insulating layer by supplying a treatment agent through the narrow pipe; and forming a pixel electrode layer in the opening so as to be in contact with the source electrode layer or the drain electrode layer.

Another aspect of the present invention is a method for manufacturing a display device, including the steps of forming a semiconductor layer including a source region and a drain region; forming a gate insulating layer over the semiconductor layer; forming a gate electrode layer over the semiconductor layer and the gate insulating layer; forming an insulating layer over the semiconductor layer, the gate insulating layer, and the gate electrode layer; forming a first opening in the insulating layer by using a first narrow pipe; forming a second opening, which reaches the source region in the insulating layer and the gate insulating layer by supplying a treatment agent through the first narrow pipe; and forming a source electrode layer so as to be in contact with the source region in the first opening and the second opening; forming a third opening in the insulating layer by using a second narrow pipe; forming a fourth opening, which reaches the drain region, in the insulating layer and the gate insulating layer by supplying a treatment agent through the second narrow pipe; and forming a drain electrode layer so as to be in contact with the drain region in the third opening and the fourth opening.

In the above aspects, the treatment agent may be sucked through the narrow pipe and removed from the opening after being discharged from the narrow pipe. When an etching gas or an etchant is used as the treatment agent, the insulating layer can be selectively removed, so that the opening can be formed.

A semiconductor layer can also be used instead of the conductive layer that is formed as described above by using a semiconductor material. The conductive layer and the semiconductor layer can be used for any conductive layer and semiconductor layer included in the display device. For example, the conductive layer can be used for a wiring layer, a gate electrode layer, a source electrode layer, a drain electrode layer, a pixel electrode layer, and the like.

Another aspect of the present invention is an etching apparatus including a narrow pipe having a hollow structure whose end opens; a stage configured to hold a substrate; a position control unit which moves and sets the narrow pipe in a predetermined position on the substrate; a material storing chamber which supplies a treatment agent to the narrow pipe; and a discharge control unit which discharges the treatment agent from the narrow pipe.

Another aspect of the present invention is an etching apparatus including a narrow pipe having a hollow structure whose end opens; a stage configured to hold a substrate; a position control unit which moves and sets the narrow pipe in a predetermined position on the substrate so that an end of the narrow pipe is in contact with a surface to be processed; a material storing chamber which supplies a treatment agent to the narrow pipe; and a discharge control unit which discharges the treatment agent from the narrow pipe.

Another aspect of the present invention is an etching apparatus including a narrow pipe having a hollow structure whose end opens; a stage configured to hold a substrate; a position control unit which moves and sets the narrow pipe in a predetermined position on the substrate; a material storing chamber which supplies a treatment agent to the narrow pipe; a discharge control unit which discharges the treatment agent from the narrow pipe; and a suction control unit which sucks the discharged treatment agent.

Another aspect of the present invention is an etching apparatus including a narrow pipe having a hollow structure whose end opens; a stage configured to hold a substrate; a position control unit which moves the narrow pipe in a predetermined position on the substrate so that an end of the narrow pipe is in contact with a surface to be processed; a material storing chamber which supplies a treatment agent to the narrow pipe; a discharge control unit which discharges the treatment agent from the narrow pipe; and a suction control unit which sucks the discharged treatment agent.

By using the etching apparatus of the present invention, a display device and a semiconductor device of the present invention can be manufactured.

The present invention can be applied to a display device having a display function. Examples of display devices that apply the present invention include a light-emitting display device having a light-emitting element and a TFT connected together, in which the light-emitting element includes a layer which contains an organic substance, an inorganic substance, or a mixture of an organic substance and an inorganic substance between a pair of electrodes and which exhibits light-emission called electroluminescence (hereinafter also referred to as "EL"); a liquid crystal display device which uses a liquid crystal element containing a liquid crystal material as a display element; and the like. In the present invention, a "display device" means a device having display elements (e.g., liquid crystal elements or light-emitting elements). It is to be noted that the display device can be a display panel in which a plurality of pixels each having a display element such as a liquid crystal element or an EL element and a peripheral driver circuit for driving the pixel are formed over a substrate. Further, a flexible printed circuit (FPC) or a printed wiring board (PWB) (e.g., ICs, resistors, capacitors, inductors, and transistors) can be attached to such a display panel. Furthermore, a display panel may include optical sheets such as a polarizing plate and a retardation plate. In addition, a display panel may also include a backlight unit (which may include a light guide plate, a prism sheet, a diffusion sheet, a reflection sheet, and a light source (e.g., LED or a cold cathode tube)).

It is to be noted that a display element and a display device can be in various forms and have various elements. For examples, the following can be used: an EL element (an organic EL element, an inorganic EL element, or an EL element containing an organic substance and an inorganic substance), an electron-emissive element, a liquid crystal element, electronic ink, a grating light valve (GLV), a plasma display panel (PDP), a digital micromirror device (DMD), a piezoceramic display, a carbon nanotube, and a display medium whose contrast changes by an electromagnetic action. It is to be noted that display devices using EL elements include an EL display; display devices using electron-emissive elements include a field emission display (FED), a surface-conduction electron-emitter display (SED), and the like; display devices using liquid crystal elements include a liquid crystal display, a transmissive liquid crystal display, a semi-transmissive liquid crystal display, and a reflective liquid crystal display; and display devices using electronic ink include electronic paper.

With the present invention, a device having a circuit which includes semiconductor elements (transistors, memory elements, diodes, and the like) and a semiconductor device such as a chip having a processor circuit can be manufactured. It is to be noted that semiconductor devices of the present invention include devices that can function by utilizing semiconductor characteristics.

In accordance with the present invention, a contact hole can be formed in an insulating layer without forming a mask, so that the process can be simplified. Further, it is not necessary to perform light-exposure and development after application of a photoresist or the like, so that the cost of materials required for processing can be reduced. Furthermore, the contact hole can be assuredly formed, whereby the yield in manufacturing a semiconductor device and a display device can be improved.

BRIEF DESCRIPTION OF THE DRAWINGS

In the accompanying drawings:

FIGS. 15A and 15B are explanatory views of a display device of the present invention;

FIGS. 19A and 19B are explanatory views of a display device of the present invention;

FIGS. 28A and 28B are views illustrating electronic devices to which the present invention can be applied;

DETAILED DESCRIPTION OF THE INVENTION

Figure 1A:
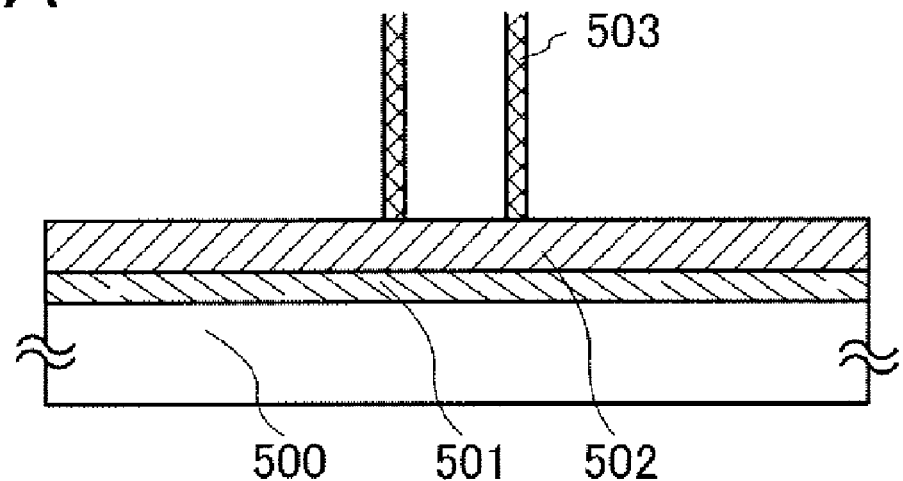
FIGS. 1A to 1C are explanatory schematic views of the present invention.

Embodiment Modes of the present invention will be described in detail with reference to the accompanying drawings. It is to be noted that the present invention is not limited to the following description, and it is easily understood by those skilled in the art that modes and details thereof can be modified in various ways without departing from the spirit and the scope of the present invention. Therefore, the present invention should not be interpreted as being limited to the following description of the embodiment modes. In a structure of the present invention to be given below, the same portions or portions having similar functions are denoted by the same reference numerals in different drawings, and explanation thereof will be omitted.

Embodiment Mode 1

Figure 1B:
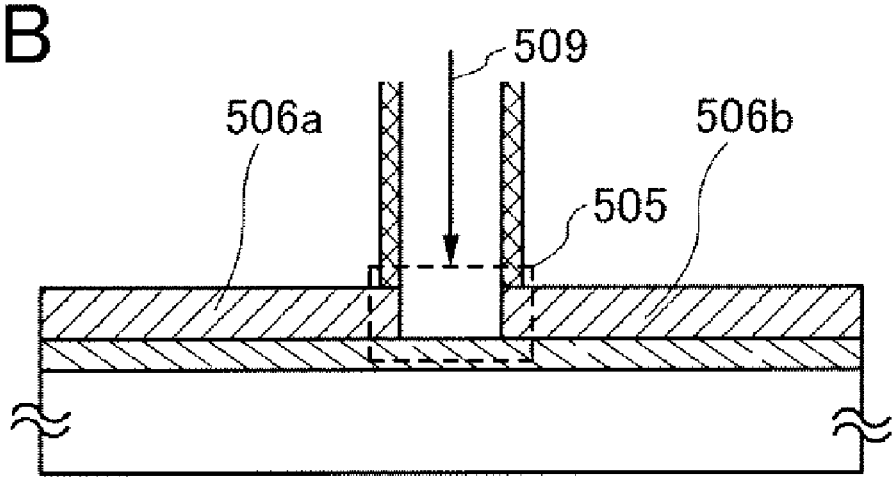
Figure 1C:
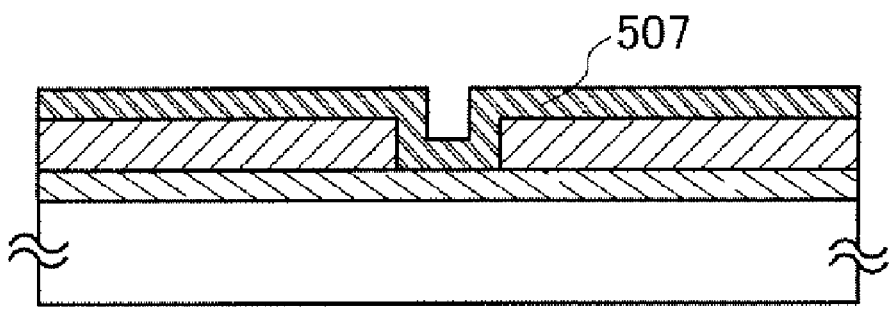

This embodiment mode will describe a method for forming a contact hole assuredly through a simplified process at low cost with reference to FIGS. 1A to 1C.

In the present invention, an opening is selectively formed in a thin film using a tube. The tube used in the present invention means a narrow pipe having a hollow structure, and an end of the pipe opens. Therefore, since the tube is a hollow pipe provided with an orifice at the end, a material such as a treatment agent can flow through the inside of the tube and flow out from the tube through the orifice. By providing the tube to be in contact with a film to be processed, the thin film in a part inside the tube and the thin film in a part outside the tube can be separated. In the present invention, a substance is discharged or sucked through the inside of the tube. With the use of the tube of the present invention, an opening or a conductive layer can be selectively formed.

In this embodiment mode, a tube is arranged to be in contact with an insulating layer in an opening formation region, and a treatment agent (etching gas or etchant) is discharged (jetted) to the insulating layer through the tube. With the treatment agent (etching gas or etchant) that is discharged (jetted), the insulating layer is selectively removed, so that an opening is formed in the insulating layer. Therefore, the insulating layer provided with an opening is formed over a first conductive layer, and the first conductive layer below the insulating layer is exposed at the bottom of the opening A second conductive layer is formed in the opening to be in contact with an exposed part of the first conductive layer, so that the first conductive layer and the second conductive layer are electrically connected to each other in the opening provided in the insulating layer.

This embodiment mode will be specifically described with reference to FIGS. 1A to 1C. As shown in FIG. 1A, a conductive layer 501 is formed over a substrate 500 having an insulating surface, and an insulating layer 502 is formed over the conductive layer 501. A tube 503 is provided to be in contact with the insulating layer 502 in an opening formation region. In FIGS. 1A to 1C, a unit which supports the tube 503 is not illustrated, and the tube 503 may be held by being in contact with the insulating layer 502. For example, the tube may be held on a film to be treated as follows: the tube may be provided on a substrate and the substrate may be used as a supporting unit (supporting substrate), or a supporting film may be formed over the film to be treated as a supporting unit and the tube may be stuck into the supporting film.

The tube supported by the supporting unit is placed in a predetermined position on the film to be treated by a movement control unit. First, the tube is moved to a position corresponding to a surface to be processed of the film to be treated. Next, the tube is moved to be in contact with the film to be treated and held by the supporting unit. When the tube is stuck into the film to be treated, the tube is held by the supporting unit in a state being stuck in the film to be treated. Alternatively, a stage on which the film to be treated is placed may be moved so that the film to be treated is in contact with the tube.

FIGS. 40A to 40D illustrate an example in which the tube 503 is supported by supporting films 520a and 520b. FIGS. 40A to 40D correspond to FIGS. 1A to 1C except that the supporting films 520a and 520b are formed. In FIGS. 40A to 40D, the tube 503 that is arranged to be in contact with the insulating layer 502 is supported by the supporting films 520a and 520b. After the supporting films are formed, the tube may be stuck and fixed. Alternatively, after the tube is arranged in the opening formation region, the supporting films may be formed to support the periphery of the tube.

Figure 40A:
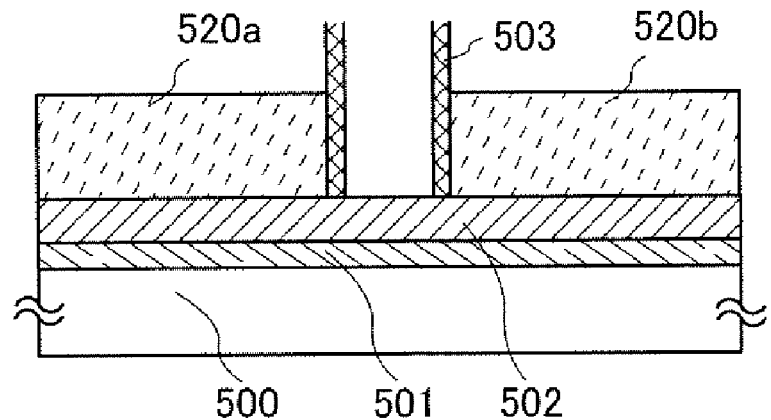
FIGS. 40A to 40D are explanatory schematic views of the present invention.
Figure 40B:
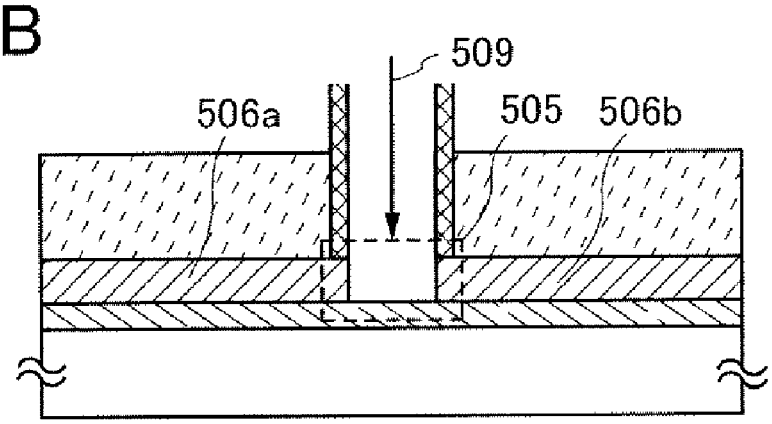
Figure 40C:
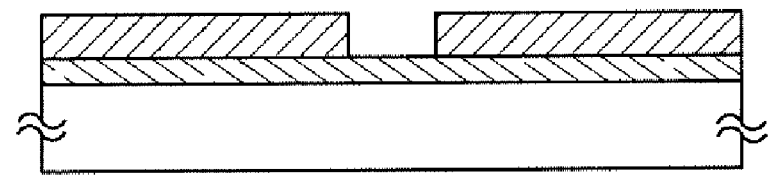
Figure 40D:
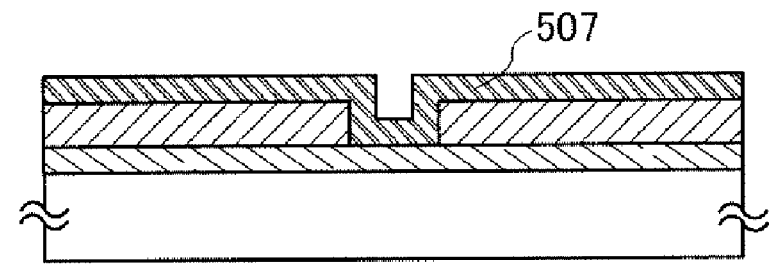

An etching gas 509 is discharged to form an opening 505 in the insulating layer 502 (FIG. 40B), and then, the supporting films 520a and 520b are removed (FIG. 40C). A conductive film 507 is formed over insulating layers 506a and 506b and an exposed part of the conductive layer 501, so that the conductive layer 501 and the conductive film 507 are electrically connected to each other in the opening 505 (FIG. 40D).

The etching gas 509 is jetted (discharged) to the insulating layer 502 through the tube 503 in a state where the tube 503 is selectively provided. By the jetted (discharged) etching gas 509, the insulating layer 502 is selectively removed, so that the opening 505 is formed in the insulating layer 502 (FIG. 1B).

The tube 503 is removed, and the insulating layers 506a and 506b provided with the opening 505 can be formed. The conductive film 507 is formed in the opening 505 where the conductive layer 501 is exposed, so that the conductive layer 501 and the conductive film 507 can be electrically connected to each other (FIG. 1C).

Since the shape of the opening reflects the shape of the tube, the shape of the tube may be selected so that a desired shape of the opening can be obtained. The tube may have a columnar shape (prism, cylinder, or triangular prism) or a needle shape. The depth of the opening can be determined by force at a time when the tube is provided and intensity of the conductive layer over which the tube is placed. In addition, the depth in a thickness direction can also be determined by setting etching conditions such as etching time.

When a top face shape of the tube is appropriately made to have a spot shape, a circular shape, an elliptic shape, a rectangular shape, or a linear shape (strictly, a long and narrow rectangular shape), a top face shape of the obtained opening in the insulating layer also reflects the above shapes of the tube and its discharging outlet.

Figure 41A:
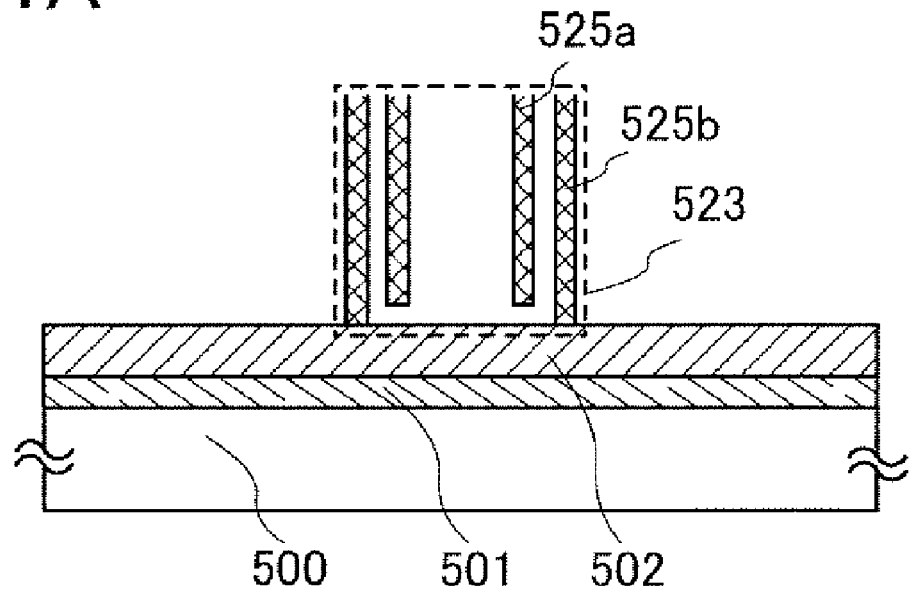
FIGS. 41A to 41C are explanatory schematic views of the present invention.
Figure 41B:
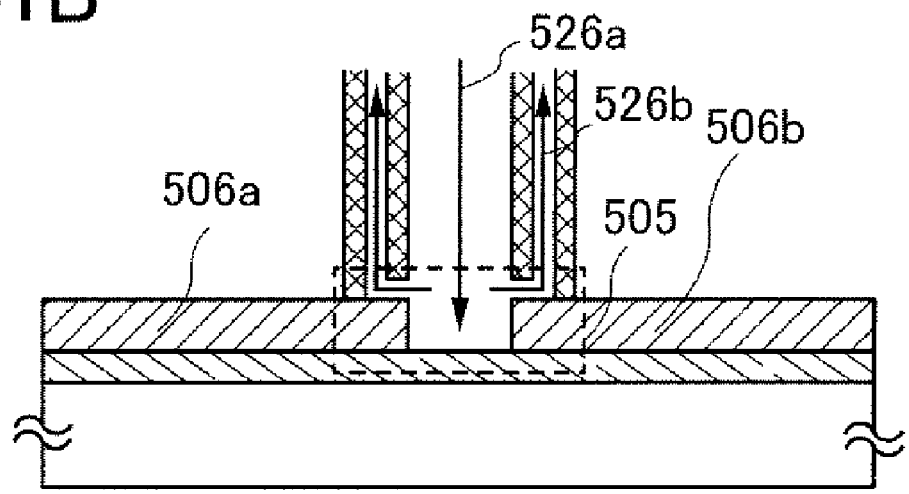
Figure 41C:
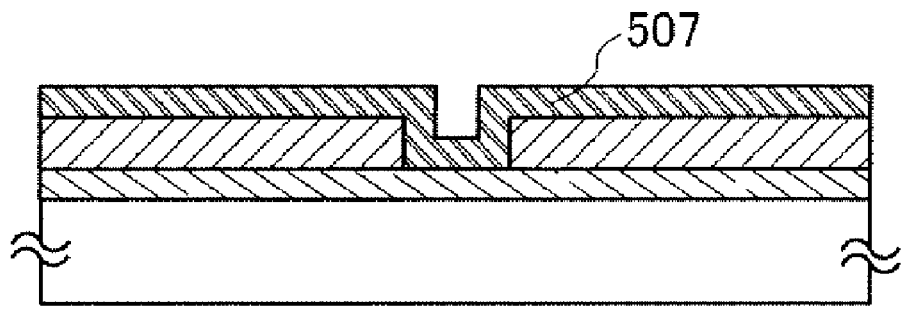

Alternatively, the tube may have a multilayer structure. FIGS. 41A to 41C show an example of the tube having a two-layer structure. In the present invention, a substance can be not only discharged but also sucked through the tube. FIGS. 41A to 41C correspond to FIGS. 1A to 1C except for a tube 523.

The tube 523 shown in FIG. 41A includes a tube 525a inside and a tube 525b outside. The tube 525a is slightly shorter than the tube 525b and arranged so as to be apart from the insulating layer 502. As shown in FIG. 41B, an etching gas 526a is discharged through the tube 525a that is placed inside of the tube 523, and the insulating layer 502 is selectively removed. At the same time, the etching gas and an etched insulating material 526b of the insulating layer 502 are sucked in a direction of an arrow through the space between the tube 525b outside and the tube 525a inside so as to be removed from the opening. In this manner, a material may be supplied and disposed of (removed) at the same time by sectioning the inside of the tube. A residue due to etching is immediately removed from the opening, so that etching efficiency (etching time and etching rate) of the insulating layer can be improved. The conductive film 507 is formed over the insulating layers 506a and 506b and the exposed part of the conductive layer 501, so that the conductive layer 501 and the conductive film 507 are electrically connected to each other in the opening 505 (FIG. 41C).

Figure 2A:
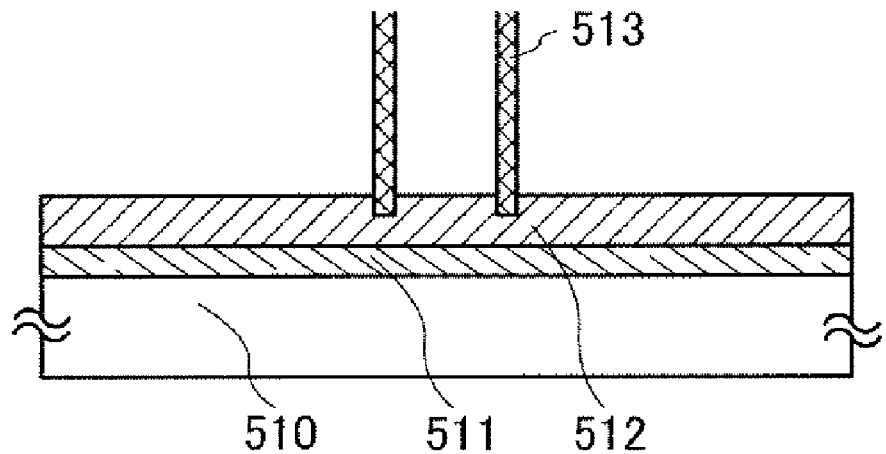
FIGS. 2A to 2C are explanatory schematic views of the present invention.
Figure 2B:
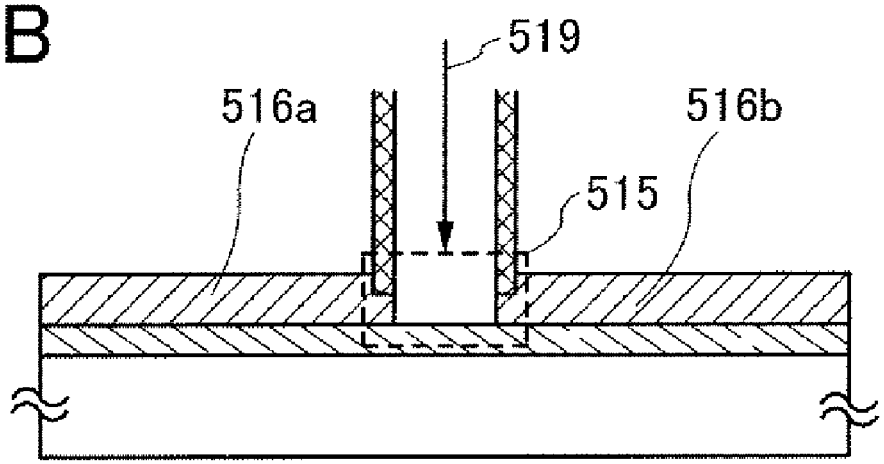

When the tube is arranged in the opening formation region of the insulating layer, the end of the tube may be stuck into the insulating layer and partially embedded in the insulating layer as shown in FIGS. 2A and 2B. A conductive layer 511 is formed over a substrate 510 having an insulating surface, and an insulating layer 512 is formed over the conductive layer 511. A tube 513 is provided in an opening formation region of the insulating layer 512 so that the end of the tube 513 is partially embedded in the insulating layer 512 (FIG. 2A). In FIGS. 2A and 2B, a unit which supports the tube 513 is not illustrated, and the tube 513 may be held by being in contact with the insulating layer 512. For example, the tube may be held on a film to be treated as follows: the tube may be provided on a substrate and the substrate may be used as a supporting unit (supporting substrate), or a supporting film may be formed over the film to be treated as a supporting unit and the tube may be stuck into the supporting film. In addition, since the tube 513 is partially embedded in the insulating layer 512, also the insulating layer 512 functions as a supporting unit.

An etching gas 519 is jetted (discharged) to the insulating layer 512 through the tube 513 in a state where the tube 513 is selectively provided. By the jetted (discharged) etching gas 519, the insulating layer 512 is selectively removed, so that an opening 515 is formed in the insulating layer 512 (FIG. 2B).

Figure 2C:
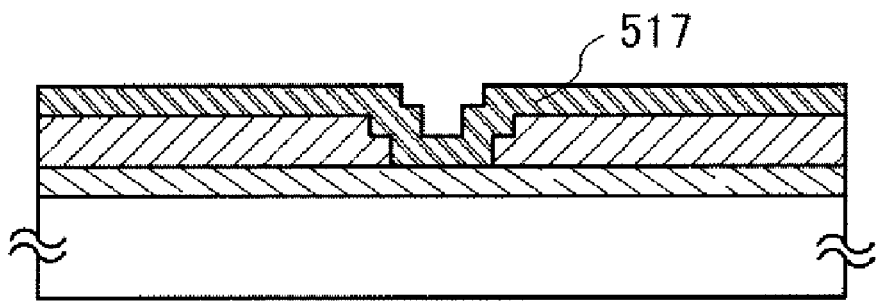

The tube 513 is removed, and insulating layers 516a and 516b provided with the opening 515 can be formed. The shape of the opening 515 reflects the shape of the tube and has a shape having a step at the side surface. A conductive film 517 is formed in the opening 515 where the conductive layer 511 is exposed, so that the conductive layer 511 and the conductive film 517 can be electrically connected to each other (FIG. 2C).

Figure 3A:
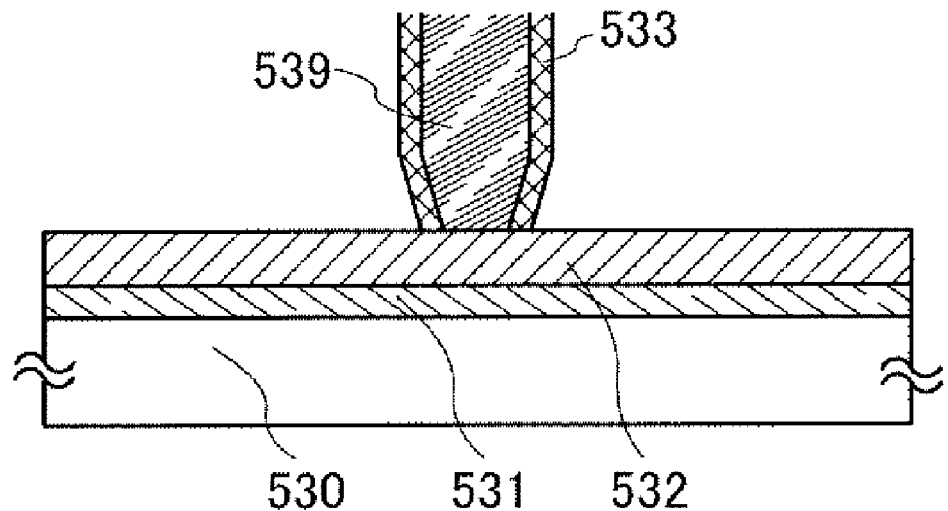
FIGS. 3A to 3C are explanatory schematic views of the present invention.
Figure 3B:
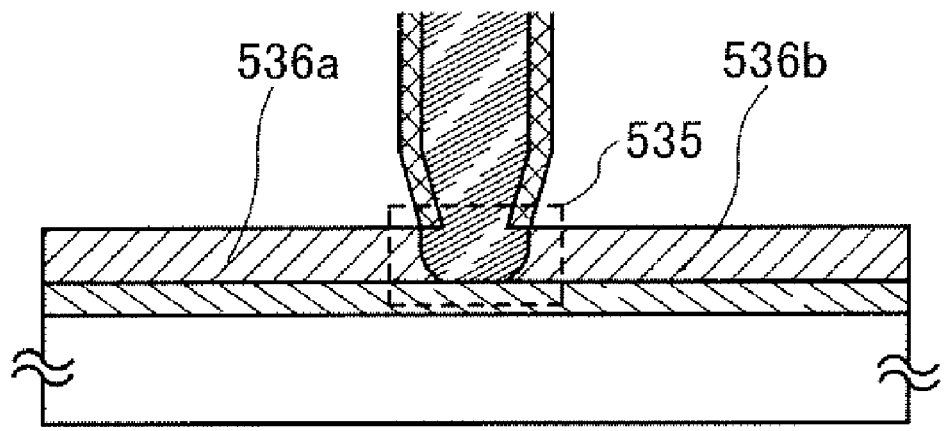
Figure 3C:
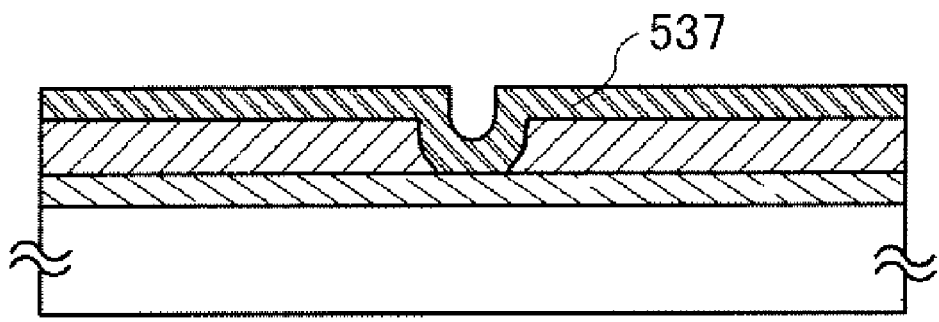

In order to remove the insulating layer selectively, an etching substance discharged from the tube may be an etching gas or an etchant. Anisotropic etching or isotropic etching can be performed by appropriately setting an etching gas, an etchant, and etching conditions. FIGS. 3A to 3C show an example in which isotropic etching is performed by using an etchant.

A tube illustrated in FIGS. 3A to 3C is an example of a tube having a conical shape with a narrow end and is suitable for being filled with a liquid material such as an etchant. A conductive layer 531 is formed over a substrate 530 having an insulating surface, and an insulating layer 532 is formed over the conductive layer 531. A tube 533 is arranged to be in contact with the insulating layer 532 in an opening formation region (FIG. 3A). The inside of the tube 533 is filled with an etchant 539.

The etchant 539 is discharged to the insulating layer 532 through the tube 533 in a state where the tube 533 is selectively provided. By the discharged etchant 539, the insulating layer 532 is selectively removed, so that an opening 535 is formed in the insulating layer 532 (FIG. 3B).

The tube 533 is removed, and insulating layers 536a and 536b provided with the opening 535 can be formed. Since the opening 535 is formed by isotropic etching using the etchant 539, the opening is formed in a region that is wider than a discharging outlet of the tube 533 as shown in FIG. 3B. A conductive film 537 is formed in the opening 535 where the conductive layer 531 is exposed, so that the conductive layer 531 and the conductive film 537 can be electrically connected to each other (FIG. 3C).

The insulating layer is dissolved by the etchant. In addition, the insulating layer may be removed by sucking a mixed solution of the etchant and a material forming the insulating layer through the tube. Through the tube of the present invention that is a narrow pipe having a hollow structure and an opened end, the substance can be not only discharged but also sucked.

In the present invention, when the film to be treated is processed by a liquid material such as an etchant using the tube, liquid-repellent treatment against the liquid material (such as an etchant) may be performed to the film to be treated. The liquid-repellent treatment can be performed by forming a film including a liquid-repellent substance over the film to be treated. The liquid material (such as an etchant) is repelled at the surface of the film to be treated. Therefore, the liquid material (such as an etchant) does not flow out easily from a portion between the film to be treated and the tube. Accordingly, even when the tube is not arranged to be in close contact by the uneven surface and the like of the film to be treated, a defect that an etchant and the like flow (is discharged) outside the tube to process a region other than the treated region of the film to be treated can be prevented. The opening can be formed in the film to be treated into a desired shape with high controllability.

For the liquid-repellent substance, a substance containing a fluorocarbon group (fluorocarbon chain) or a substance containing a silane coupling agent can be used. A monomolecular film can be formed by using the silane coupling agent, and decomposition and modification can be performed efficiently; therefore, wettability can be changed in a short time. In addition, not only a silane coupling agent containing a fluorocarbon group (fluorocarbon chain) but also the silane coupling agent containing an alkyl group can be used since the silane coupling containing an alkyl group has low wettability by being arranged over a substrate. The silane coupling agent has a different effect of reducing the wettability depending on whether a contained functional group is a fluorocarbon group or an alkyl group; therefore, a material of the silane coupling agent is appropriately selected so that necessary wettability can be obtained.

For the liquid-repellent substance, a substance containing a fluorocarbon group (fluorocarbon chain) or a substance containing a silane coupling agent can be used. The silane coupling agent is denoted by the chemical formula: $R_n$—Si—$X_{(4-n)}$(n=1, 2, 3). In this chemical formula, R represents a substance containing a relatively inactive group such as an alkyl group. X represents a hydrolytic group such as halogen, a methoxy group, an ethoxy group, or an acetoxy group, which is bondable by condensation with a hydroxyl group or adsorbed water on a substrate surface.

For the liquid-repellent substance, alkoxysilane containing an alkyl group for R of the silane coupling agent can be used. For example, as an organic silane, octadecyltrimethoxysilane or the like can be used. As alkoxysilane, alkoxysilane having 2 to 30 carbon atoms is preferably used. Typically, decyltrimethoxysilane, ethyltriethoxysilane, propyltriethoxysilane, octyltriethoxysilane, decyltriethoxysilane, dodecyltriethoxysilane, octadecyltriethoxysilane (ODS), eicosyltriethoxysilane, and triacontyltriethoxysilane can be used. In particular, a silane compound having a long chain alkyl group is preferably used because it can reduce wettability. Further, decyltrichlorosilane, tetradecyltrichlorosilane, octadecyltrichlorosilane, eicosyltrichlorosilane, docosyltrichlorosilane, and the like can be also used.

As another example of the silane coupling agent which can be used to reduce the wettability, a fluorine-based silane coupling agent containing a fluoroalkyl group for R (such as fluoroalkylsilane (FAS)) can be used. R in the FAS has a structure represented by $(CF_3)(CF_2)_x(CH_2)_y$ (x is an integer in the range of 0 to 10, inclusive, and y is an integer in the range of 0 to 4, inclusive). When a plurality of Rs or Xs are bonded with Si, the Rs or Xs may be the same or different from one another. Typically, the following can be used as the FAS: fluoroalkylsilane (hereinafter, also referred to as FAS) such as heptadecafluorotetrahydrodecyltriethoxysilane, heptadecafluorotetrahydrodecyltrichlorosilane, tridecafluorotetrahydrooctyltrichlorosilane, trifluoropropyltrimethoxysilane, or tridecafluorooctyltrimethoxysilane. Further, a coupling agent in which a hydrolytic group of tridecafluorooctyltrichlorosilane or the like is halogen can also be used. Of course, the present invention is not limited to the above compounds.

Further, as the liquid-repellent substance, a titanate coupling agent or an aluminate coupling agent may be used. For example, isopropyltriisooctanoyl titanate, isopropyl(dioctylpyrophosphate) titanate, isopropyltristearoyl titanate, isopropyl tris(dioctylphosphate) titanate, isopropyldimethacrylisostearoyl titanate, acetoalkoxy aluminumdiisopropylate, or the like can be used.

In the case of forming the above liquid-repellent substance as a film in the formation region, a vapor-phase deposition method or the like can be used, by which the film is formed in the formation region by evaporating a liquid substance. Further, the liquid-repellent substance may be deposited by a spin coating method, a dipping method, a droplet discharging method, and a printing method (a screen printing method, an offset printing method, or the like) or may be formed such that the liquid-repellent substance is dissolved in a solvent to be a solution.

For a solvent of a solution containing the liquid-repellent substance, water, alcohol, ketone, a hydrocarbon-based solvent (such as aliphatic hydrocarbon, aromatic hydrocarbon, halogenated hydrocarbon), and ether-based compound; and a mixture thereof can be used. For example, methanol, ethanol, propanol, acetone, butanone, n-pentane, n-hexane, n-heptane, n-octane, n-decane, dicyclopentane, benzene, toluene, xylene, durene, indene, tetrahydronaphthalene, decahydronaphthalene, squalane, carbon tetrachloride, chloroform, methylene chloride, trichloroethane, diethyl ether, dioxane, dimethoxyethane, tetrahydrofran, or the like is used. The concentration of the above solution is not particularly limited; and the concentration may be in a range of 0.001 wt % to 20 wt %.

Further, amine such as pyridine, triethylamine, or dimethylaniline may be mixed in the above liquid-repellent substance. Furthermore, carboxylic acid such as formic acid or acetic acid may be added as a catalyst agent.

As described above, the monomolecular film is formed with the use of a spin coating method in which the liquid-repellent substance in the liquid state is applied to the formation region. At this time, treatment temperature may be set to be room temperature (approximately, 25° C.) to 150° C., and treatment time may be set to be several minutes to 12 hours. A treatment condition can be appropriately set depending on a property of the liquid-repellent substance, a concentration of the solution, a treatment temperature, and treatment time. When a thin film to be formed is washed with a solvent that can be used in the case of making a solution containing the above liquid-repellent substance, an unreacted liquid-repellent substance can be removed. In this case, an ultrasonic washing machine or the like may also be used.

The film containing the liquid-repellent substance that can be used in the present invention may be a thin film having a thickness in the range from 0.3 nm to 10 nm, inclusive. It is to be noted that the thin film of the liquid-repellent substance formed by a spin coating method or the like in which the liquid-repellent substance in the liquid state is applied to the formation region is very thin and can be a monomolecular film with a thickness in the range from 0.3 nm to 10 nm, inclusive.

Further, as an example of a composition that controls to reduce the wettability to form a low-wettability region, a material having a fluorocarbon group (fluorocarbon chain) can be used (a fluorine-based resin). As the fluorine-based resin, polytetrafluoroethylene (PTFE; a polytetrafluoroethylene resin), perfluoroalkoxyalkane (PFA; a tetrafluoroethylene perfluoroalkylvinylether copolymer resin), perfluoroethylene propene copolymer (PFEP; a tetrafluoroethylene-hexafluoropropylene copolymer resin), ethylene-tetrafluoroethylene copolymer (ETFE; a tetrafluoroethylene-ethylene copolymer resin), polyvinylidene fluoride (PVDF; a polyvinylidene fluoride resin), polychlorotrifluoroethylene (PCTFE; a polytrifluorochloroethylene resin), ethylene-chlorotrifluoroethylene copolymer (ECTFE; a polytrifluorochloroethylene-ethylene copolymer resin), polytetrafluoroethylene-perfluorodioxol copolymer (TFE/PDD), polyvinylfluoride (PVF; a vinyl fluoride resin), or the like can be used.

Further, when treatment with $CF_4$ plasma or the like is performed to an inorganic or organic material, wettability can be reduced. As the organic material, for example, a material of a solvent such as $H_2O$ mixed with a water-soluble resin such as polyvinyl alcohol (PVA) can be used. In addition, a combination of PVA and another water-soluble resin can be used.

As an etching gas, a chlorine-based gas typified by $Cl_2$, $BCl_3$, $SiCl_4$, and $CCl_4$, a fluorine-based gas typified by $CF_4$, $SF_6$, and $NF_3$, or $O_2$ can be appropriately used. As an etchant, hydrofluoric acid, tetramethyl ammonium hydroxide aqueous solution (TMAH), or the like may be appropriately used.

The tube of the present invention has a space inside, and a material can be discharged and sucked through the tube. A material can be discharged by an element such as a piezoelectric element and sucked by a pump or the like. Therefore, a supplying unit which supplies materials, a material storing chamber, and a storing chamber which stores a sucked material until the disposal, which are connected to the tube, may also be provided.

Further, after the opening is formed in the insulating layer using the tube of the present invention, a material for forming a film (such as a conductive composition) in a liquid state may be discharged to the opening through the tube to form a conductive layer.

With a minute opening, it may be difficult to fill the opening assuredly with a liquid material for forming a film by the surface tension; however, in the present invention, the opening is assuredly filled with a material for forming a film by the tube stuck into the opening, and thus, a film can be formed without a defective shape.

An etching gas discharged from the tube can be appropriately selected depending on a thin film that is etched as long as the tube can resist the etching gas. For example, when a multilayer wiring including stacked layers is formed, the present invention can be used in forming a continuous opening in multiple different thin films that are stacked.

The depth of the opening can be determined by force at a time when the tube is provided and intensity of the film on which the tube is placed. With the use of a tube whose end has a sharp point like a needle, resistance at a time when the tube is stuck into the film can be reduced.

The conductive layers 501, 511, and 531, and the conductive films 507, 517, and 537 can be formed by an evaporation method, a sputtering method, a PVD (Physical Vapor Deposition) method, a CVD (Chemical Vapor Deposition) method such as a low-pressure CVD (LPCVD) method or a plasma CVD method, or the like. Alternatively, a method by which a component can be formed into a desired pattern by transferring or drawing, for example, various printing methods (a method for forming a component into a desired pattern, such as screen (mimeograph) printing, offset (planograph) printing, relief printing, or gravure (intaglio) printing), a dispenser method, a selective-coating method, or the like can also be used.

The conductive layers 501, 511, and 531, and the conductive films 507, 517, and 537 may be formed of at least one of elements of Ag, Au, Ni, Pt, Pd, Ir, Rh, Ta, W, Ti, Mo, Al, Cu, Cr, and Co; or an alloy material or a compound material containing the element as its main component. Moreover, a semiconductor film typified by a polycrystalline silicon film doped with an impurity element such as phosphorus, or an AgPdCu alloy may be used as well. Further, either a single-layer structure or a multi-layer structure may be employed; for example, a two-layer structure of a tungsten nitride film and a molybdenum (Mo) film may be employed or a three-layer structure in which a tungsten film with a thickness of 50 nm, a film of an aluminum-silicon (Al—Si) alloy with a thickness of 500 nm, or a titanium nitride film with a thickness of 30 nm are sequentially stacked may be employed. In the case of employing a three-layer structure, tungsten nitride may be used instead of the tungsten for the first conductive film, a film of an aluminum-titanium (Al—Ti) alloy may be used instead of the film of an aluminum-silicon (Al—Si) alloy for the second conductive film, and a titanium film may be used instead of the titanium nitride film for the third conductive film.

The conductive layers 501, 511, and 531, and the conductive films 507, 517, and 537 can also be formed using indium tin oxide (ITO), indium tin oxide containing silicon oxide (ITSO), zinc oxide (ZnO), a conductive material obtained by adding gallium (Ga) to zinc oxide, or indium zinc oxide (IZO). Alternatively, when a semiconductor layer is formed instead of the conductive layer, a semiconductor material may be used, and for example, an inorganic semiconductor material such as silicon, germanium, silicon germanium, gallium arsenide, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate can be used.

The insulating layers 502, 512, and 532 can be formed by a sputtering method, a PVD (Physical Vapor Deposition) method, a CVD (Chemical Vapor Deposition) method such as a low-pressure CVD (LPCVD) method or a plasma CVD method, or the like. Alternatively, a droplet discharging method, a printing method (a method for forming a pattern, such as screen printing or offset printing), a coating method such as a spin coating method, a dipping method, a dispenser method, or the like may be used.

The insulating layers 502, 512, and 532 can be formed of a material such as silicon oxide, silicon nitride, silicon oxynitride, aluminum oxide, aluminum nitride, aluminum oxynitride, diamond-like carbon (DLC), nitrogen-containing carbon (CN), polysilazane, or other substances containing an inorganic insulating material. Alternatively, a material containing siloxane may be used. Further alternatively, an organic insulating material may be used. As the organic material, polyimide, acrylic, polyamide, polyimide amide, resist, or benzocyclobutene can be used. Moreover, an oxazole resin can also be used.

Figure 42:
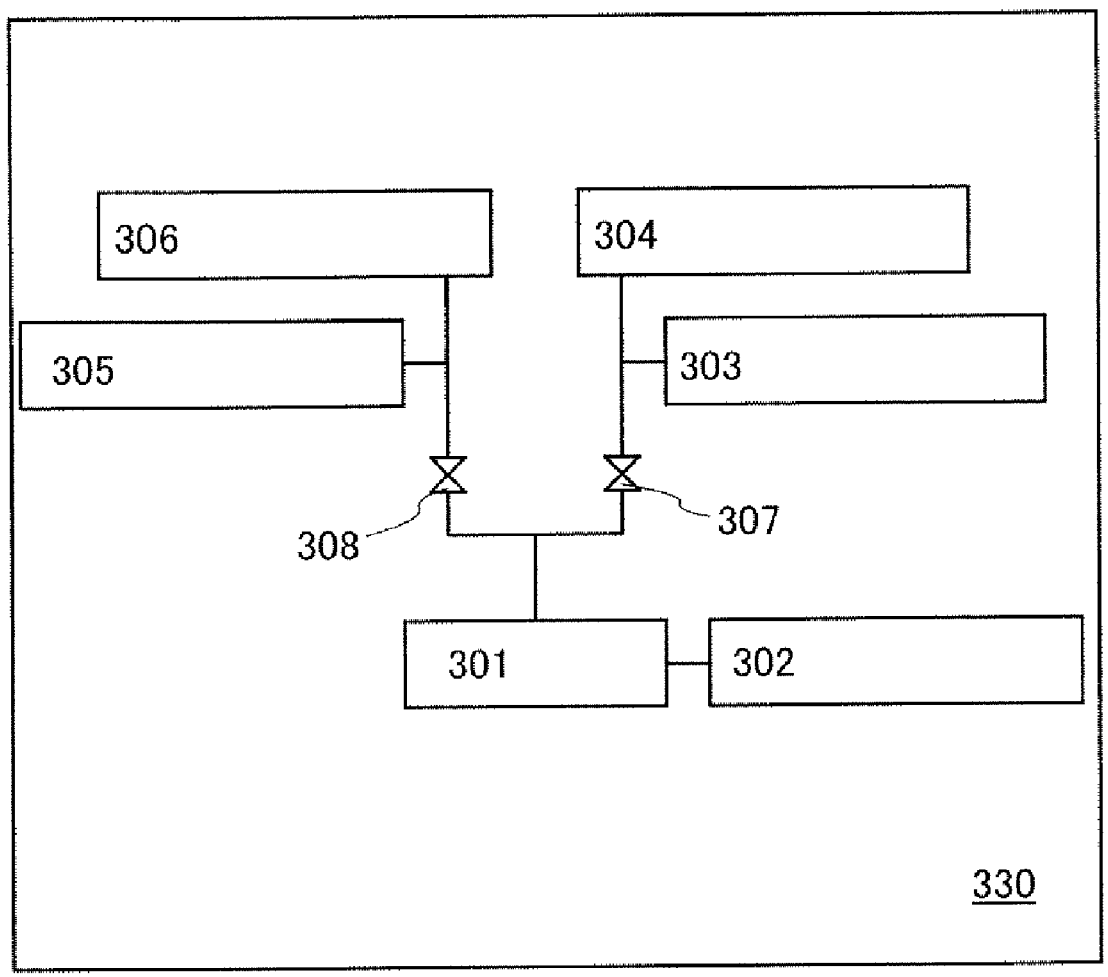
FIG. 42 is an explanatory block diagram of an etching apparatus of the present invention.

A semiconductor device or a display device can be manufactured by using the present invention. FIG. 42 shows an example of an etching apparatus of the present invention.

As shown in FIG. 42, an etching apparatus 330 includes a tube 301, a position control unit 302, a discharge control unit 303, a discharged material storing chamber 304, a suction control unit 305, a sucked material storing chamber 306, a cock 307, and a cock 308. The etching apparatus 330 can function as a deposition apparatus. The tube 301 can be moved by the position control unit 302 and arranged to be in contact with the film to be treated. The discharged material storing chamber 304 and the tube 301 are connected through the cock 307. The cock 307 is turned on when a material is discharged, and the material is discharged from the tube 301 by the discharge control unit 303. Meanwhile, the sucked material storing chamber 306 and the tube 301 are connected through the cock 308. The cock 308 is turned on when the material is sucked, and a material and the like discharged from the tube 301 are sucked by the suction control unit 305 and sent to the sucked material storing chamber 306. The material stored in the sucked material storing chamber 306 may be disposed of, or may be reused by being sent to the discharged material storing chamber. A piezoelectric element or the like can be used as the discharge control unit 303, and a pump or the like can be used as the suction control unit 305. A vacuum gauge or the like is preferably provided in order to control discharge and suction appropriately.

Although FIG. 42 shows an example in which the apparatus is provided with the suction unit and the discharge unit using the tube, the present invention is not limited thereto. Only a discharge unit using a tube may be provided, or a pressure-reduction unit may be provided so that the material can be discharged and sucked from/to the tube under a reduced pressure.

Figure 34A:
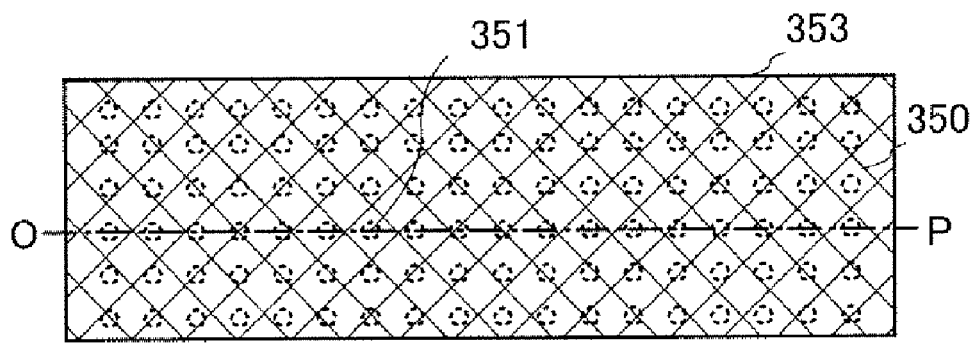
FIGS. 34A to 34C are explanatory diagrams of a tube which can be applied to the present invention.
Figure 34B:
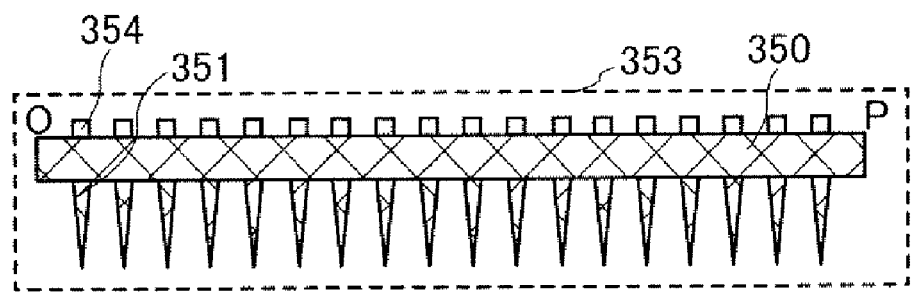
Figure 34C:
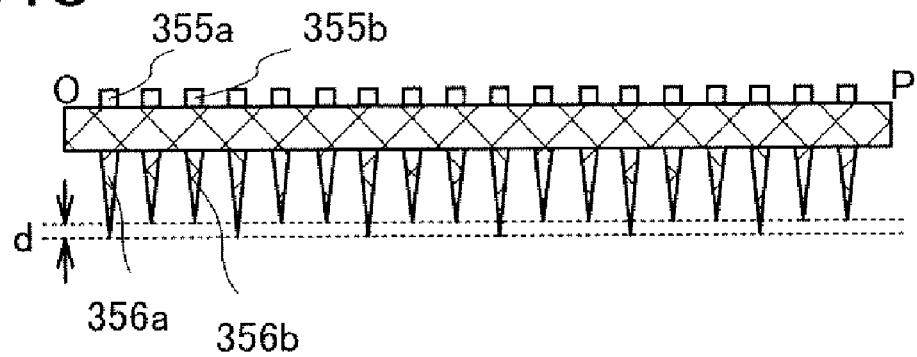

When a plurality of openings are formed in the insulating layer, a supporting substrate provided with a plurality of tubes can be used. FIGS. 34A to 34C illustrate an example of a tube portion that can form a plurality of openings.

FIG. 34A is a top view of the tube portion from the supporting substrate side, and FIGS. 34B and 34C are cross-sectional views along a line O-P of FIG. 34A.

In FIG. 34A, a tube portion 353 includes a supporting substrate 350 and a tube 351. A plurality of tubes 351 are each provided on the supporting substrate 350 that is a supporting unit in a position corresponding to an opening formation region. Since the supporting unit can be moved by a movement control unit, the supporting substrate is moved so that the tube 351 is in contact with a film to be treated, and the tube portion 353 is provided to face the film to be treated. The supporting unit and the tube can be moved by the movement control unit, and the tube is moved up and down in a thickness direction, and side to side and up and down in a substrate direction with respect to the film to be treated, so that the position of the tube with respect to the film to be treated is controlled.

The tube is set according to circuit design drawing data so that an opening can be formed in a desired position in the insulating layer. The position of a unit which forms an opening and the position of a substrate provided with a film to be treated may be set by forming a marker in advance on the supporting substrate which supports the tube portion and the substrate provided with a film to be treated.

In FIG. 34B, the tube 351 is provided with a control unit 354 which can control the movement of the position of the tube 351 in a vertical direction. A piezoelectric element or the like can be used for the control unit 354. FIG. 34C is an example in which the position of the tube is selectively controlled by the control unit. In FIG. 34C, a tube 356a is moved by a control unit 355a, and the end of the tube 356a is placed below an end of a tube 356b of a control unit 355b that is not selected by a distance d. In such a manner, the tube is selectively arranged only in an opening formation region of the film to be treated over the substrate, whereby the opening can be formed in a desired position.

After the opening is formed in the insulating layer, the tube may be removed physically by being pulled out or chemically by etching the tube (by dry etching or wet etching) under a condition where a selection ratio of the etching rate of the tube to that of the insulating layer provided with the opening is high. When adhesion between the insulating layer and the conductive layer is low, it is preferable to remove the tube by etching. In addition, when the tube is removed from the insulating layer by a physical means without changing its shape, the removal is easy and the tube can be repeatedly used, whereby there is an advantage that the cost can be reduced.

The tube can be formed by the steps of forming a thin film by a sputtering method, a vacuum evaporation method, a PVD (Physical Vapor Deposition) method, or a CVD (Chemical Vapor Deposition) method such as a low-pressure CVD (LPCVD) method or a plasma CVD method and etching the thin film into a desired shape. Alternatively, a droplet discharging method by which a pattern can be selectively formed, a printing method by which a pattern can be transferred or drawn (such as a method for forming a pattern, e.g. screen printing or offset printing), a coating method such as a spin coating method, a dipping method, a dispenser method, or the like can be used. Further alternatively, an imprinting technique or a nanoimprinting technique by which a three-dimensional structure of nanometer size can be formed by a transfer technique can also be used. Imprinting and nanoimprinting are techniques by which a minute three-dimensional structure can be formed without using a photolithography step.

The tube may be formed using an inorganic material, an organic material, or a material having a skeletal structure with the bond of silicon and oxygen. Since the tube has a function of blocking the deposition of an insulating film, it may also be formed using a conductive material such as metal or an insulating material such as a resin. Further, fiber and the like can also be used. Considering that the tube is placed in an apparatus, the tube is preferably formed from a material which is relatively lightweigt and is easy to be processed. In the case of forming a minute opening, nanotube materials such as a carbon nanotube can also be used. Superfine carbon fibers like a carbon nanotube include graphite nanofibers, carbon nanofibers, tubular graphite, carbon nanocones, conical graphite, and the like.

The tube can be formed using a material such as silicon oxide, silicon nitride, silicon oxynitride, aluminum oxide, aluminum nitride, aluminum oxynitride, diamond-like carbon (DLC), nitrogen-containing carbon (CN), polysilazane, or other substances containing an inorganic insulating material. Alternatively, a material containing siloxane can also be used. As a further alternative, the following materials can also be used: organic materials such as an epoxy resin, a phenol resin, a novolac resin, an acrylic resin, a melamine resin, a urethane resin, benzocyclobutene, parylene, fluorinated arylene ether, and polyimide, or a resin having a siloxane bond.

After the opening is formed, a conductive material or an insulating material which remains around the opening (a residue of a portion where the conductive layer or the insulating layer is removed) may be washed away with a liquid so that the residue can be removed. In that case, either a nonreactive substance such as water or a chemical solution that reacts with (dissolves) the insulating layer such as an etchant can be used for washing. When an etchant is used, the opening is over-etched, whereby a dust and the like are removed and the surface can be planarized. Further, the size of the opening can be increased.

In this manner, an opening (contact hole) for enabling electrical connection between the conductive layer and the conductive film can be formed in the insulating layer without forming a resist mask layer by a complicated photolithography step.

Thus, in accordance with this embodiment mode, a contact hole can be formed in the insulating layer without forming a mask, so that the process can be simplified. Further, it is not necessary to perform light-exposure and development after application of a photoresist or the like, so that the cost of materials required for processing can be reduced. Furthermore, the contact hole can be assuredly formed, whereby the manufacturing yield can be improved.

Embodiment Mode 2

This embodiment mode will describe a method for forming a contact hole having a stacked-layer structure assuredly through a more simplified process at low cost. Specifically, an example will be described, in which the contact hole in Embodiment Mode 1 is formed in a plurality of stacked films. Accordingly, similar materials and methods to those of Embodiment Mode 1 may be used for the same portions or portions having similar functions, and a repeated description will be omitted.

A tube is stuck into an insulating layer and arranged to be partially embedded therein, and a first opening is formed in the insulating layer by physical force. Then, an etching gas is jetted from a discharging outlet to remove the insulating layer selectively, so that a second opening can be formed. That is, the first opening may be formed by physical force using the tube, and the second opening may be formed by chemical force using a treatment agent (etching gas or etchant) discharged from the tube. The first opening may be formed by discharging a treatment agent (etching gas or etchant) from the tube in advance, and the tube may be stuck into the insulating layer to form the second opening. Alternatively, an etching gas may be discharged and the tube may be stuck into the insulating layer to form the opening at the same time.

When a multilayer wiring including stacked layers is formed, the present invention can be used in forming a continuous opening in multiple different thin films that are stacked.

Furthermore, after the opening is formed in the insulating layer by the tube of the present invention, a conductive layer may be formed by discharging a material for forming a film (such as a conductive composition) in a liquid state to the opening through the tube. With a minute opening, it may be difficult to fill the opening assuredly with a liquid material for forming a film by the surface tension; however, in the present invention, the opening can be assuredly filled with a material for forming a film by the tube stuck into the opening, and thus, a film can be formed without a defective shape.

Since a shape of the opening reflects a shape of the tube, the tube may be selected so that a desired shape of the opening can be obtained. The tube may have a columnar shape (prism, cylinder, or triangular prism) or a needle shape. The depth of the opening can be determined by force at a time when the tube is provided and intensity of the film to be treated on which the tube is placed. In addition, the depth in a thickness direction can also be determined by setting etching conditions such as etching time. When a needle-shaped tube whose end has a sharp point is provided so as to be partially embedded in the conductive layer, an opening with a recessed portion in the conductive layer can be formed. After formation of the opening, an exposed part of the conductive layer at the bottom of the opening may be removed by etching using the insulating layer provided with the opening as a mask.

In accordance with the present invention, the insulating layer selectively provided with the opening can be formed without using a photolithography step; therefore, the number of steps and materials can be reduced.

Figure 4A:
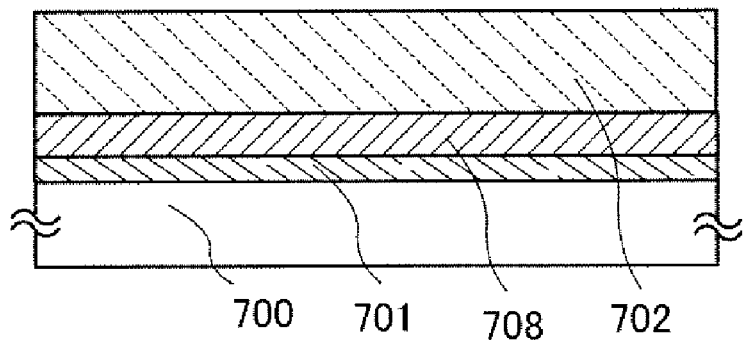
FIGS. 4A to 4D are explanatory schematic views of the present invention.

An example in which a continuous opening is formed in a stacked body is shown in FIGS. 4A to 4D. In FIG. 4A, a conductive layer 701, a first insulating layer 708, and a second insulating layer 702 are sequentially formed over a substrate 700. Then, a tube 703 is stuck into the second insulating layer 702, so that a first opening 704 is physically formed in the second insulating layer 702. In a cross-sectional view of FIG. 4B, the second insulating layer is divided into a second insulating layer 706a and a second insulating layer 706b. In a case where the second insulating layer 702 is partially inside the tube 703 depending on a size of a discharging outlet of the tube 703, a treatment agent (etching gas or etchant) may be discharged through the tube to remove the second insulating layer 702 inside of the tube.

An etching gas 709 is discharged from the tube 703 to remove the first insulating layer selectively, so that a continuous second opening 705 can be formed in the first insulating layer and the second insulating layer. In a cross-sectional view of FIG. 4C, the first insulating layer is divided into a first insulating layer 790a and a first insulating layer 790b.

Since the shape of the opening 705 reflects a shape of the tube, the opening has a shape having a step at the side surface.

Figure 4B:
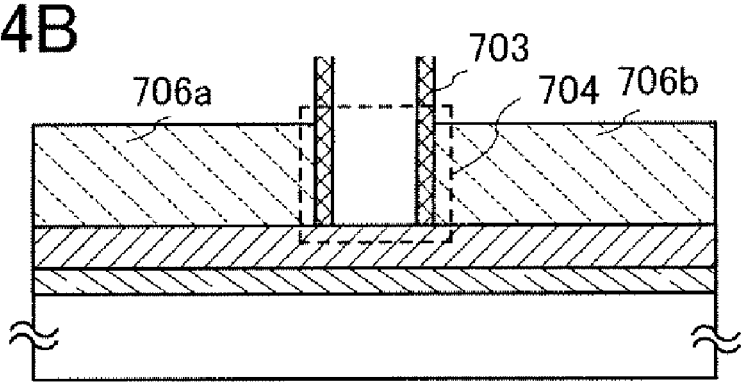
Figure 4C:
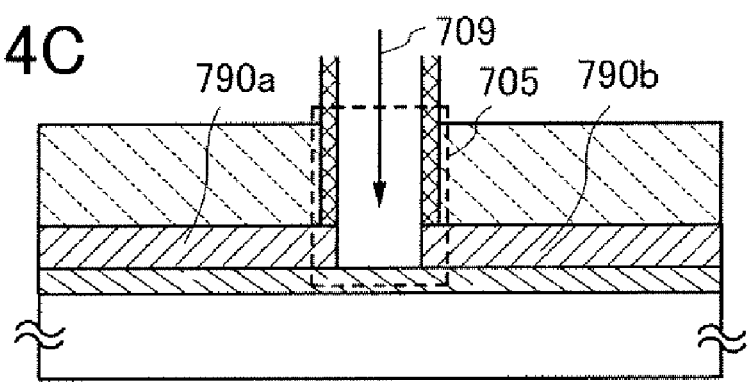
Figure 4D:
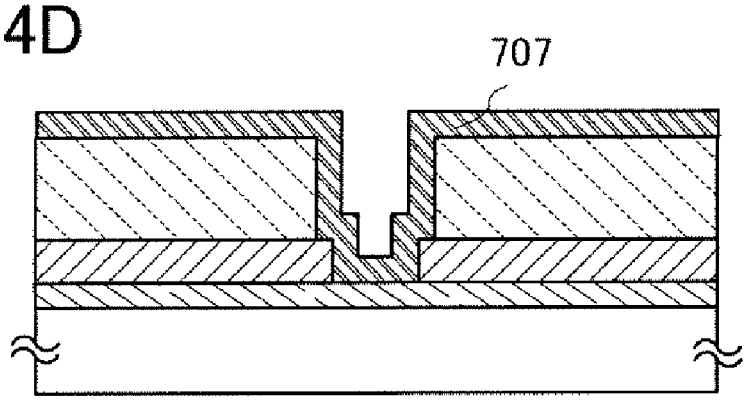

A conductive film 707 is formed in the second opening 705 where the conductive layer 701 is exposed, whereby the conductive layer 701 and the conductive film 707 can be electrically connected to each other (FIG. 4D).

In other words, the first opening may be formed by physical force using the tube, and the second opening may be formed by chemical force using an etching gas that is discharged (jetted) from the tube. The first opening may be formed by discharging an etching gas from the tube in advance, and the tube may be stuck into the insulating layer to form the second opening. Alternatively, an etching gas may be discharged and the tube may be stuck into the insulating layer to form the opening at the same time.

When physical intensity of the second insulating layer is weaker than that of the tube, an opening can be formed as shown in FIGS. 4A to 4D. When the second insulating layer is formed using a wet process such as spin coat, an opening may be formed before the second insulating layer is hardened. Of course, the second insulating layer may be subjected to heat treatment or the like to lower physical intensity, and the tube may be stuck.

In FIGS. 5A to 5D, an example in which a tube of FIGS. 4B and 4C has a conical shape with a narrow end is shown. A conductive layer 731, a first insulating layer 738, and a second insulating layer 732 are sequentially formed over a substrate 730. Then, by sticking a tube 733 into the second insulating layer 732, a first opening 734 is physically formed in the second insulating layer 732. In a cross-sectional view of FIG. 5B, the second insulating layer is divided into a second insulating layer 736a and a second insulating layer 736b.

An etchant 739 is discharged from a discharging outlet of the tube 733 to remove the first insulating layer 738 selectively, so that a continuous second opening 735 can be formed in the first insulating layer and the second insulating layer. In a cross-sectional view of FIG. 5C, the first insulating layer is divided into a first insulating layer 791a and a first insulating layer 791b.

Figure 5A:
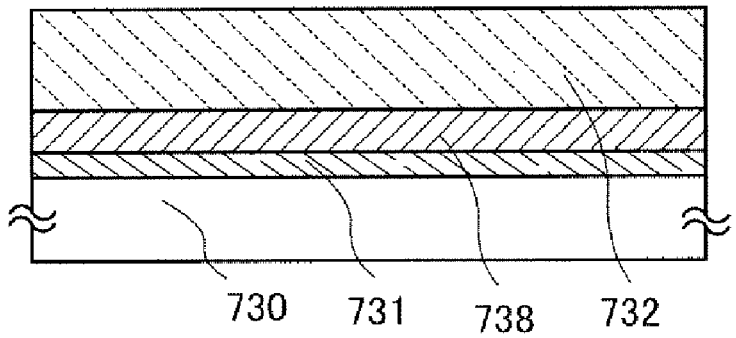
FIGS. 5A to 5D are explanatory schematic views of the present invention.
Figure 5B:
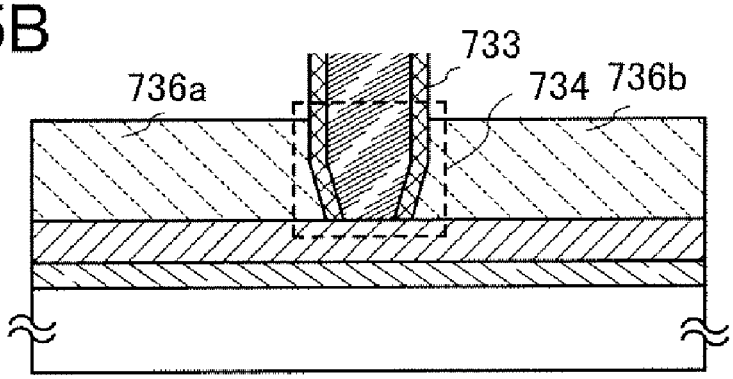
Figure 5C:
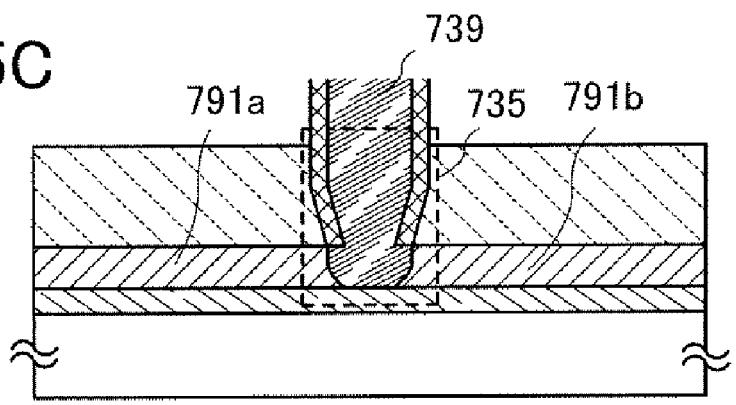
Figure 5D:
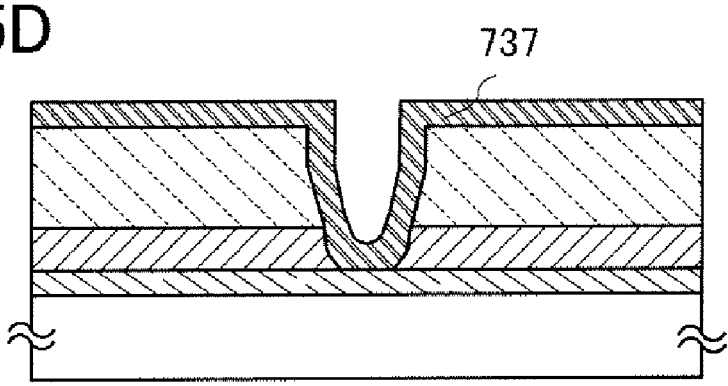

Since the shape of the opening 735 reflects a shape of the tube, the opening has a shape having a step at the side surface. A conductive film 737 is formed in the second opening 735 where the conductive layer 731 is exposed, whereby the conductive layer 731 and the conductive film 737 can be electrically connected to each other (FIG. 5D). The tube has such a tapered shape that a cross section becomes narrow toward the conductive layer. The opening 735 reflects a shape of the tube 733 and has a tapered shape.

Figure 6A:
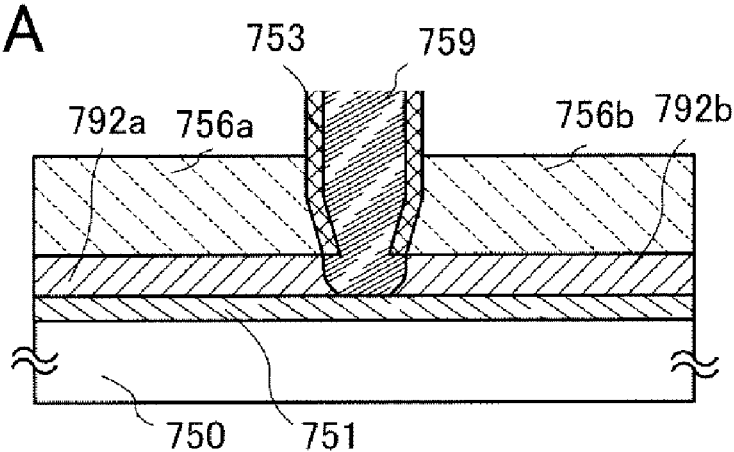
FIGS. 6A to 6D are explanatory schematic views of the present invention.

After the opening is formed in the insulating layer using the tube of the present invention, a material for forming a film (such as a conductive composition) in a liquid state may be discharged to the opening through the tube, so that a conductive layer may be formed. FIG. 6A corresponds to FIG. 5C, a conductive layer 751 is formed over a substrate 750, and first insulating layers 792a and 792b and second insulating layers 756a and 756b are formed thereover by a tube 753. An etchant 759 in which a first insulating material is dissolved is in the tube 753.

Figure 6B:
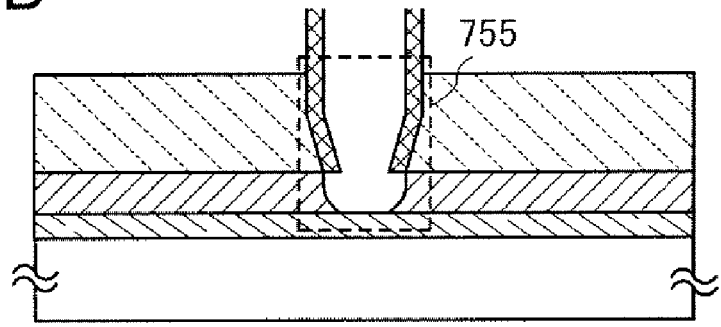
Figure 6C:
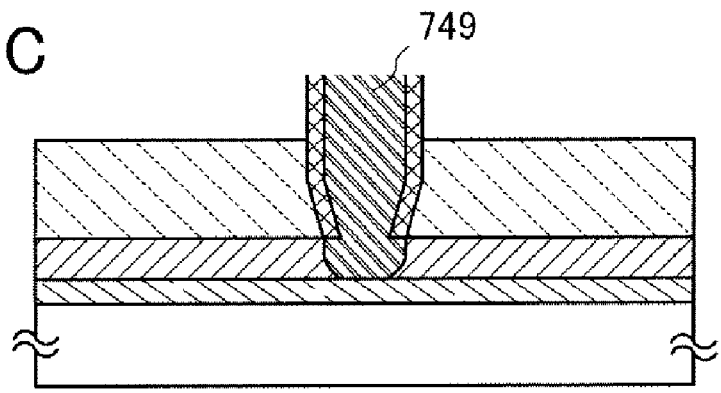
Figure 6D:
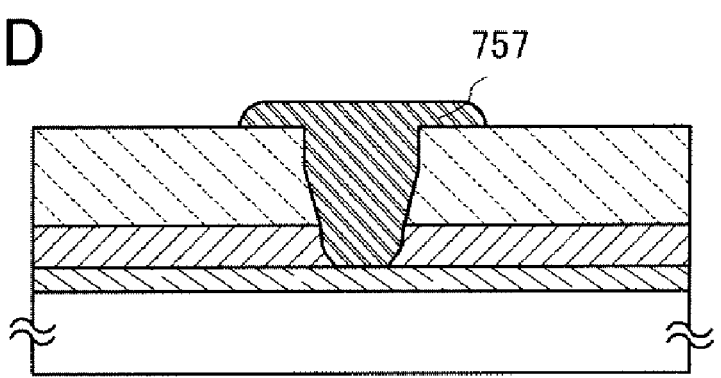

The etchant 759 in which the first insulating material is dissolved is removed by suction, whereby an opening 755 is formed (FIG. 6B). A conductive composition 749 in a liquid state is discharged to the opening 755 through the tube 753, so that a conductive layer 757 is formed (FIGS. 6C and 6D). Therefore, the conductive layer 751 and the conductive layer 757 can be electrically connected to each other.

With a minute opening, it may be difficult to fill the opening assuredly with a liquid material for forming a film by the surface tension; however, in the present invention, the opening can be assuredly filled with a material for forming a film by the tube stuck into the opening, and thus, a film can be formed without a defective shape.

The composition including the material for forming a film may be appropriately selected depending on a film to be formed. When a conductive film is formed, a composition including a conductive material may be used. When an insulating film is formed, a composition including an insulating material may be used, and when a semiconductor film is formed, a composition including a semiconductor material may be used. A composition including a material for forming a film may include a surfactant having fluorine.

In a case where the conductive film is formed as a film, the composition to be discharged is a conductive material dissolved or dispersed in a solvent. A conductive material corresponds to fine particles or dispersed nanoparticles of one or a plurality of kinds of metal, such as Ag, Au, Cu, Ni, Pt, Pd, Ir, Rh, W, or Al. Further, the conductive material may be mixed with fine particles or dispersed nanoparticles of one or a plurality of kinds of metal sulfide of Cd or Zn, oxide of Fe, Ti, Ge, Si, Zr, or Ba, silver halide, and the like. Furthermore, as the conductive material, indium tin oxide (ITO), indium tin oxide containing silicon oxide (ITSO), organic indium, organic tin, zinc oxide, titanium nitride, or the like, which is used as a transparent conductive film, may be used. A single element or a mixture of particles of a plurality of kinds of elements can be used as the conductive material. It is to be noted that as for the composition to be discharged, it is preferable to use any one of the materials of gold, silver, and copper dissolved or dispersed in a solvent, considering the resistivity value. It is more preferable to use silver or copper having low resistivity. However, when silver or copper is used, a barrier film may be additionally provided as a countermeasure against impurities. A silicon nitride film or a nickel boron (NiB) film can be used for the barrier film.

The composition to be discharged is a conductive material (insulating material) dissolved or dispersed in a solvent, and further contains a dispersant or a thermosetting resin called a binder. In particular, the binder has a function of preventing generation of a crack or uneven baking during baking. Therefore, a conductive layer to be formed may contain an organic material. The organic material contained varies depending on temperature, atmosphere, or time for heating. The organic material refers to an organic resin or the like which functions as a binder, a solvent, a dispersant, or a coating agent of metal particles. An organic resin such as a polyimide resin, an acrylic resin, a novolac resin, a melamine resin, a phenol resin, an epoxy resin, a silicone resin, a furan resin, or a diallyl phthalate resin can be used.

In addition, a particle with a plurality of layers, in which a conductive material is coated with another conductive material, may also be used. For example, a particle with a three-layer structure in which copper is coated with nickel boron (NiB) and the nickel boron is further coated with silver, may be used. As for the solvent, esters such as butyl acetate or ethyl acetate, alcohols such as isopropyl alcohol or ethyl alcohol, an organic solvent such as methyl ethyl ketone or acetone, or water is used. The viscosity of the composition is preferably less than or equal to 20 mPa·s, which prevents the composition from drying in being discharged, and enables the composition to be discharged smoothly from the discharging outlet. The surface tension of the composition is preferably less than or equal to 40 mN/m, However, the viscosity of the composition and the like may be appropriately controlled depending on a solvent to be used or an intended purpose. For example, the viscosity of a composition in which ITO, organic indium, or organic tin is dissolved or dispersed in a solvent may be set to be 5 mPa·s to 20 mPa·s, the viscosity of a composition in which silver is dissolved or dispersed in a solvent may be set to be 5 mPa·s to 20 mPa·s, and the viscosity of a composition in which gold is dissolved or dispersed in a solvent may be set to be 5 mPa·s to 20 mPa·s.

When an insulating layer is formed as a film, an organic material such as an epoxy rein, a phenol resin, a novolac resin, an acrylic rein, a melamine resin, a urethane resin, benzocyclobutene, parylene, fluorinated arylene ether, or polyimide or a resin having siloxane bond can be used. In using any material, the surface tension and the viscosity of a material are appropriately adjusted by adjusting the concentration of a solvent or by adding a surfactant or the like.

The diameter of a particle of the conductive material is preferably as small as possible for the purpose of preventing the tube from being clogged and for manufacturing a minute pattern, although it depends on the diameter of the tube, a desired shape of a pattern, and the like. Preferably, the diameter of the particle of the conductive material is less than or equal to 0.1 μm. The composition is formed by a known method such as an electrolyzing method, an atomizing method, or a wet reduction method, and the particle size is generally about 0.01 μm to 10 μm. When a gas evaporation method is employed, the size of nanoparticles protected by a dispersant is as minute as about 7 nm, and when the surface of each particle is covered with a coating, the nanoparticles do not aggregate in the solvent and are stably dispersed in the solvent at room temperature, and behave similarly to liquid. Accordingly, it is preferable to use a coating.

In addition, the step of discharging the composition may be performed under reduced pressure. The substrate may be heated in discharge. After the composition is discharged, either drying or baking or both of them are performed. Both the drying step and baking step are heat treatment; however, for example, drying is performed at 100° C. for 3 minutes and baking is performed at 200° C. to 550° C. for 15 to 60 minutes, and they are different in purpose, temperature, and time period. The steps of drying and baking are performed under normal pressure or under reduced pressure, by laser beam irradiation, rapid thermal annealing, heating using a heating furnace, or the like. It is to be noted that the timing of heat treatment and the number of times of heat treatment is not particularly limited. In order to favorably perform the steps of drying and baking, the temperature at that time is, although it depends on the material of the substrate and properties of the composition, generally room temperature to 800° C. (preferably 100° C. to 550° C.). Through these steps, nanoparticles are made in contact with each other and fusion and welding are accelerated since a peripheral resin is hardened and shrunk, while the solvent in the composition is volatilized or the dispersant is chemically removed.

A continuous wave or pulsed gas laser or solid-state laser may be used for laser beam irradiation. An excimer laser, an Ar laser, or the like can be used as the former gas laser. A laser using a crystal of YAG, $YVO_4$, $GdVO_4$, or the like which is doped with Cr, Nd, or the like can be used as the latter solid-state laser. It is preferable to use a continuous wave laser in consideration of the absorptance of a laser beam. Moreover, a laser irradiation method in which pulsed and continuous wave lasers are combined may be used. It is preferable that the heat treatment by laser beam irradiation be instantaneously performed within several microseconds to several tens of seconds so as not to damage the substrate, depending on heat resistance of the substrate. Rapid thermal annealing (RTA) is carried out by raising the temperature rapidly and heating the substrate instantaneously for several microseconds to several minutes with the use of an infrared lamp or a halogen lamp which emits ultraviolet to infrared light in an inert gas atmosphere. Since this treatment is performed instantaneously, only an outermost thin film can be heated and the lower layer of the film is not adversely affected. In other words, even a substrate having low heat resistance such as a plastic substrate is not adversely affected.

After the conductive layer or the like is formed by discharging a composition, the surface thereof may be planarized by pressing with pressure to enhance a level of planarity. As a pressing method, recession and projection may be reduced by scanning the surface with a roller, or by pressing the surface perpendicularly with a flat plate. A heating step may be performed at the time of pressing. Alternatively, the recession and projection of the surface may be softened with a solvent or the like or may be fused and removed with an air knife. A CMP method may also be used for polishing the surface.

As described above, a conductive layer (or an insulating layer) formed by discharging a composition including the conductive material (or the insulating material) and performing baking frequently has a polycrystalline state having a plurality of grain boundaries, while a conductive layer (or an insulating layer) formed by a sputtering method or the like frequently has a columnar structure.

A treatment agent (etching gas or etchant) discharged from the tube can be appropriately selected depending on a thin film that is etched as long as the tube can resist the treatment agent. For example, when a multilayer wiring including stacked layers is formed as shown in FIGS. 14A to 14D and FIGS. 36A to 36D, the present invention can be used in forming a continuous opening in multiple different thin films that are stacked.

Figure 14A:
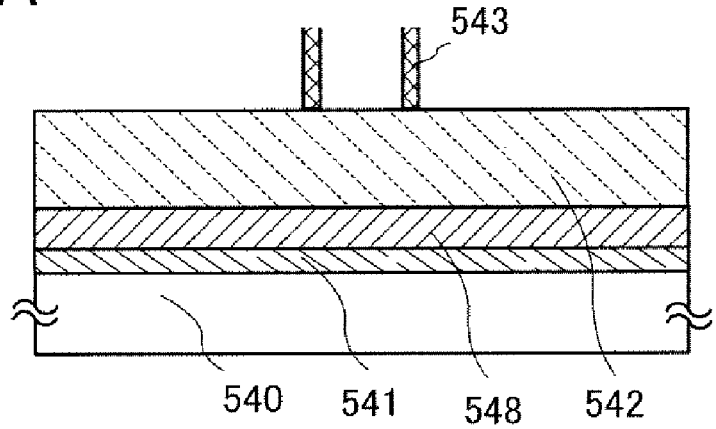
FIGS. 14A to 14D are explanatory schematic views of the present invention.
Figure 14B:
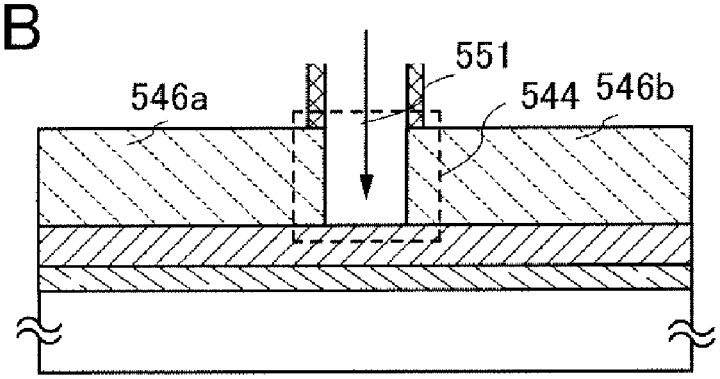
Figure 14C:
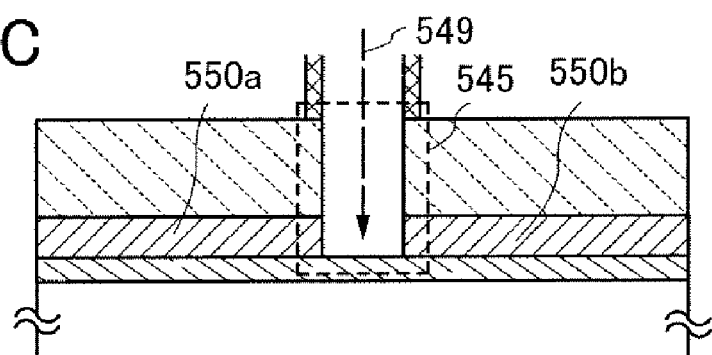

In FIG. 14A, a conductive layer 541, a first insulating layer 548, and a second insulating layer 542 are sequentially formed over a substrate 540. A tube 543 is provided to be in contact with the second insulating layer 542 in an opening formation region. In a state where the tube 543 is selectively provided, a first etching gas 551 is discharged (jetted) to the second insulating layer 542 through the tube 543. The second insulating layer 542 is selectively removed by the discharged (jetted) first etching gas 551, so that a first opening 544 is formed in the second insulating layer 542 (FIG. 14B). In a cross-sectional view of FIG. 14B, the second insulating layer is divided into a second insulating layer 546a and a second insulating layer 546b.

A second etching gas 549 is jetted from a discharging outlet of the tube 543 to remove the first insulating layer 548 selectively, whereby a continuous second opening 545 can be formed in the first insulating layer and the second insulating layer. In a cross-sectional view of FIG. 14C, the first insulating layer is divided into a first insulating layer 550a and a first insulating layer 550b.

Figure 14D:
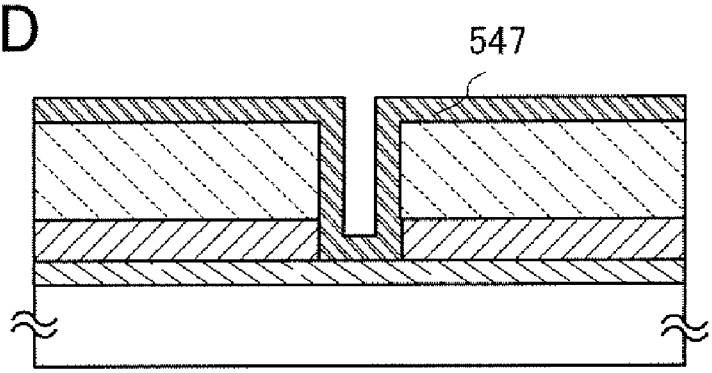

A conductive film 547 is formed in the second opening 545 where the conductive layer 541 is exposed, whereby the conductive layer 541 and the conductive film 547 can be electrically connected to each other (FIG. 14D).

Figure 36A:
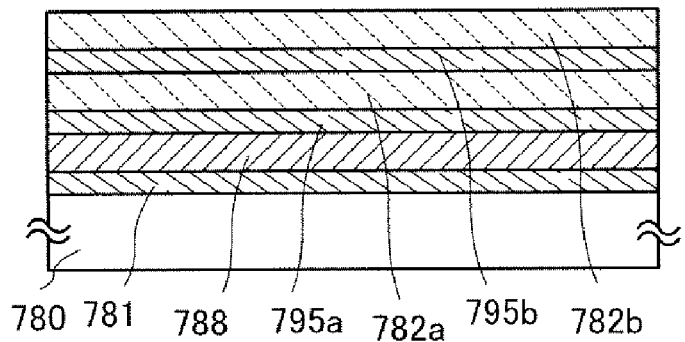
FIGS. 36A to 36D are explanatory schematic views of the present invention.
Figure 36B:
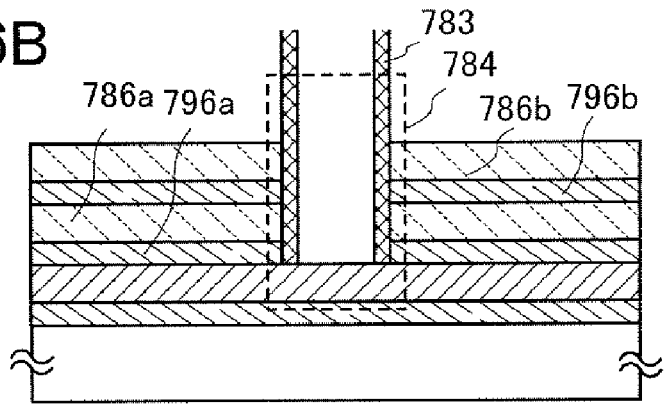
Figure 36C:
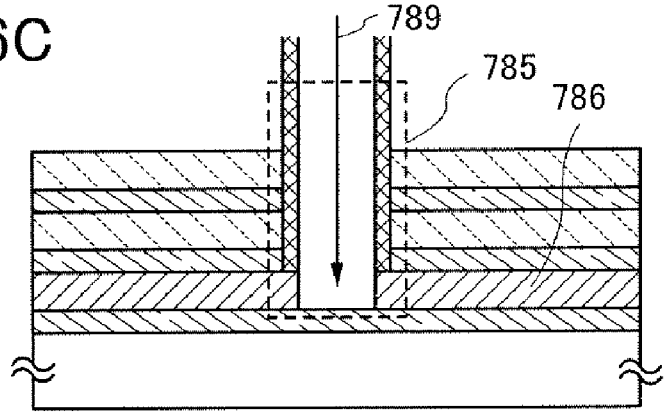

In FIGS. 36A to 36D, a conductive layer 781 and an insulating layer 788 are formed over a substrate 780, and a conductive layer 795a, an insulating layer 782a, a conductive layer 795b, and an insulating layer 782b are stacked thereover. A continuous first opening 784 is formed in the conductive layer 795b, the insulating layer 782a, the conductive layer 795b, and the insulating layer 782b using a tube 783 (FIG. 36B). In a cross-sectional view of FIG. 36B, a conductive layer 796a, an insulating layer 786a, a conductive layer 796b, and an insulating layer 786b are provided with the first opening 784.

An etching gas 789 is discharged (jetted) from the tube 783 to remove the insulating layer 788 selectively to form an insulating layer 786, whereby a second continuous opening 785 can be formed in the stacked insulating layers and conductive layers.

Figure 36D:
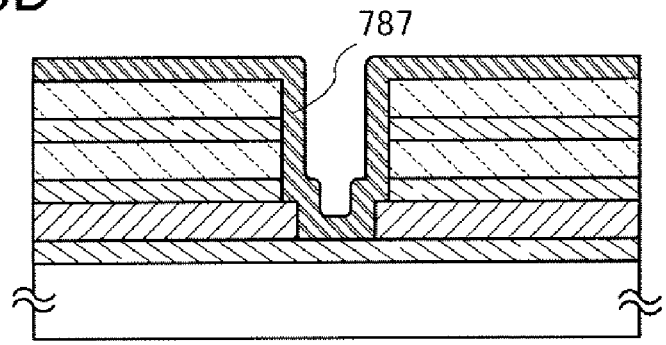

A conductive film 787 is formed in the second opening 785 where the conductive layer 781 is exposed, whereby the conductive layers 781, 796a, and 796b and the conductive film 787 can be electrically connected to each other (FIG. 36D).

Figure 7A:
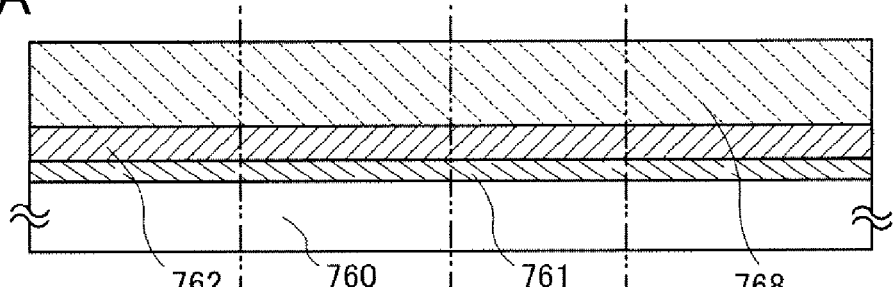
FIGS. 7A to 7E are explanatory schematic views of the present invention.

Other examples of a shape of the tube are shown in FIGS. 7A to 7E. In FIG. 7A, a conductive layer 761, a first insulating layer 762, and a second insulating layer 768 are sequentially stacked over a substrate 760.

Figure 7B:
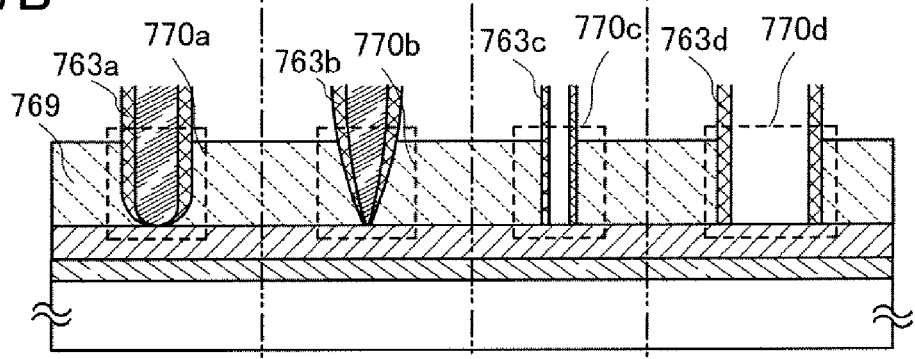

In FIG. 7B, first openings 770a to 770d are formed in the second insulating layer 768 using tubes 763a to 763d having different cross-sectional shapes, so that an insulating layer 769 is formed. The tube 763a has a dome shape of which projecting end is roundish. The tube 763b has a needle shape whose end has a sharp point. The tube 763c and the tube 763d have columnar shapes; however, they have different sizes. The tube 763c is thinner than the tube 763d.

Figure 7C:
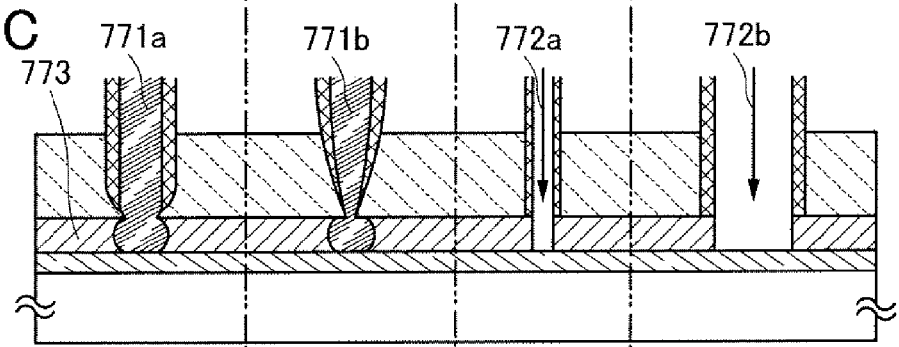
Figure 7D:
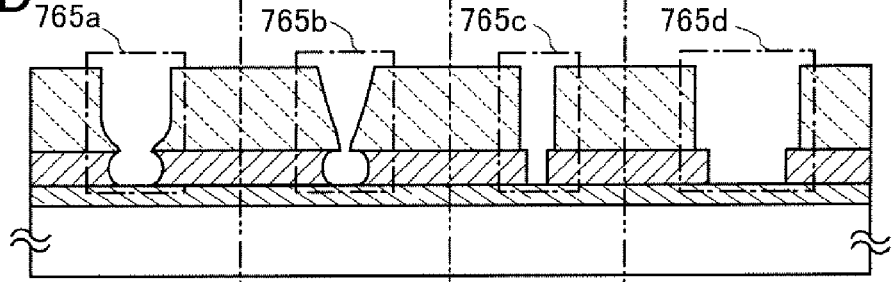

Next, an etchant 771a, an etchant 771b, an etching gas 772a, and an etching gas 772b are respectively discharged from the tubes 763a to 763d to remove the first insulating layer 762 selectively, whereby a first insulating layer 773 is formed (FIG. 7C). Then, the tubes 763a to 763d are removed, so that second openings 765a to 765d are formed (FIG. 7D).

Figure 7E:
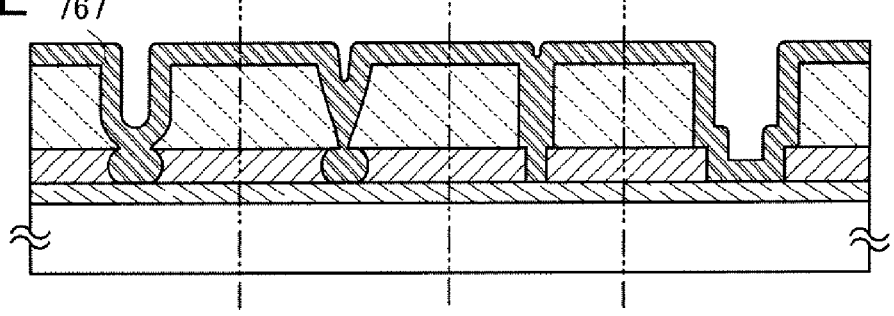

A conductive film 767 is formed in the second openings 765a to 765d where the conductive layer 761 is exposed, whereby the conductive layer 761 and the conductive film 767 can be electrically connected in each of the openings 765a to 765d (FIG. 7E).

The openings 765a to 765d are respectively formed to have shapes reflecting the shapes of the tubes 763a to 763d. In the insulating layer 769, the opening 765a has a shape rounded toward a bottom of the opening. The opening 765b has a needle shape whose end has a sharp point where a diameter of the opening 765b becomes thinner toward a bottom. The opening 765c and the opening 765d have different sizes, and the opening 765c is smaller than the opening 765d. In this manner, an insulating layer having a plurality of openings of which shapes are different from each other can be easily formed through the same process. Accordingly, various opening shapes can be selected; therefore, degree of freedom to design wirings and the like included in a display device or a semiconductor device is increased.

The depth of the opening can be determined by force at a time when the tube is provided and intensity of a film on which the tube is placed. When a needle-shaped tube whose end has a sharp point is provided so as to be partially embedded in a film, an opening having a recessed portion in the film can be formed.

After the opening is formed, a conductive material or an insulating material which remains around the opening (a residue in a portion where the conductive layer or insulating layer is removed) may be washed away with a liquid, so that the residue can be removed. In this case, a nonreactive substance such as water, or a chemical solution such as an etchant which reacts with (dissolves in) the insulating layer may be used for washing. When an etchant is used, the opening is over-etched, whereby a dust and the like are removed, and the surface is more planarized. Further, the size of the opening can be increased.

In this manner, an opening (a contact hole) for enabling electrical connection between the conductive layer and the conductive film can be formed in the insulating layer without forming a resist mask layer and a complicated photolithography step.

In accordance with this embodiment mode, a contact hole can be formed in the insulating layer without forming a mask, so that the process can be simplified. Further, it is not necessary to perform light-exposure and development after application of a photoresist or the like, so that the cost of materials required for processing can be reduced. Furthermore, the contact hole can be assuredly formed, whereby the manufacturing yield can be improved.

Embodiment Mode 3

Figure 35A:
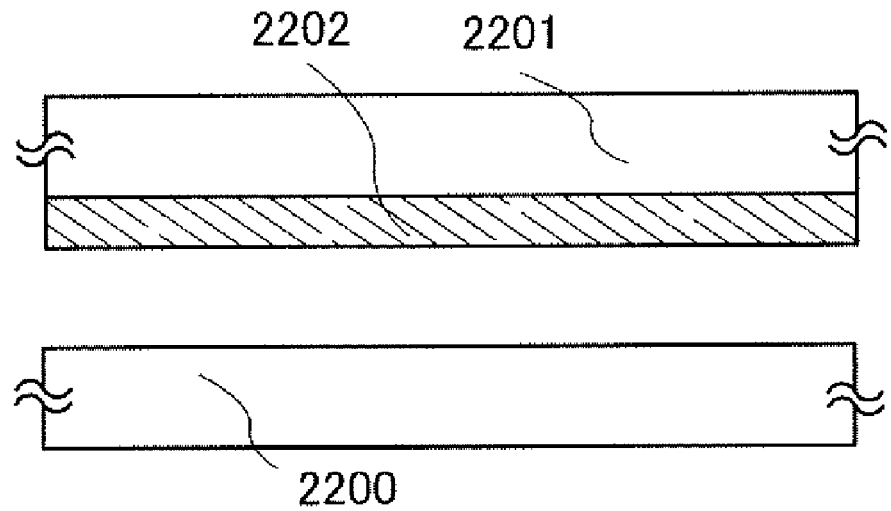
FIGS. 35A to 35C are explanatory views of a method for manufacturing a display device of the present invention.
Figure 35B:
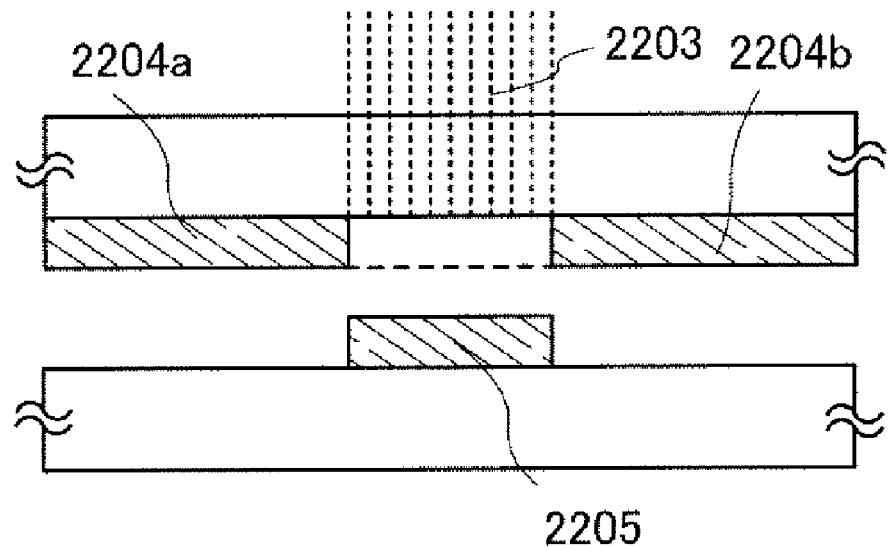
Figure 35C:
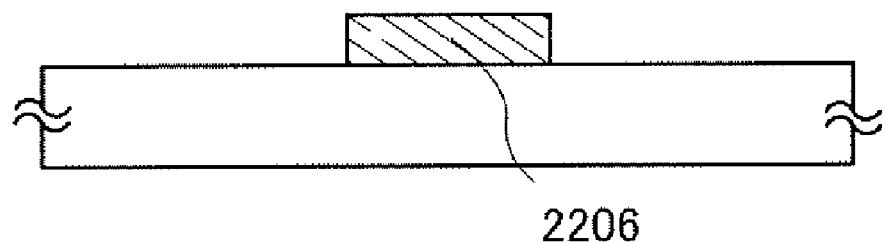

This embodiment mode will describe a method for manufacturing a display device through a simplified process at low cost with reference to FIGS. 35A to 35C.

In this embodiment mode, components (also called patterns) such as a conductive layer, a semiconductor layer, and the like are selectively formed into a desired shape, without using a photolithography step in processing a thin film into a desired pattern. In the present invention, the components (also called patterns) mean a conductive layer such as a wiring layer, a gate electrode layer, a source electrode layer, or a drain electrode layer, a semiconductor layer, a mask layer, an insulating layer, and the like included in a thin film transistor or a display device and include all component parts formed with a predetermined shape.

In this embodiment mode, a light-absorbing film such as a conductive film or a semiconductor film is formed on a light-transmitting transposing substrate and a transposing substrate side is selectively irradiated with a laser beam, so that the light-absorbing film corresponding to a laser beam irradiated region is transposed to a transposed substrate, and a light-absorbing layer such as a conductive layer or a semiconductor layer is formed into a desired shape (pattern). In this specification, the substrate on which the light-absorbing film such as the conductive film or the semiconductor film is formed and which is irradiated with a laser beam in the first step is referred to as the transposing substrate, and the substrate over which the light-absorbing layer such as the conductive layer or the semiconductor layer is selectively formed finally is referred to as the transposed substrate. Since the light-absorbing film such as the conductive film or the semiconductor film can be selectively formed into a desired shape without using a photolithography step, the manufacturing process can be simplified and cost can be reduced.

A method for forming a thin film shown in this embodiment mode is described in detail with reference to FIGS. 35A to 35C. In FIGS. 35A to 35C, a light-absorbing film 2202 is formed on a first substrate 2201 which is a transposing substrate, and the first substrate 2201 and a second substrate 2200 which is a transposed substrate are arranged to sandwich the light-absorbing film 2202 therebetween.

A laser beam 2203 is transmitted through the substrate 2201, and the light-absorbing film 2202 is selectively irradiated with the laser beam 2203 from a substrate 2201 side. The light-absorbing film 2202 in a region irradiated with the laser beam 2203 absorbs the laser beam 2203 and is transposed to a second substrate 2200 side as a light-absorbing layer 2205 by energy of the heat or the like. On the other hand, the other region which is not irradiated with the laser beam 2203 is left on the first substrate 2201 side as light-absorbing films 2204a and 2204b. In this manner, when a thin film which is a light-absorbing layer 2206 is processed into a desired pattern without using a photolithography step, a component (also called a pattern) such as a conductive layer or a semiconductor layer is selectively formed into a desired shape.

After being transposed by the laser beam, the light-absorbing layer may be subjected to heat treatment or may be irradiated with a laser beam.

As for the light-absorbing film 2202 that is transposed, a material absorbing irradiation light is used, and as for the first substrate 2201, a light-transmitting substrate that transmits irradiation light is used. Since transposition can be freely performed to various substrates by using the present invention, a substrate material can be selected from the wide range of materials. In addition, an inexpensive material can be selected for the substrate, so that a display device can be manufactured at low cost as well as having various functions in accordance with applications.

The thin film formation method in this embodiment mode can be used for forming a conductive layer such as a wiring layer, a gate electrode layer, a source electrode layer, or a drain electrode layer, a semiconductor layer, a mask layer, an insulating layer, or the like included in a thin film transistor or a display device. A film using a desired material may be formed as a light-absorbing film, and light which is absorbed by the film may be selected and used for irradiation.

For example, a conductive material can be used as the light-absorbing film. For example, one or a plurality of kinds of chromium, tantalum, silver, molybdenum, nickel, titanium, cobalt, copper, and aluminum can be used. Indium tin oxide (ITO), indium tin oxide containing silicon oxide (ITSO), zinc oxide (ZnO), a conductive material in which zinc oxide is doped with gallium (Ga), or indium zinc oxide (IZO) may also be used. Alternatively, a semiconductor material can be used as the light-absorbing film. For example, an inorganic semiconductor material such as silicon, germanium, silicon germanium, gallium arsenide, molybdenum oxide, tin oxide, bismuth oxide, vanadium oxide, nickel oxide, zinc oxide, gallium arsenide, gallium nitride, indium oxide, indium phosphide, indium nitride, cadmium sulfide, cadmium telluride, or strontium titanate can be used. Hydrogen or an inert gas (e.g., helium (He), argon (Ar), krypton (Kr), neon (Ne), or xenon (Xe)) may be added to the light-absorbing film.

In accordance with this embodiment mode, a contact hole can be formed in an insulating layer without forming a mask; therefore, the process can be simplified. Further, it is not necessary to perform light-exposure and development after application of a photoresist or the like, so that the cost of materials required for processing can be reduced. Furthermore, the contact hole can be assuredly formed, whereby the manufacturing yield can be improved.

Embodiment Mode 4

Figure 25A:
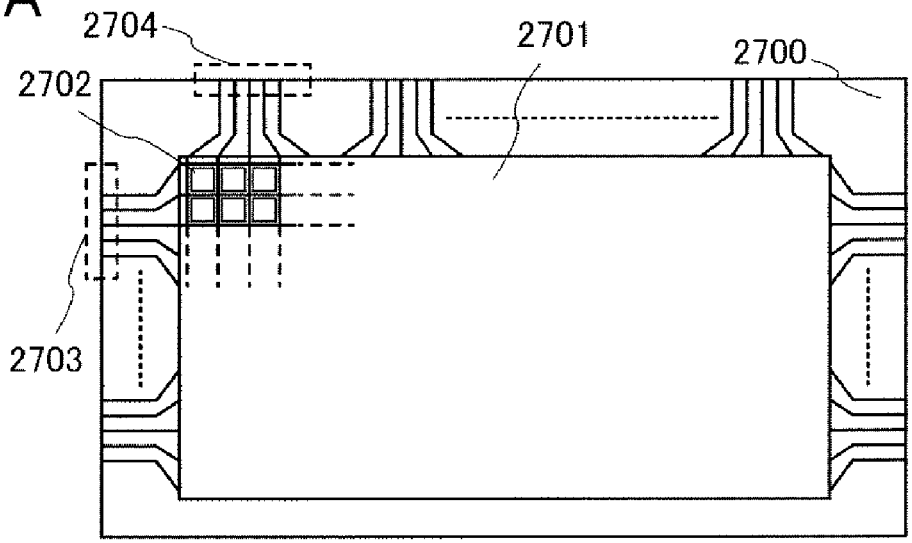
FIGS. 25A to 25C are plan views of a display device of the present invention.

FIG. 25A is a plan view showing a structure of a display panel of the present invention, in which a pixel portion 2701 in which pixels 2702 are arranged in matrix, a scan line input terminal 2703, and a signal line input terminal 2704 are formed over a substrate 2700 having an insulating surface. The number of pixels may be set according to various standards: the number of pixels of XGA for RGB full-color display may be 1024×768×3 (RGB), that of UXGA for RGB full-color display may be 1600×1200×3 (RGB), and that corresponding to a full-spec high vision for RGB full-color display may be 1920×1080×3 (RGB).

Scan lines extended from the scan line input terminal 2703 intersect with signal lines extended from the signal line input terminal 2704, and the pixels 2702 are arranged in matrix at the intersections. Each pixel 2702 is provided with a switching element and a pixel electrode connected to the switching element. A typical example of the switching element is a TFT.

A gate electrode side of the TFT is connected to the scan line, and a source or drain side thereof is connected to the signal line, so that each pixel can be controlled independently by signals inputted from outside.

Figure 26A:
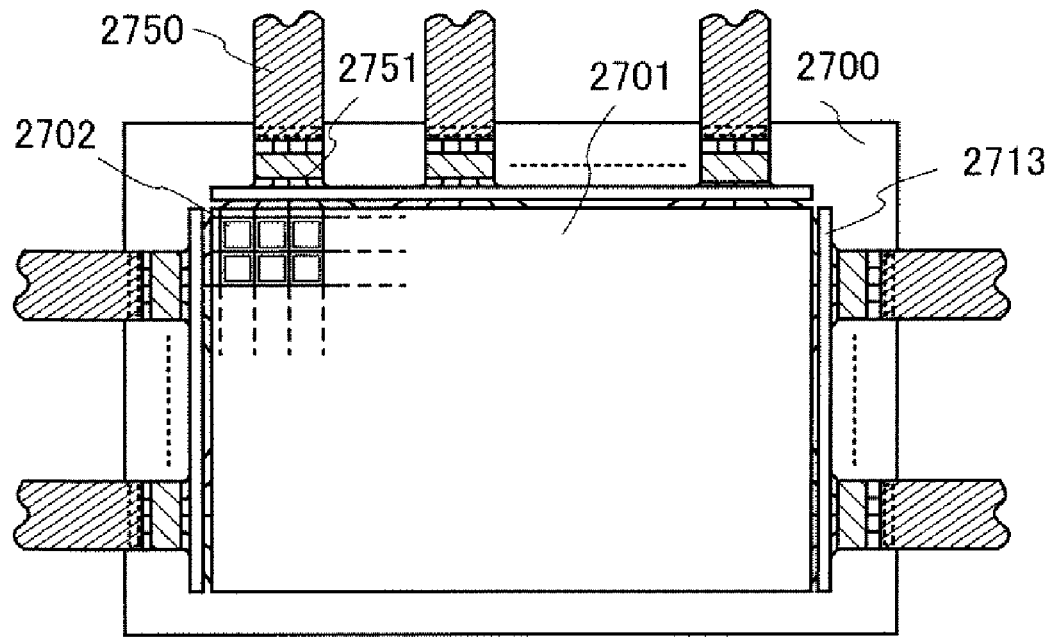
FIGS. 26A and 26B are plan views of a display device of the present invention.
Figure 26B:
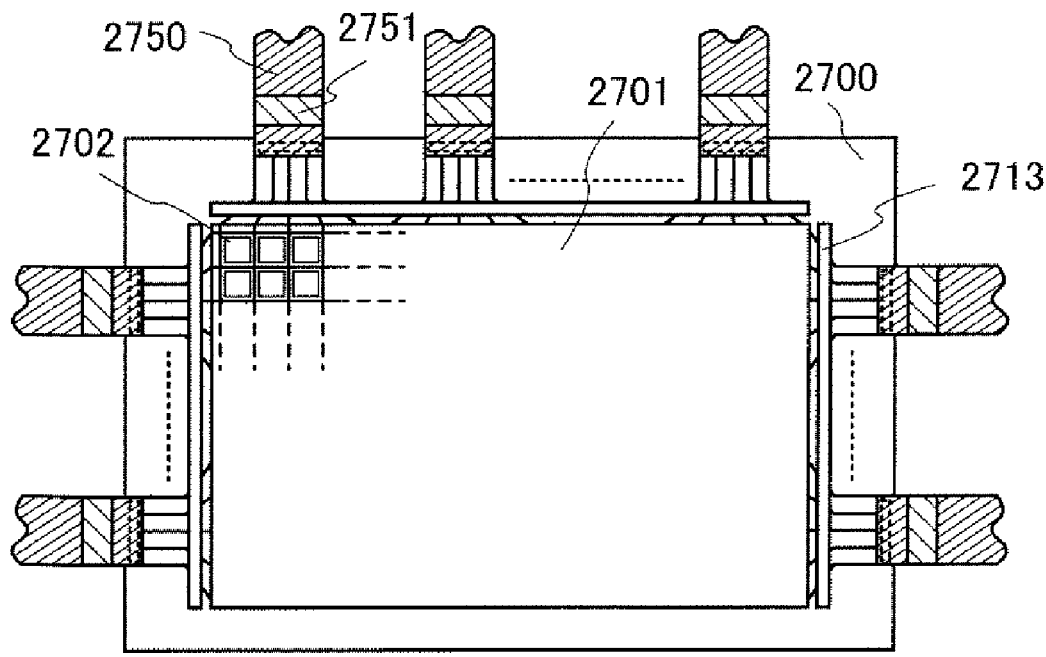

Although FIG. 25A shows the structure of the display panel in which signals inputted to the scan and signal lines are controlled by an external driver circuit, driver ICs 2751 may be mounted on the substrate 2700 with a protective circuit 2713 by COG (Chip On Glass) as shown in FIG. 26A. Further, the driver ICs may also be mounted by TAB (Tape Automated Bonding) as shown in FIG. 26B. The driver ICs may be either ones formed using a single crystalline semiconductor substrate or circuits that are formed using a TFT over a glass substrate. In FIGS. 26A and 26B, each driver IC 2751 is connected to an FPC 2750.

Figure 25B:
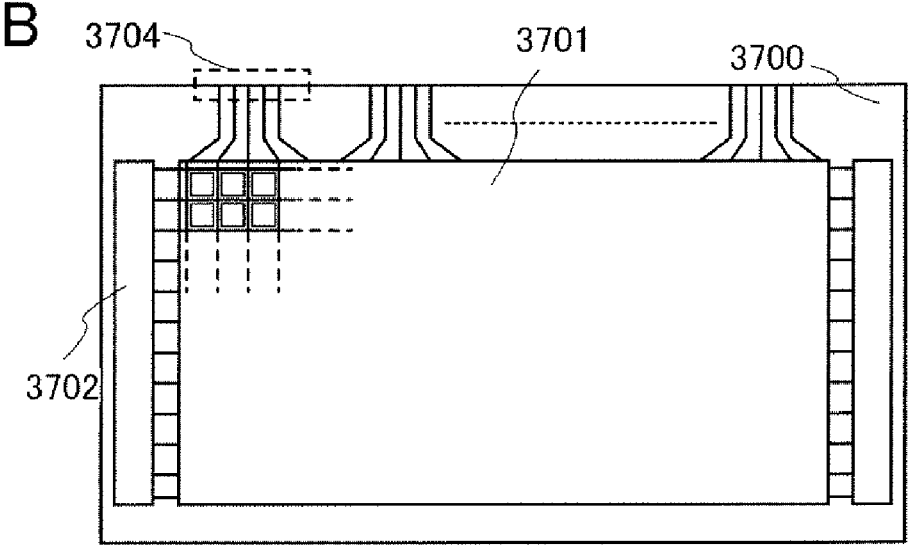
Figure 25C:
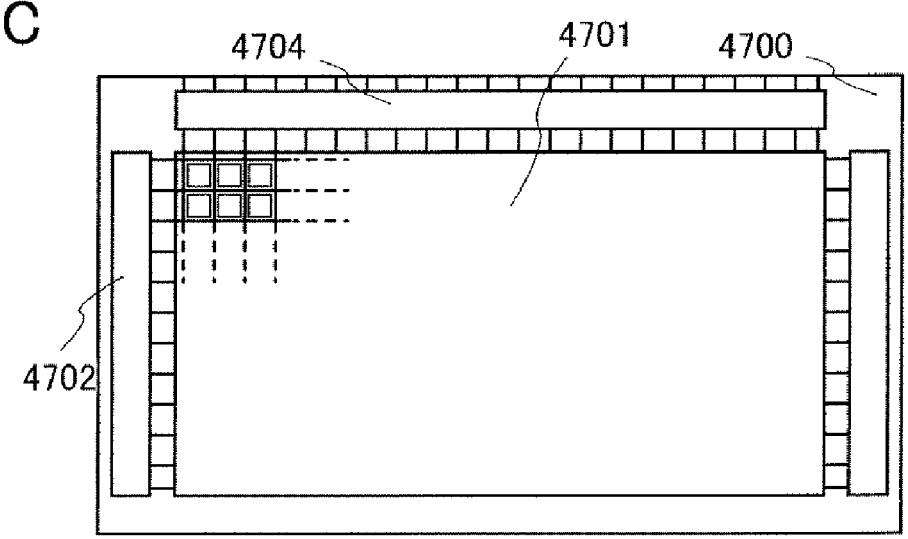

Further, in the case where a TFT provided in each pixel is formed using a polycrystalline (microcrystalline) semiconductor having high crystallinity, a scan line driver circuit 3702 may be formed over a substrate 3700 as shown in FIG. 25B. In FIG. 25B, reference numeral 3701 denotes a pixel portion, reference numeral 3704 denotes a signal line input terminal 3704 and a signal line driver circuit is controlled by an external driver circuit, which is similar to FIG. 25A. In the case where, like the TFT formed in the present invention, a TFT provided in each pixel is formed using a polycrystalline (microcrystalline) semiconductor, a single crystalline semiconductor, or the like with high mobility, a scan line driver circuit 4702 and a signal line driver circuit 4704 can be formed over a same substrate 4700 with a pixel portion 4701, as shown in FIG. 25C.

The embodiment mode of the present invention is described with reference to FIGS. 8A to 8C, 9A to 9C, 10A to 10C, 11A to 11D, 12A to 12C, and 13A and 13B. Specifically, a method for manufacturing a display device including an inversely staggered thin film transistor, to which the present invention is applied is described. FIGS. 8A, 9A, 10A, 11A, and 12A are plan views of a pixel portion of a display device; FIGS. 8B, 9B, 10B, 11B, and 12B are cross-sectional views taken along lines A-C in FIGS. 8A, 9A, 10A, 11A, and 12A, respectively; and FIGS. 8C, 9C, 10C, 11C, and 12C are cross-sectional views taken along lines B-D in FIGS. 8A, 9A, 10A, 11A, and 12A, respectively. FIGS. 13A and 13B are also cross-sectional views of a display device.

As a substrate 100, a glass substrate made of barium borosilicate glass, aluminoborosilicate glass, or the like; a quartz substrate; a metal substrate; or a plastic substrate having heat resistance that can withstand process temperature of this manufacturing process is used. Further, the surface of the substrate 100 may be polished by a CMP method or the like to be planarized. It is to be noted that an insulating layer may be formed over the substrate 100. The insulating layer may be formed of either a single layer or a stacked layer using an oxide material containing silicon or a nitride material containing silicon by various methods such as a CVD method including a plasma CVD method, a sputtering method, and a spin coating method. It is not necessary to form this insulating layer; however, this insulating layer has an advantageous effect of blocking contaminants and the like from the substrate 100.

Gate electrode layers 103 and 104 (104$a$ and 104$b$) are formed over the substrate 100. Each of the gate electrode layers 103 and 104 (104$a$ and 104$b$) may be formed of an element selected from Ag, Au, Ni, Pt, Pd, Ir, Rh, Ta, W, Ti, Mo, Al, and Cu, or an alloy material or a compound material containing the above element as its main component. Further, a semiconductor film typified by a polycrystalline silicon film doped with an impurity element such as phosphorus, or an AgPdCu alloy may be used. Further, a single-layer structure or a structure including a plurality of layers may be used. For example, a two-layer structure of a tungsten nitride film and a molybdenum (Mo) film or a three-layer structure in which a tungsten film with a thickness of 50 nm, an alloy film of aluminum and silicon (Al—Si) with a thickness of 500 nm, and a titanium nitride film with a thickness of 30 nm are sequentially stacked may be used. In the case of the three-layer structure, tungsten nitride may be used instead of tungsten for the first conductive film, an alloy film of aluminum and titanium (Al—Ti) may be used instead of the alloy film of aluminum and silicon (Al—Si) for the second conductive film, and a titanium film may be used instead of the titanium nitride film for the third conductive film.

The gate electrode layers 103, 104$a$, and 104$b$ can be formed by using a a sputtering method, a PVD (Physical Vapor Deposition) method, a CVD (Chemical Vapor Deposition) method such as a low-pressure CVD (LPCVD) method or a plasma CVD method, or the like, and by processing using a mask layer. Further, a method by which a component can be transferred or drawn to be a desired pattern, such as various printing methods (a method for forming a component to be a desired pattern, e.g., screen (mimeograph) printing, offset (planograph) printing, relief printing, or gravure (intaglio) printing), a droplet discharging method, a dispenser method, a selective-coating method, or the like can also be used.

A conductive film may be processed by dry etching or wet etching. By using an ICP (Inductively Coupled Plasma) etching method and adjusting etching conditions (e.g., the amount of power applied to a coiled electrode, the amount of power applied to an electrode on a substrate side, the electrode temperature on the substrate side, or the like) as appropriate, each electrode layer can be etched into a tapered shape. It is to be noted that as an etching gas, a chlorine-based gas such as $Cl_2$, $BCl_3$, $SiCl_4$, or $CCl_4$, a fluorine-based gas such as $CF_4$, $SF_6$, or $NF_3$, or $O_2$ can be used as appropriate.

As for formation of each gate electrode layer, after a conductive film which is a light-absorbing film is formed on a transposing substrate, the gate electrode layer is selectively formed over a transposed substrate by a laser beam and processed into a desired shape. After being transposed by the laser beam, the light-absorbing layer may be subjected to heat treatment or may be irradiated with a laser beam.

A material which absorbs irradiation light is used for the light-absorbing film which is an object to be transposed, and a light-transmitting substrate which transmits irradiation light is used for a transposing substrate. By the present invention, transposition can be freely performed to various substrates; therefore, a substrate material can be selected from the wide range of materials. Further, an inexpensive material can be selected for the substrate, so that a display device can be manufactured at low cost as well as having various functions in accordance with applications.

Figure 8A:
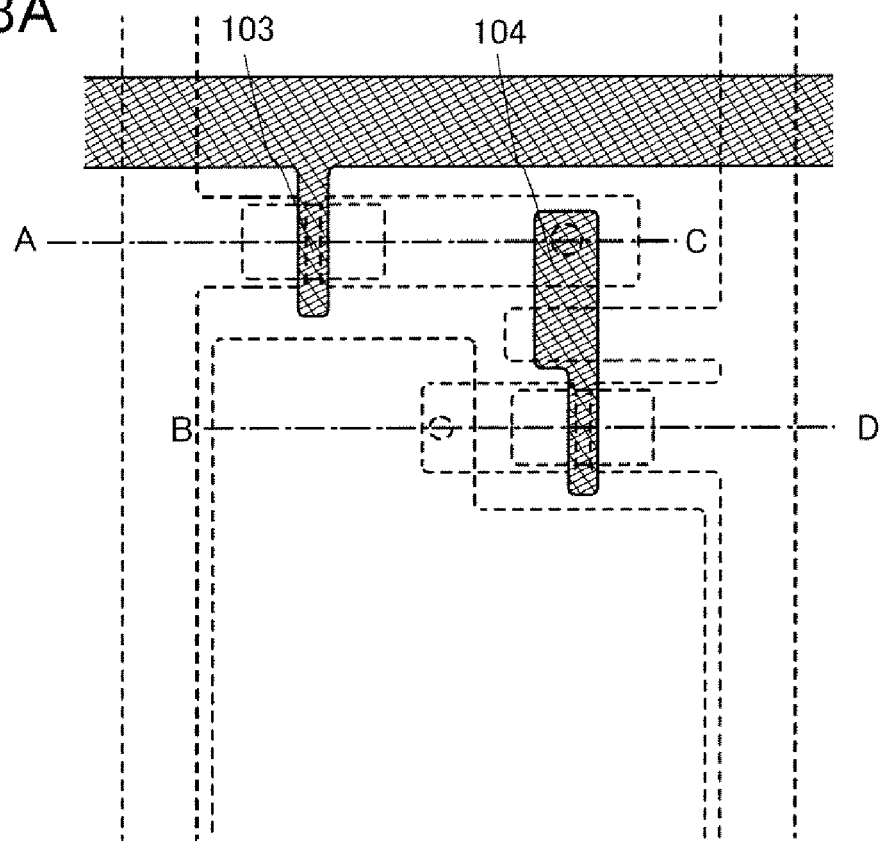
FIGS. 8A to 8C are explanatory views of a method for manufacturing a display device of the present invention.
Figure 8B:
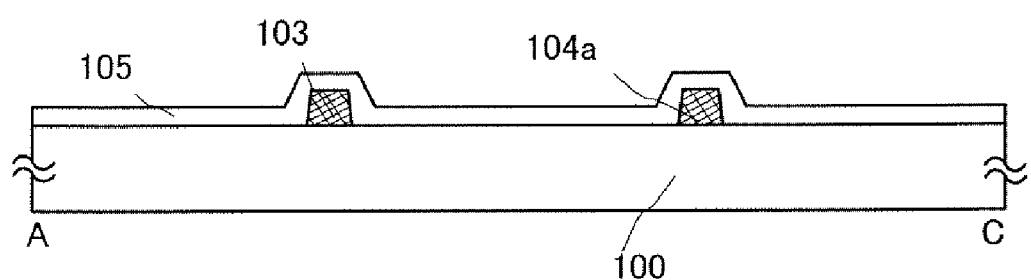
Figure 8C:
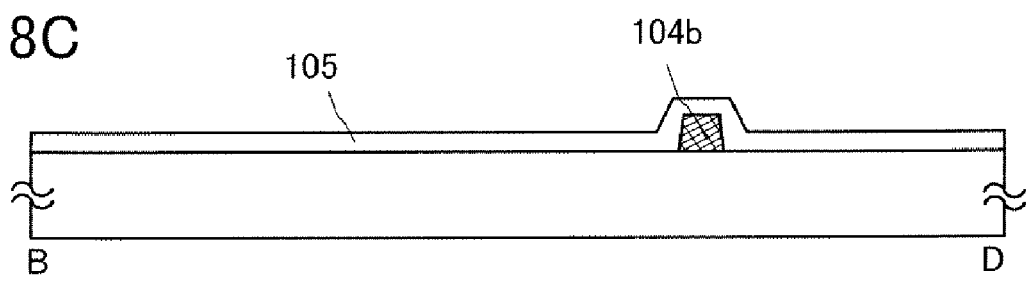

Next, a gate insulating layer 105 is formed over the gate electrode layers 103 and 104 (104$a$, and 104$b$) (FIGS. 8A to 8C). The gate insulating layer 105 may be formed using a silicon oxide material or a silicon nitride material to have a stacked layer or a single layer. In this embodiment mode, a stacked layer including two layers of a silicon nitride film and a silicon oxide film is used. Alternatively, a single layer of a silicon oxynitride film or a stacked layer including three or more layers may be used. It is preferable to use a silicon nitride film having dense film quality. In a case where silver, copper, or the like is used for a conductive layer formed by a droplet discharging method, a silicon nitride film or a NiB film is formed as a barrier film thereover, which leads to effect of prevention of diffusion of impurities and planarization of a surface. In order to form a dense insulating film which has low deposition temperature and low gate leakage current, a rare gas element such as argon is included in a reaction gas, and the gas may be mixed into the insulating film to be formed.

When etching process is used, either plasma etching (dry etching) or wet etching may be employed. However, when a large-sized substrate is processed, plasma etching is suitable. As an etching gas, a fluorine based gas such as $CF_4$ or $NF_3$, or a chlorine based gas such as $Cl_2$, or $BCl_3$ is used, to which an inert gas such as He or Ar may be appropriately added. When an etching process using atmospheric discharge plasma is employed, a local discharging process is also possible, and the mask layer does not need to be formed over the entire surface of the substrate.

Next, a semiconductor layer is formed. A semiconductor layer having one conductivity type may be formed as needed. Further, an NMOS structure of an n-channel TFT in which a semiconductor layer having n-type conductivity is formed, a PMOS structure of a p-channel TFT in which a semiconductor layer having p-type conductivity is formed, or a CMOS structure of an n-channel TFT and a p-channel TFT can be manufactured. Further, in order to impart conductivity type, an element which provides conductivity type may be added to a semiconductor layer by doping to form an impurity region in the semiconductor layer, so that an n-channel TFT or a p-channel TFT can be formed. Instead of forming a semiconductor layer having n-type conductivity, plasma treatment with a $PH_3$ gas may be performed, to provide conductivity type for the semiconductor layer.

As a material forming the semiconductor layer, the following can be used: an amorphous semiconductor (hereinafter also referred to as an "AS") formed by a vapor deposition method using a semiconductor material gas typified by silane or germane or a sputtering method; a polycrystalline semiconductor or a semi-amorphous semiconductor (also referred to as microcrystal and hereinafter also referred to as a "SAS") formed by crystallizing the amorphous semiconductor by using light energy or thermal energy; or the like. The semiconductor layer can be formed by various methods (e.g., a sputtering method, an LPCVD method, or a plasma CVD method).

An SAS is a semiconductor having an intermediate structure between amorphous and crystalline (including single crystal and polycrystalline) structures and a third state which is stable in free energy. Further, an SAS includes a crystalline region with a short-distance order and lattice distortion. A crystal grain having a diameter of 0.5 nm to 20 nm can be observed at least in a part of the film. In the case where silicon is contained as a main component, Raman spectrum is shifted toward the low-frequency side that is lower than 520 $cm^{-1}$. The diffraction peaks of (111) and (220), which are considered to be derived from a silicon crystal lattice, are observed by X-ray diffraction. An SAS contains hydrogen or halogen at least at 1 atomic % or more in order to terminate dangling bonds. An SAS is formed by glow discharge decomposition (plasma CVD) of a gas containing silicon. As the gas containing silicon, as well as $SiH_4$, any of $Si_2H_6$, $SiH_2Cl_2$, $SiHCl_3$, $SiCl_4$, $SiF_4$, and the like can be used. Further, $F_2$ or $GeF_4$ may be mixed. The gas containing silicon may be diluted with $H_2$, or $H_2$ and one or a plurality of kinds of rare gas elements of He, Ar, Kr, and Ne. The dilution ratio is 1:2 to 1:1000, pressure is approximately 0.1 Pa to 133 Pa, and a power source frequency is 1 MHz to 120 MHz, preferably 13 MHz to 60 MHz. A temperature for heating the substrate is preferably less than or equal to 300° C., and an SAS can also be formed at 100° C. to 200° C. It is preferable that the concentration of impurities of atmospheric components such as oxygen, nitrogen, and carbon as impurity elements mixed in the film in deposition be less than or equal to $1\times10^{20}$ $cm^{-3}$. In particular, an oxygen concentration is preferably less than or equal to $5\times10^{19}$ $cm^{-3}$, and more preferably less than or equal to $1\times10^{19}$ $cm^{-3}$. Further, when a rare gas element such as helium, argon, krypton, or neon is contained to further increase the lattice distortion, stability can be enhanced, and a favorable SAS can be obtained. Further, as the semiconductor layer, a stacked layer in which an SAS layer formed by using a hydrogen-based gas is stacked over an SAS layer formed by using a fluorine-based gas may be used.

As a typical example of an amorphous semiconductor, hydrogenated amorphous silicon can be given; and as a typical example of a crystalline semiconductor, polysilicon or the like can be given. Polysilicon (polycrystalline silicon) includes so-called high-temperature polysilicon formed using polysilicon which is formed at a processing temperature of greater than or equal to 800° C. as a main material, so-called low-temperature polysilicon formed using polysilicon which is formed at a processing temperature of less than or equal to 600° C. as a main material, polysilicon crystallized by adding an element which promotes crystallization, and the like. Of course, as described above, a semi-amorphous semiconductor or a semiconductor which includes a crystalline phase in a part of the layer can also be used.

When a crystalline semiconductor layer is used as the semiconductor layer, the crystalline semiconductor layer may be formed by various methods (e.g., a laser crystallization method, a thermal crystallization method, or a thermal crystallization method using an element such as nickel which promotes crystallization). Further, a microcrystalline semiconductor that is an SAS may be crystallized by laser irradiation to enhance crystallinity. In the case where the element which promotes crystallization is not used, before the amorphous silicon film is irradiated with a laser beam, the amorphous silicon film is heated at 500° C. for one hour in a nitrogen atmosphere to discharge hydrogen so that the hydrogen concentration in the amorphous silicon film becomes less than or equal to $1\times10^{20}$ atoms/$cm^3$. This is because, if the amorphous silicon film containing much hydrogen is irradiated with a laser beam, the amorphous silicon film would be broken.

A method for introducing a metal element into the amorphous semiconductor layer is not particularly limited as long as the metal element can be introduced into a surface of or inside the amorphous semiconductor layer. For example, a sputtering method, a CVD method, a plasma treatment method (including a plasma CVD method), an adsorption method, or a method for applying a solution of metal salt can be used. Among them, a method using a solution is simple and advantageous in that the concentration of the metal element can be easily controlled. At this time, it is desirable to form an oxide film by UV light irradiation in an oxygen atmosphere, a thermal oxidation method, treatment with either ozone water containing hydroxyl radicals or hydrogen peroxide, or the like to improve wettability of the surface of the amorphous semiconductor layer so that an aqueous solution is diffused on the entire surface of the amorphous semiconductor layer.

In order to crystallize the amorphous semiconductor layer, heat treatment may be combined with laser beam irradiation, or either one of heat treatment and laser beam irradiation may be performed plural times.

Further, the crystalline semiconductor layer may also be selectively formed over the substrate directly by a plasma method.

An organic semiconductor material may be used as a semiconductor, and a printing method, a dispenser method, a spray method, a spin coating method, a droplet discharging method, or the like can be used. In this case, since the above-described etching step is not necessary, the number of steps can be reduced. As the organic semiconductor, a low-molecular material, a high-molecular material, or the like can be used. Further, an organic dye, a conductive high-molecular material, or the like can also be used. As the organic semiconductor material used in the present invention, pentacene or π-electron conjugated high-molecular material of which skeleton includes a conjugated double bond is desirable. Typically, a soluble high-molecular material such as polythiophene, polyfluorene, poly(3-alkylthiophene), or a polythiophene derivative can be used.

Further, as the organic semiconductor material which can be used in the present invention, there is a material by which a semiconductor layer can be formed by depositing a soluble precursor thereof to form a film and processing it. It is to be noted that as examples of such an organic semiconductor material, there are polythienylenevinylene, poly(2,5-thienylenevinylene), polyacetylene, polyacetylene derivatives, polyallylenevinylene, and the like.

In order to change the precursor into the organic semiconductor, not only heat treatment but also addition of a reaction catalyst such as a hydrogen chloride gas is performed. Further, as a typical solvent for dissolving the soluble organic semiconductor material, the following can be used: toluene, xylene, chlorobenzene, dichlorobenzene, anisole, chloroform, dichloromethane, γbutyllactone, butylcellosolve, cyclohexane, NMP (N-methyl-2-pyrrolidone), cyclohexanone, 2-butanon, dioxane, dimethylformamide (DMF), THF (tetrahydrofuran), or the like.

In this embodiment mode, amorphous semiconductor layers as semiconductor layers 110 and 111 having one conductivity type and semiconductor layers 108 and 109 are formed. In this embodiment mode, as a semiconductor film having one conductivity type, a semiconductor film having n-type conductivity containing phosphorus (P) that is an impurity element imparting n-type conductivity is formed. The semiconductor film having one conductivity type serves as a source region and a drain region. The semiconductor film having one conductivity type may be formed as needed, and a semiconductor film having n-type conductivity containing an impurity element (P or As) imparting n-type conductivity or a semiconductor film having p-type conductivity containing an impurity element (B) imparting p-type can be formed.

Figure 9A:
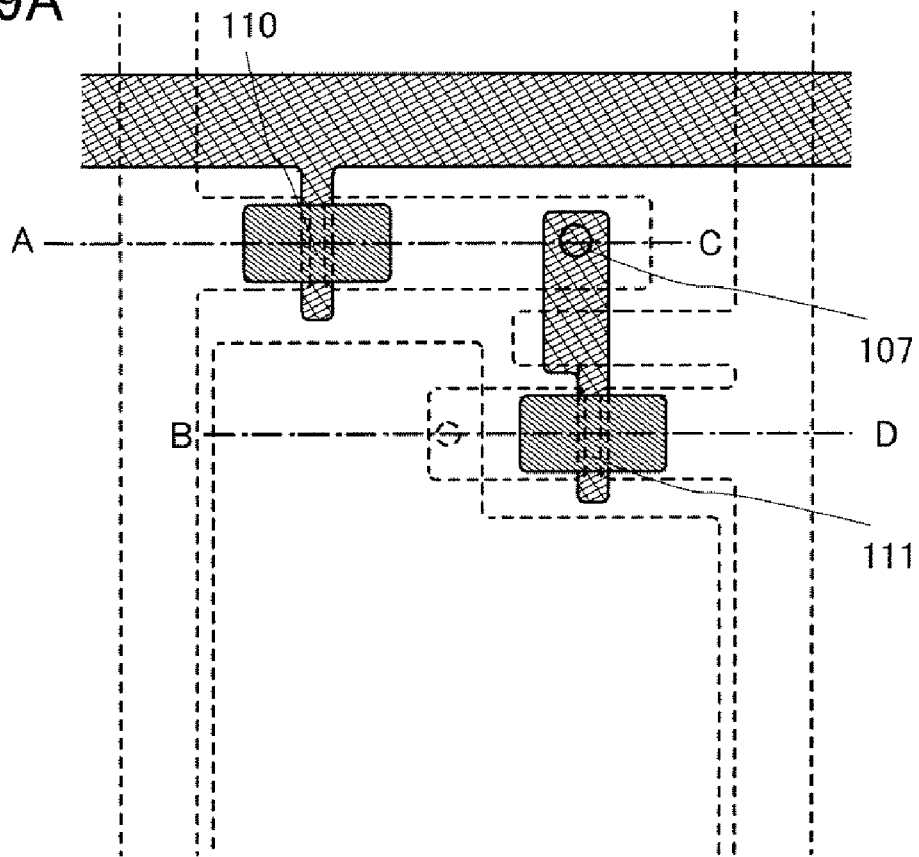
FIGS. 9A to 9C are explanatory views of a method for manufacturing a display device of the present invention.
Figure 9B:
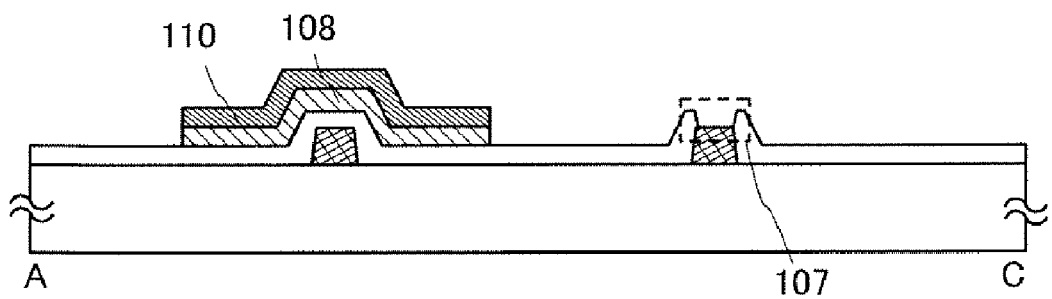
Figure 9C:
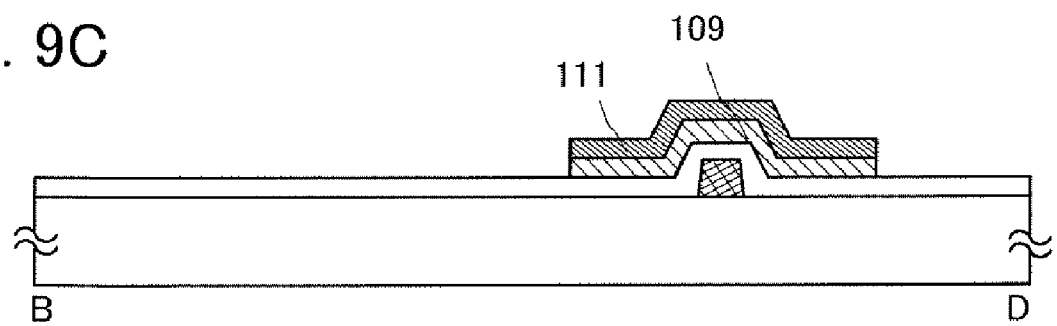

An opening 107 reaching the gate electrode layer 104 is formed in the gate insulating layer 105 (FIGS. 9A and 9B). The opening 107 may be formed before formation of the semiconductor layers 108 and 109 and the semiconductor layers 110 and 111 having one conductivity type. In this embodiment mode, a tube is arranged to be in contact with the gate insulating layer 105 in an opening formation region. An etching gas is discharged (jetted) to the gate insulating layer 105 through the tube. The gate insulating layer 105 is selectively removed by the discharged (jetted) etching gas, so that the opening 107 is formed in the gate insulating layer 105. Accordingly, the gate insulating layer 105 provided with the opening is formed over the gate electrode layer 104, and the gate electrode layer 104 below the gate insulating layer 105 is exposed at a bottom of the opening. In the subsequent step, a source or drain electrode layer is formed in the opening 107 so as to be in contact with an exposed part of the gate electrode layer 104, and the gate electrode layer and the source or drain electrode layer are electrically connected to each other in the opening 107 provided in the gate insulating layer 105.

Alternatively, the tube is arranged to be partially embedded in the insulating layer, and a first opening is formed in the insulating layer by physical force. After that, the insulating layer is selectively removed by discharging an etching gas from the tube, so that a second opening can be formed. An etching gas may be discharged from the tube in advance to form the first opening, and the second opening may be formed by sticking the tube into the insulating layer. Alternatively, an etching gas is discharged, and the tube may be stuck into the insulating layer to form the opening at the same time.

A treatment agent (etching gas or etchant) discharged from the tube can be appropriately selected depending on a thin film that is etched as long as the tube can resist the treatment agent. For example, when a multilayer wiring including stacked layers is formed, the present invention can be used in forming a continuous opening in multiple different thin films that are stacked.

After the opening is formed in the insulating layer by the tube of the present invention, a material for forming a film (such as a conductive composition) in a liquid state is discharged to the opening from the tube, so that a conductive layer may be formed. With a minute opening, it may be difficult to fill the opening assuredly with a liquid material for forming a film by the surface tension; however, in the present invention, the opening is assuredly filled with a material for forming a film by the tube stuck into the opening, and thus, a film can be formed without a defective shape.

A shape of the opening reflects shapes of the tube and a discharging outlet for discharging an etching substance; therefore, the shape of the tube may be selected so that a desired shape of the opening can be obtained. The tube may have a columnar shape (prism, cylinder, or triangular prism) or a needle shape. The depth of the opening can be determined by force at a time when the tube is provided and intensity of the conductive layer over which the tube is placed. In addition, the depth in a thickness direction can also be determined by setting etching conditions such as etching time. When a needle-shaped tube whose end has a sharp point is provided so as to be partially embedded in the conductive layer, an opening with a recessed portion in the conductive layer can be formed. After formation of the opening, the conductive layer that is exposed at the bottom of the opening may be removed by etching using the insulating layer provided with the opening as a mask.

In the present invention, the tube is arranged to be in contact with the insulating layer in the opening formation region. Accordingly, since the opening formation region of the insulating layer can be physically provided, the opening can be assuredly formed in a desired position. Accordingly, a semiconductor device and a display device can be manufactured with high yield by the present invention.

In accordance with the present invention, the opening can be selectively formed in the thin film without using a photolithography step; therefore, the number of steps and materials can be reduced.

Figure 30:
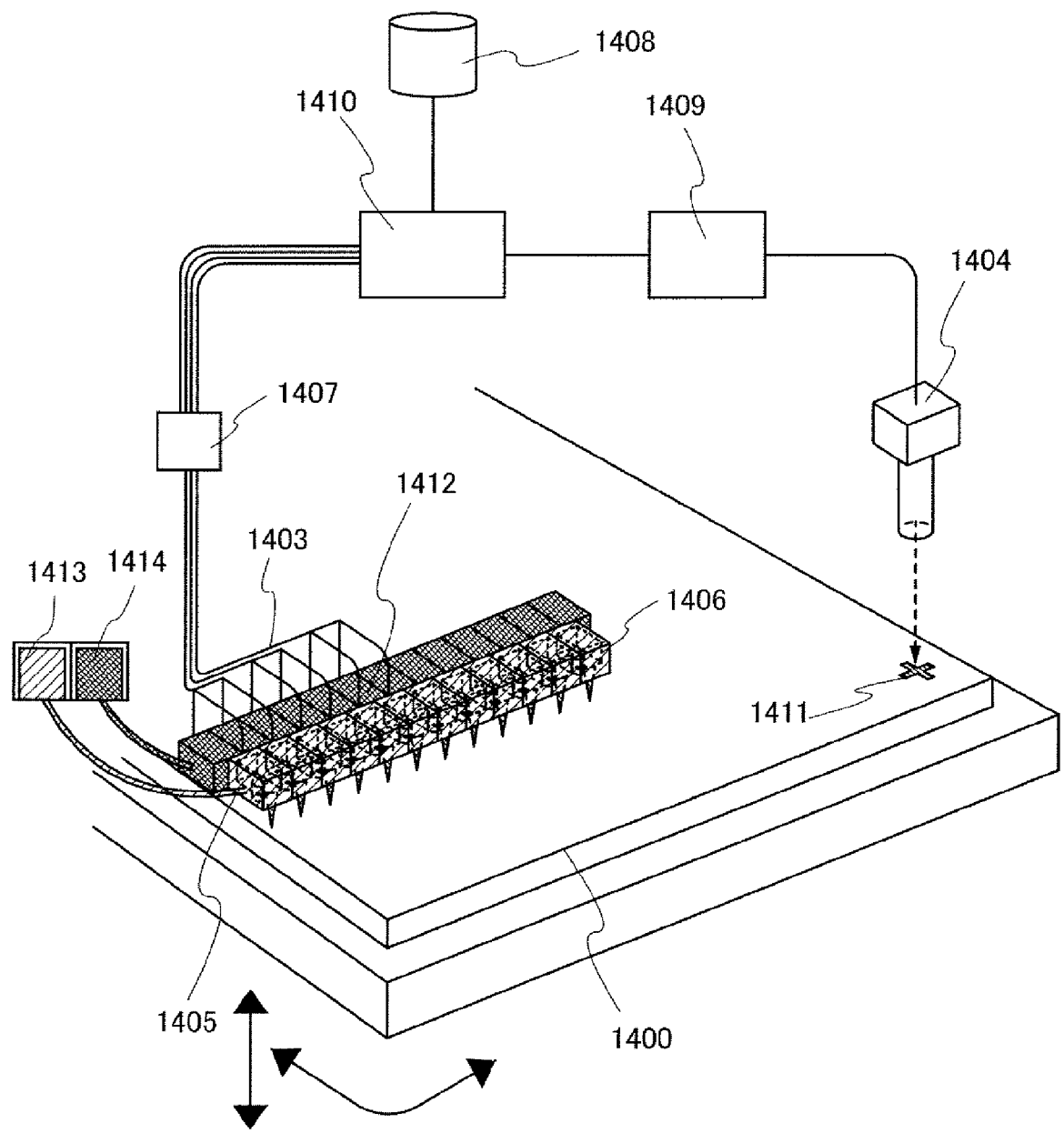
FIG. 30 is an explanatory schematic view of an etching apparatus which can be applied to the present invention.

One mode of a discharge-suction device including the tube is shown in FIG. 30. Heads 1405 and 1412 of a discharge-suction unit 1403 are individually connected to a control unit 1407 and controlled by a computer 1410, whereby materials to be discharged can be transferred to a pattern that is programmed in advance. The position for transfer may be determined, for example, based on a marker 1411 formed on a substrate 1400. Alternatively, a reference point may be determined based on an edge of the substrate 1400. The reference point is detected by an imaging unit 1404, and the detected information is converted into a digital signal by an image processing unit 1409. The digital signal is recognized by the computer 1410 to generate a control signal, and the control signal is transmitted to the control unit 1407. As the imaging unit 1404, an image sensor using a charge coupled device (CCD) or a complementary metal oxide semiconductor, or the like can be used. Of course, information on an opening pattern to be formed over the substrate 1400 is stored in a storage medium 1408, and the control signal is transmitted to the control unit 1407 based on this information. Then, the heads 1405 and 1412 of the discharge-suction unit 1403 can be individually controlled. Materials to be discharged (an etching gas, an etchant, a conductive material, and an insulating material) are supplied from material supply sources 1413 and 1414 to the heads 1405 and 1412 respectively through pipes. The heads 1405 and 1412 are provided with a plurality of tubes, and an opening can be formed in the object to be treated using a treatment agent (etching gas or etchant) discharged from the tube. Further, the etchant or the like can be sucked through the tube, and a material is discharged to the opening, so that a film can be formed.

In the head 1405, a space that is filled with a liquid material as shown by a dot line 1406 and a nozzle serving as a discharging outlet are provided. Although not shown, the head 1412 has the similar inside structure to that of the head 1405. When the nozzle of the head 1405 and a nozzle of the head 1412 are different in size from each other, different regions can be processed with difference widths at the same time. In a case where a wide region is processed, the same material is discharged from a plurality of tubes at the same time in order to improve the throughput, so that a film to be treated can be processed. In a case where a large-sized substrate is used, the head 1405 and the head 1412 freely scan the substrate in arrow directions, so that a region to be processed can be provided freely, and a plurality of the same patterns can be processed over one substrate.

Next, source or drain electrode layers 116, 117, 118, and 119 are formed. For the source or drain electrode layers 116, 117, 118, and 119, an element selected from Ag (silver), Au (gold), Cu (copper), W (tungsten), Al (aluminum), Mo (molybdenum), Ta (tantalum), and Ti (titanium), an alloy material or a compound material containing the above element as its main component, or the like can be used. Further, indium tin oxide (ITO), indium tin oxide containing silicon oxide (ITSO), organic indium, organic tin, zinc oxide, titanium nitride, or the like, having a light-transmitting property may be combined.

The source or drain electrode layers 116, 117, 118, and 119 can be formed by forming a film by a sputtering method, a PVD (Physical Vapor Deposition) method, a CVD (Chemical Vapor Deposition) method such as a low-pressure CVD (LPCVD) method or a plasma CVD method, or the like and processing the film using a mask layer. Further, a method by which a component can be transferred or drawn to be a desired pattern, such as various printing methods (a method for forming a component to be a desired pattern, e.g., screen (mimeograph) printing, offset (planograph) printing, relief printing, or gravure (intaglio) printing), a droplet discharging method, a dispenser method, a selective-coating method, or the like can also be used.

A conductive film may be processed by dry etching or wet etching. By using an ICP (Inductively Coupled Plasma) etching method and adjusting etching conditions (e.g., the amount of power applied to a coiled electrode, the amount of power applied to an electrode on a substrate side, the electrode temperature on the substrate side, or the like) as appropriate, each electrode layer can be etched into a tapered shape. It is to be noted that as an etching gas, a chlorine-based gas such as $Cl_2$, $BCl_3$, $SiCl_4$, or $CCl_4$, a fluorine-based gas such as $CF_4$, $SF_6$, or $NF_3$, or $O_2$ can be used as appropriate.

The source electrode layer or the drain electrode layer may also be formed as follows: a conductive film that is a light-absorbing film is formed on a transposing substrate, and transposed to a transposed substrate selectively by a laser beam and processed into a desired shape.

The source or drain electrode layer 116 also functions as a source wiring layer, and the source or drain electrode layer 118 also functions as a power source line.

The source or drain electrode layer 117 and the gate electrode layer 104 are electrically connected to each other in the opening 107 that is formed in the gate insulating layer 105. The source or drain electrode layer 118 is partially included in a capacitor element. After the source or drain electrodes 116, 117, 118, and 119 are formed, the semiconductor layers 108 and 109 and the semiconductor layers 110 and 111 having one conductivity type are processed into a desired shape. In this embodiment mode, the semiconductor layers 108 and 109 and the semiconductor layers 110 and 111 having one conductivity type are processed by etching using the source or drain electrodes 116, 117, 118, and 119 as masks, so that semiconductor layers 114 and 115 and semiconductor layers 120*a*, 120*b*, 121*a*, and 121*b* having one conductivity type are formed.

Figure 10A:
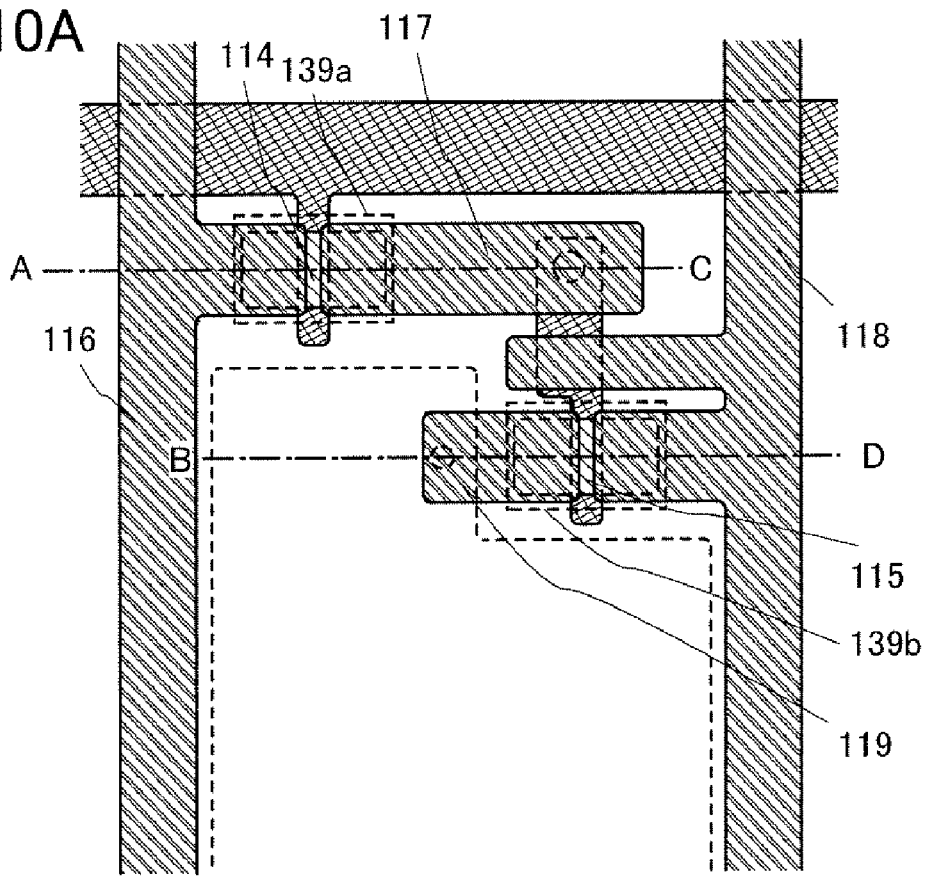
FIGS. 10A to 10C are explanatory views of a method for manufacturing a display device of the present invention.
Figure 10B:
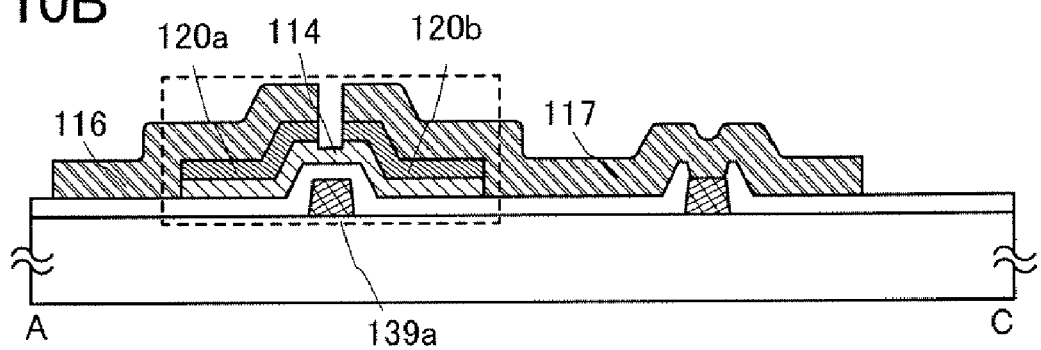
Figure 10C:
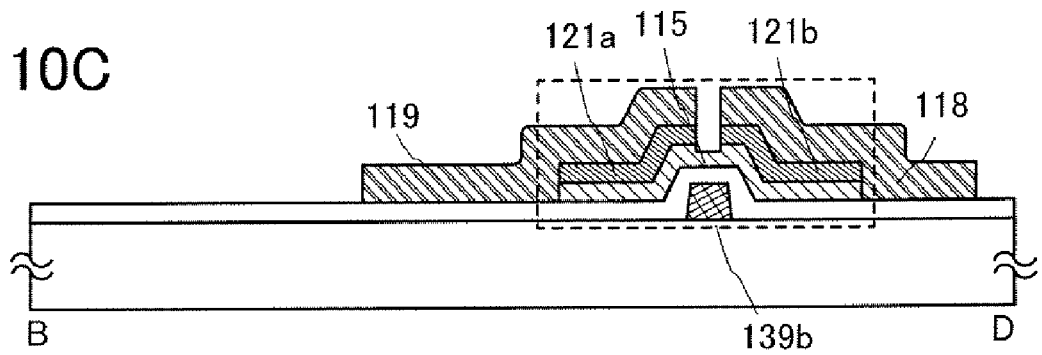

Through the above-described process, transistors 139*a* and 139*b* that are inversely staggered thin film transistors are manufactured (FIGS. 10A to 10C).

An insulating layer 123 is formed over the gate insulating layer 105 and the transistors 139*a* and 139*b*, and an insulating layer 127 is formed thereover.

The insulating layer 123 can be formed by a sputtering method, a PVD (Physical Vapor Deposition) method, a CVD (Chemical Vapor Deposition) method such as a low-pressure CVD (LPCVD) method or a plasma CVD method, or the like. Further, a droplet discharging method, various printing methods (a method for forming a pattern, such as screen printing or offset printing), a coating method such as a spin-coating method, a dipping method, a dispenser method, or the like may also be used.

The insulating layer 123 and the insulating layer 127 can be formed of a material selected from silicon oxide, silicon nitride, silicon oxynitride, aluminum oxide, aluminum nitride, aluminum oxynitride, diamond-like carbon (DLC), nitrogen-containing carbon (CN), polysilazane, and other substances containing an inorganic insulating material. Further, a material containing siloxane may be used. Further alternatively, an organic insulating material such as polyimide, acrylic, polyamide, polyimide amide, resist, or benzocyclobutene can be used. Further alternatively, an oxazole resin can be used, and for example, photo-curable polybenzoxazole or the like can be used.

Figure 11A:
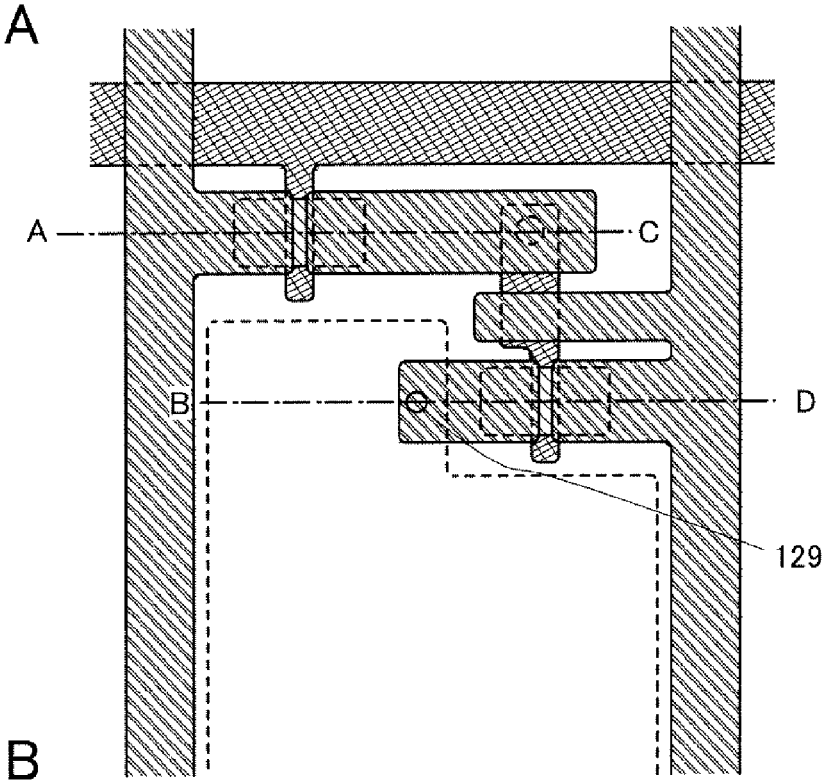
FIGS. 11A to 11D are explanatory views of a method for manufacturing a display device of the present invention.
Figure 11B:
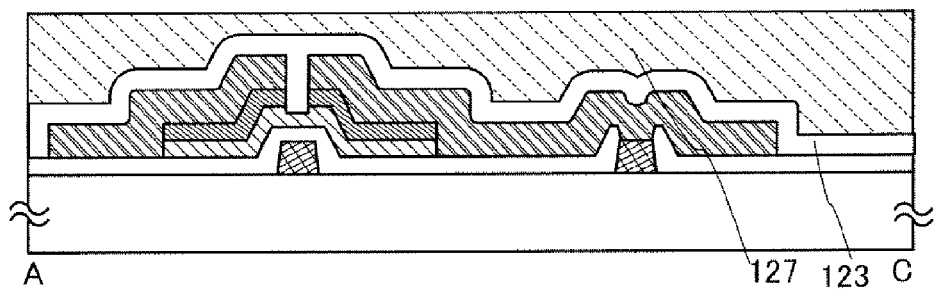
Figure 11C:
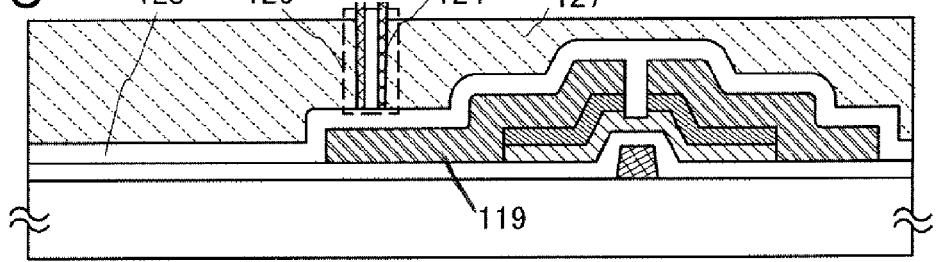
Figure 11D:
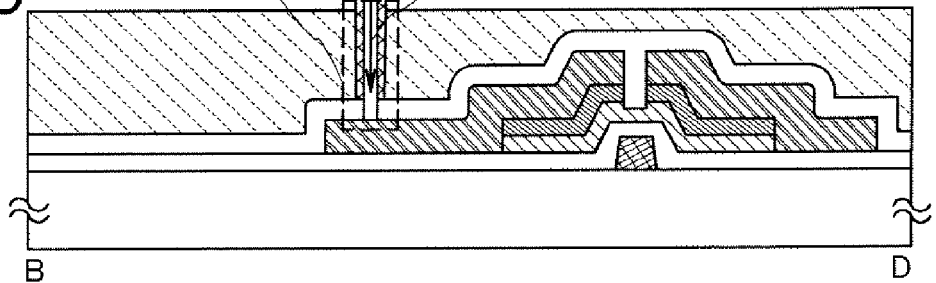

In this embodiment mode, as shown in Embodiment Modes 1 and 2, a contact hole (opening) that reaches the source or drain electrode layer 119 is formed in the insulating layers 123 and 127 using a tube (FIGS. 11A to 11C).

As shown in FIG. 11C, a tube 124 is arranged so as to be embedded in the insulating layer 127, and a first opening 125 is formed in the insulating layer 127 by physical force. After that, an etching gas 128 is jetted from the tube 124 to remove the insulating layer 123 selectively, so that a second opening 129 is formed as shown in FIG. 11C. Accordingly, the contact hole (opening) reaching the source or drain electrode layer 119 can be formed in the insulating layers 123 and 127.

A shape of the opening reflects shapes of the tube and a discharging outlet for discharging an etching substance; therefore, the shape of the tube may be selected so that a desired shape of the opening can be obtained. The tube may have a columnar shape (prism, cylinder, or triangular prism) or a needle shape. The depth of the opening can be determined by force at a time when the tube is provided and intensity of the film on which the tube is placed. In addition, the depth in a thickness direction can also be determined by setting etching conditions such as etching time. When a needle-shaped tube whose end has a sharp point is provided so as to be partially embedded in the conductive layer, an opening with a recessed portion in the conductive layer can be formed. After formation of the opening, an exposed part of the conductive layer at the bottom of the opening may be removed by etching, using the insulating layer provided with the opening as a mask.

In the present invention, the tube is arranged to be in contact with the insulating layer in the opening formation region. Accordingly, since the opening formation region of the insulating layer can be physically provided, the opening can be assuredly formed in a desired position. Accordingly, a semiconductor device and a display device can be manufactured with high yield by the present invention.

In accordance with the present invention, the opening can be selectively formed in the thin film without using a photolithography step; therefore, the number of steps and materials can be reduced.

Figure 12A:
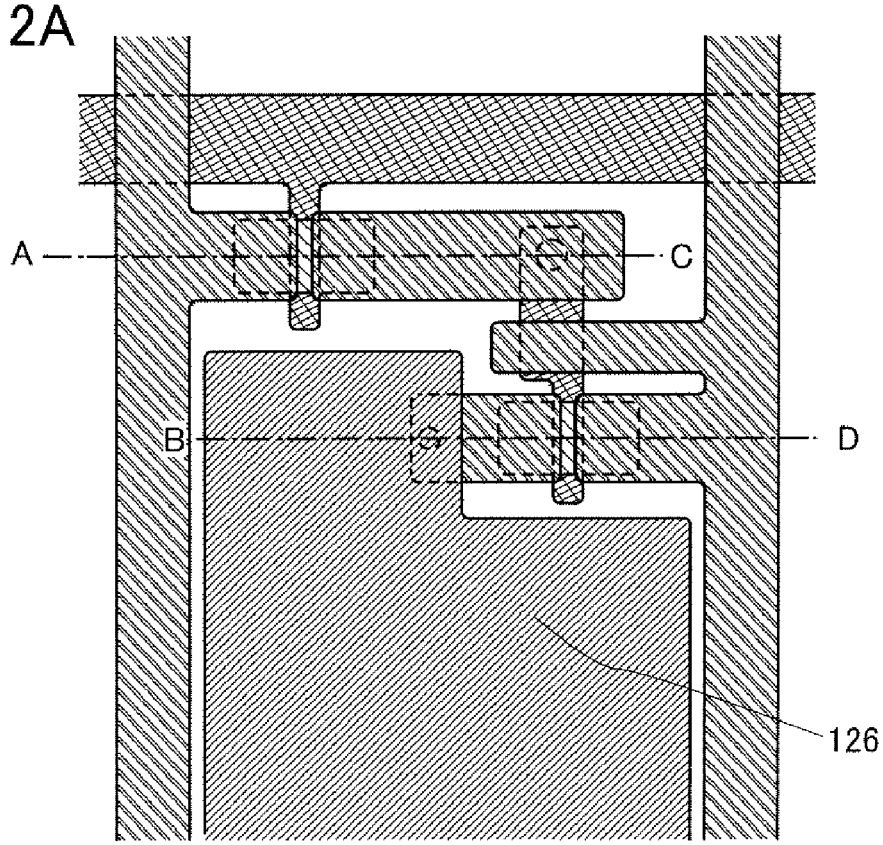
FIGS. 12A to 12C are explanatory views of a method for manufacturing a display device of the present invention.
Figure 12B:
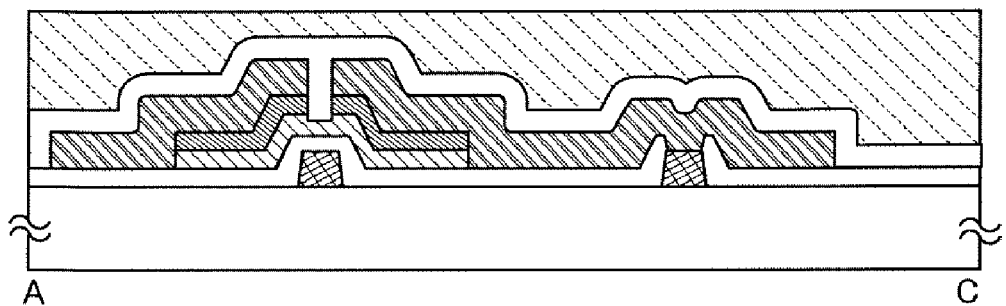
Figure 12C:
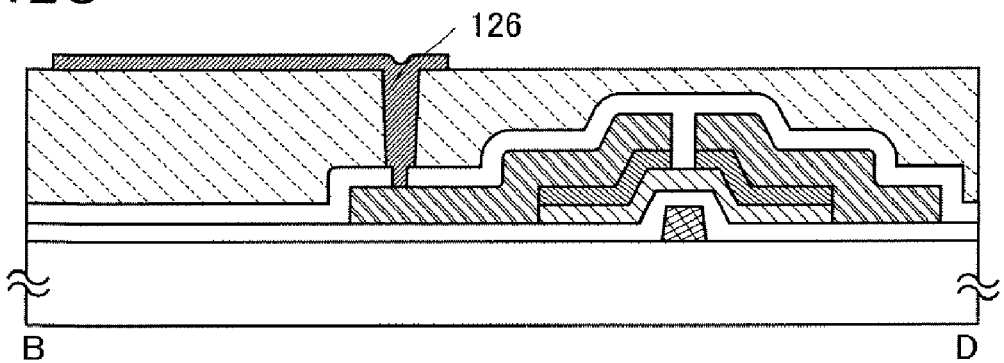
Figure 13A:
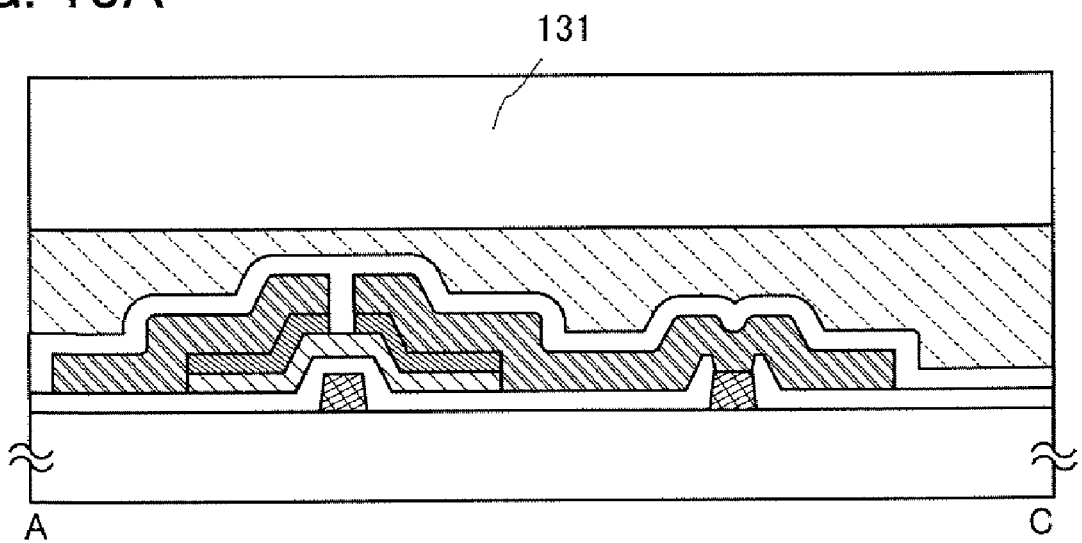
FIGS. 13A and 13B are explanatory views of a method for manufacturing a display device of the present invention.
Figure 13B:
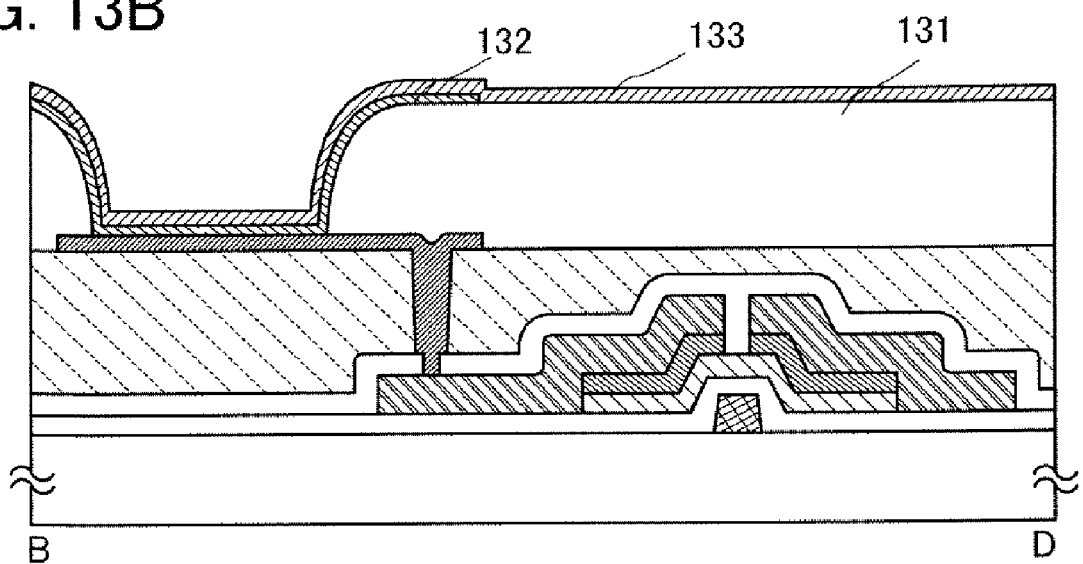

A first electrode layer 126 of a light-emitting element, which functions as a pixel electrode, is formed in the opening 129 where the source or drain electrode layer 119 is exposed, whereby the source or drain electrode layer 119 and the first electrode layer 126 can be electrically connected to each other (FIGS. 12A to 12C).

After the opening 129 is formed in the insulating layers 123 and 127 by the tube of the present invention, a material for forming a film (such as a conductive composition) in a liquid state is discharged to the opening from the tube 124, so that the first electrode layer 126 may be formed. With a minute opening, it may be difficult to fill the opening assuredly with a liquid material for forming a film by the surface tension; however, in the present invention, the opening can be assuredly filled with a material for forming a film by the tube stuck into the opening, and thus, a film can be formed without a defective shape.

The first electrode layer 126 may also be formed as follows, as described in Embodiment Mode 3: a conductive light-absorbing film is formed on a transposing substrate and irradiated with a laser beam, to be formed selectively over a transposed substrate and processed into a desired shape.

In this embodiment mode, the first electrode layer is formed by forming a conductive film and processing it into a desired shape using a mask layer.

The first electrode layer 126 can be formed by a sputtering method, a PVD (Physical Vapor Deposition) method, a CVD (Chemical Vapor Deposition) method such as a low-pressure CVD (LPCVD) method or a plasma CVD method, or the like. As a conductive material to form the first electrode layer 126, indium tin oxide (ITO), indium tin oxide containing silicon oxide (ITSO), zinc oxide (ZnO), or the like can be used. Preferably, indium tin oxide containing silicon oxide is formed by a sputtering method using a target in which silicon oxide is contained at 2 to 10 wt % in ITO. Instead, a conductive material in which ZnO is doped with gallium (Ga) or indium zinc oxide (IZO) which is an oxide conductive material containing silicon oxide, formed using a target in which indium oxide is mixed with zinc oxide (ZnO) at 2 to 20 wt % may be used.

As a mask layer, a resin material such as an epoxy resin, a phenol resin, a novolac resin, an acrylic resin, a melamine resin, a urethane resin, or the like is used. Further, the mask layer may be formed by a droplet discharging method using an organic material such as benzocyclobutene, parylene, fluorinated arylene ether, or polyimide having a light-transmitting property; a compound material formed by polymerization of a siloxane-based polymer or the like; a composition material containing water-soluble homopolymer and water-soluble copolymer; or the like. Alternatively, a commercial resist material containing photosensitizer may be used. For example, a positive type resist or a negative type resist may be used. In using any material, the surface tension and the viscosity are appropriately controlled by controlling the concentration of a solvent or by adding a surfactant or the like.

The first electrode layer 126 may be processed by dry etching or wet etching. By using an ICP (Inductively Coupled Plasma) etching method and appropriately controlling etching conditions (e.g., the amount of power applied to a coiled electrode, the amount of power applied to an electrode on a substrate side, or the electrode temperature on the substrate side), the electrode layer can be etched into a tapered shape. It is to be noted that as an etching gas, a chlorine-based gas such as $Cl_2$, $BCl_3$, $SiCl_4$, or $CCl_4$, a fluorine-based gas such as $CF_4$, $SF_6$, or $NF_3$, or $O_2$ can be used as appropriate.

The first electrode layer 126 may be cleaned and polished by a CMP method or using a polyvinyl-alcohol-based porous body to planarize the surface thereof. Further, after being polished using a CMP method, the surface of the first electrode layer 126 may be subjected to ultraviolet light irradiation, oxygen plasma treatment, or the like.

Through the above-described process, a TFT substrate for a display panel in which a bottom-gate TFT and the first electrode layer 126 are connected is completed over the substrate 100. The TFT in this embodiment mode is inversely staggered type.

Next, an insulating layer 131 (also called a partition wall) is selectively formed. The insulating layer 131 is formed to have an opening over the first electrode layer 126. In this embodiment mode, the insulating layer 131 is formed over the entire surface and patterned by etching using a mask of a resist or the like. When the insulating layer 131 is formed by a droplet discharging method, a printing method, a dispenser method, or the like by which the pattern can be formed directly and selectively, patterning by etching is not necessarily carried out.

The insulating layer 131 can be formed using an inorganic insulating material such as silicon oxide, silicon nitride, silicon oxynitride, aluminum oxide, aluminum nitride, or aluminum oxynitride; an acrylic acid, a methacrylic acid, or a derivative thereof; a heat-resistant high-molecular material such as polyimide, aromatic polyamide, or polybenzimidazole; an insulating material of inorganic siloxane which includes a Si—O—Si bond among compounds formed using a siloxane-based material as a starting material and which include silicon, oxygen, and hydrogen; or an insulating material of organic siloxane of which hydrogen bonded to silicon is substituted by an organic group such as methyl or phenyl. A photosensitive or nonphotosensitive material such as acrylic or polyimide may also be used. The insulating layer 131 is preferably formed to have a continuously-changing radius of curvature, so that the coverage by an electroluminescent layer 132 and a second electrode layer 133 which are formed over the insulating layer 131 is improved.

Further, after the insulating layer 131 is formed by discharging a composition by a droplet discharging method, a surface thereof may be planarized by pressing with pressure to enhance a level of the planarity. As a pressing method, recessions and projections of the surface may be reduced by scanning the surface with a roller or the like or by pressing the surface perpendicularly with a flat plate-shaped object. Alternatively, recessions and projections of the surface may be removed with an air knife after the surface is softened or melted with a solvent or the like. Further, a CMP method may also be used for polishing the surface. This step can be employed in planarizing the surface when the surface becomes uneven by a droplet discharging method. When a level of planarity is enhanced by this step, display irregularity of the display panel or the like can be prevented, and thus, a high precision image can be displayed.

A light-emitting element is formed over the substrate 100 which is the TFT substrate for the display panel (FIGS. 13A and 13B).

Before the electroluminescent layer 132 is formed, heat treatment is performed at 200° C. in the atmospheric pressure to remove moisture in the first electrode layer 126 and the insulating layer 131 and moisture adsorbed on their surfaces. Further, it is preferable to perform the heat treatment at 200° C. to 400° C., more preferably 250° C. to 350° C., under low pressure and to form the electroluminescent layer 132 successively without exposing the substrate to the air by a vacuum evaporation method or a droplet discharging method under low pressure.

As the electroluminescent layer 132, materials exhibiting light of red (R), green (G), and blue (B) are selectively formed by an evaporation method using an evaporation mask, or the like. The materials exhibiting light of red (R), green (G), and blue (B) can also be formed by a droplet discharging method (by using a low-molecular material, a high-molecular material, or the like similarly to a color filter, and in this case, materials for R, G, and B can be selectively deposited without using a mask, which is preferable. The second electrode layer 133 is stacked over the electroluminescent layer 132, so that a display device having a display function using a light-emitting element is completed.

Although not shown in the drawing, it is effective to provide a passivation film to cover the second electrode layer 133. The passivation (protection) film provided in manufacturing a display device may employ a single-layer structure or a multilayer structure. The passivation film can be formed of a single layer or a stacked layer of an insulating film containing silicon nitride (SiN), silicon oxide ($SiO_2$), silicon oxynitride (SiON), silicon nitride oxide (SiNO), aluminum nitride (AlN), aluminum oxynitride (AlON), aluminum nitride oxide having a higher content of nitrogen than that of oxygen (AlNO), aluminum oxide, diamond-like carbon (DLC), or carbon-containing nitrogen (CNx), For example, a stacked layer of carbon-containing nitrogen (CNx) or silicon nitride (SiN), or an organic material can also be used, and a stacked layer of a high-molecular material such as styrene polymer may also be used. Alternatively, a siloxane material may be used.

At this time, it is preferable to use a film with which favorable coverage is provided as the passivation film, and it is effective to use a carbon film, particularly a DLC film as the passivation film. A DLC film, which can be formed in the temperature range from room temperature to less than or equal to 100° C., can be formed easily even over an electroluminescent layer having a low heat resistance. A DLC film can be formed by a plasma CVD method (typically, an RF plasma CVD method, a microwave CVD method, an electron cyclotron resonance (ECR) CVD method, a heat filament CVD method, or the like), a combustion method, a sputtering method, an ion beam evaporation method, a laser evaporation method, or the like. As a reaction gas for deposition, a hydrogen gas and a hydrocarbon-based gas (e.g., $CH_4$, $C_2H_2$, or $C_6H_6$) are used and ionized by glow discharge, and the ions are accelerated to impact against a cathode to which negative self-bias voltage is applied. Further, a CN film may be formed using a $C_2H_4$ gas and a $N_2$ gas as reaction gases. A DLC film, which has high blocking effect against oxygen, can suppress oxidization of the electroluminescent layer. Accordingly, a problem such as oxidation of the electroluminescent layer during a subsequent sealing step can be prevented.

A sealing member is formed, and sealing with a sealing substrate is performed. After that, a flexible wiring board may be connected to a gate wiring layer which is formed to be electrically connected to the gate electrode layer 103, so that electrical connection to an external portion may be obtained. This is also applied to a source wiring layer which is formed to be electrically connected to the source or drain electrode layer 116 which is also a source wiring layer.

A space between the substrate 100 provided with the element and the sealing substrate is filled with a filler and sealing therebetween is performed. A dripping method can be used for disposing the filler. Instead of the filler, an inert gas such as nitrogen may be used for filling the space. Further, by providing a drying agent in the display device, deterioration due to moisture in the light-emitting element can be prevented. The drying agent may be provided either on the sealing substrate side or the substrate 100 side provided with the element, and may be provided by forming a recession portion in a region where the sealing member is formed in the substrate. Further, by providing the drying agent in a portion corresponding to a region which does not contribute to display, such as a driver circuit region or a wiring region of the sealing substrate, an aperture ratio is not decreased even if the drying agent is an opaque substance. The filler may contain a hygroscopic material to have a function as a drying agent. Through the above-described process, a display device having a display function using a light-emitting element is completed.

Although the case where a switching TFT has a single gate structure is described in this embodiment mode, the switching TFT may employ a multi-gate structure such as a double-gate structure. Further, when the semiconductor layer is formed of an SAS or a crystalline semiconductor, an impurity region can be formed by adding an impurity imparting one conductivity type. In this case, the semiconductor layer may have impurity regions with different concentrations. For example, a low-concentration impurity region may be formed around a channel region overlapping with the gate electrode layer, and a high-concentration impurity region may be formed in a region outside the low-concentration region.

This embodiment mode can be appropriately combined with any of Embodiment Modes 1 to 3.

In accordance with this embodiment mode, the contact hole can be formed in the insulating layer without forming a mask; therefore, the process can be simplified. Further, it is not necessary to perform light-exposure and development after application of a photoresist or the like, so that the cost of materials required for processing can be reduced. Furthermore, the contact hole can be assuredly formed, whereby the manufacturing yield can be improved.

Embodiment Mode 5

This embodiment mode will describe an example of a display device that is manufactured through a more simplified process at low cost. More specifically, a light-emitting display device using a light-emitting element as a display element will be described. A method for manufacturing a display device in this embodiment mode will be described in detail with reference to FIGS. 15A and 15B.

As a base film, a base film 151a is formed using a silicon nitride oxide film with a thickness of 10 nm to 200 nm (preferably 50 nm to 150 nm) over a substrate 150 having an insulating surface, and a base film 151b is formed thereover using a silicon oxynitride film with a thickness of 50 nm to 200 nm (Preferably 100 nm to 150 nm), by a sputtering method, a PVD (Physical Vapor Deposition) method, a CVD (Chemical Vapor Deposition) method such as a low-pressure CVD (LPCVD) method or a plasma CVD method, or the like. Alternatively, an acrylic acid, a methacrylic acid, or a derivative thereof; a heat-resistant high molecular compound such as polyimide, aromatic polyamide, or polybenzimidazole; or a siloxane resin may be used. Alternatively, a resin material such as a vinyl resin like polyvinyl alcohol or polyvinylbutyral, an epoxy resin, a phenol resin, a novolac resin, an acrylic resin, a melamine resin, or a urethane resin may be used. Further, an organic material such as benzocyclobutene, parylene, fluorinated arylene ether, or polyimide, a composition material containing a water-soluble homopolymer and a water-soluble copolymer, or the like may be used. Moreover, an oxazole resin can be used, and for example, a photo-curing polybenzoxazole or the like can be used.

A droplet discharging method, a printing method (a method for forming a pattern such as screen printing or offset printing), a coating method such as a spin coating method, a dipping method, a dispenser method, or the like can also be used. In this embodiment mode, the base film 151a and the base film 151b are formed by a plasma CVD method. As the substrate 150, a glass substrate, a quartz substrate, a silicon substrate, a metal substrate, or a stainless steel substrate provided with an insulating film on the surface may be used. In addition, a plastic substrate having heat resistance sufficient to withstand processing temperature of this embodiment mode may be used, or a flexible film-like substrate may be used. As the plastic substrate, a substrate made of PET (polyethylene terephthalate), PEN (polyethylenenaphthalate), or PES (polyethersulfone) can be used, and as the flexible substrate, a substrate made of a synthetic resin such as acrylic can be used. Since the display device manufactured in this embodiment mode has a structure in which light from a light-emitting element is extracted through the substrate 150, the substrate 150 needs to have a light-transmitting property.

The base film can be formed using silicon oxide, silicon nitride, silicon oxynitride, silicon nitride oxide, or the like and may have either a single-layer structure or a stacked structure of two or more layers.

Next, a semiconductor film is formed over the base film. The semiconductor film may be formed with a thickness of 25 nm to 200 nm (preferably, 30 nm to 150 nm) by any of various methods (such as a sputtering method, an LPCVD method, or a plasma CVD method). In this embodiment mode, it is preferable to use a crystalline semiconductor film which is obtained by crystallizing an amorphous semiconductor film with a laser beam.

The semiconductor film obtained in this manner may be doped with a slight amount of an impurity element (boron or phosphorus) to control a threshold voltage of a thin film transistor. This doping with an impurity element may be performed to the amorphous semiconductor film before the crystallization step. When the doping with an impurity element is performed to the amorphous semiconductor film, activation of the impurity element can be performed by subsequent heat treatment for crystallization. In addition, defects and the like caused by doping can be improved.

Next, the crystalline semiconductor film is etched into a desired shape to form a semiconductor layer.

The etching may be performed by either plasma etching (dry etching) or wet etching; however, plasma etching is suitable for treating a large-sized substrate. As an etching gas, a fluorine-based gas such as $CF_4$ or $NF_3$ or a chlorine-based gas such as $Cl_2$ or $BCl_3$ is used, to which an inert gas such as He or Ar may be appropriately added. Alternatively, electric discharge machining can be performed locally when the etching is performed using atmospheric pressure discharge. In such a case, a mask layer does not need to be formed over the entire surface of the substrate.

In the present invention, a conductive layer forming a wiring layer or an electrode layer, a mask layer used for forming a predetermined pattern, or the like may be formed by a method capable of selectively forming a pattern, such as a droplet discharging method. A droplet discharging (ejecting) method (also referred to as an ink-jet method depending on its system) can form a predetermined pattern (of a conductive layer or an insulating layer) by selectively discharging (ejecting) droplets of a composition mixed for a specific purpose. In this case, treatment for controlling wettability or adhesiveness may be performed to a subject region. Alternatively, a method by which a pattern can be transferred or drawn, such as a printing method (a method for forming a pattern such as screen printing or offset printing) or a dispenser method can also be used.

A gate insulating layer is formed to cover the semiconductor layer. The gate insulating layer is formed using an insulating film containing silicon with a thickness of 10 nm to 150 nm by a plasma CVD method, a sputtering method, or the like. The gate insulating layer may be formed using a known material such as an oxide material or nitride material of silicon typified by silicon nitride, silicon oxide, silicon oxynitride, or silicon nitride oxide, and it may have either a single-layer structure or a stacked structure. For example, the gate insulating layer may be formed to have a three-layer structure of a silicon nitride film, a silicon oxide film, and a silicon nitride film and a single layer of a silicon oxynitride film may be used.

Next, a gate electrode layer is formed over the gate insulating layer. The gate electrode layer can be formed by a sputtering method, an evaporation method, a CVD method, or the like. The gate electrode layer may be formed using an element such as tantalum (Ta), tungsten (W), titanium (Ti), molybdenum (Mo), aluminum (Al), copper, (Cu), chromium (Cr), or neodymium (Nd), or an alloy material or a compound material containing the above element as its main component. Alternatively, the gate electrode layer may be formed using a semiconductor film typified by a polycrystalline silicon film doped with an impurity element such as phosphorus, or an AgPdCu alloy. The gate electrode layer may be a single layer or stacked layers.

Although the gate electrode layer is formed into a tapered shape in this embodiment mode, the present invention is not limited thereto. The gate electrode layer may have a stacked structure in which only one layer has a tapered shape and the other layer has a perpendicular side surface by anisotropic etching. As in this embodiment mode, the gate electrode layers that are stacked may have different taper angles, or the same taper angle. When the gate electrode layer has a tapered shape, the coverage thereof by a film to be stacked thereover is improved, and defects can be reduced. Accordingly, reliability is improved.

Through the etching step in forming the gate electrode layer, the gate insulating layer may be etched to a certain extent and the thickness thereof may be reduced (so-called film reduction).

An impurity element is added to the semiconductor layer to form an impurity region. The impurity region can be formed to be a high-concentration impurity region and a low-concentration impurity region by controlling the concentration thereof. A thin film transistor having a low-concentration impurity region is referred to as a TFT having an LDD (Lightly Doped Drain) structure. The low-concentration impurity region can be formed to overlap with the gate electrode, and such a thin film transistor is referred to as a TFT having a GOLD (Gate Overlapped LDD) structure. As for the polarity, the thin film transistor is formed to have n-type polarity by using phosphorus (P) or the like for the impurity region. In the case of p-type polarity, boron (B) or the like may be added.

In this embodiment mode, a region where the impurity region overlaps with the gate electrode layer with the gate insulating layer interposed therebetween is referred to as a Lov region, and a region where the impurity region does not overlap with the gate electrode layer with the gate insulating layer interposed therebetween is referred to as a Loff region. In FIG. 15B, the impurity regions are indicated by hatching and white, which does not mean that an impurity element is not added to the white portion. They are indicated in this manner so that it is easily recognized that the concentration distribution of an impurity element in this region reflects a mask or conditions of doping. It is to be noted that this applies to other drawings of this specification.

Heat treatment, intense light irradiation, or laser beam irradiation may be performed to activate the impurity element. At the same time as the activation, plasma damage to the gate insulating layer and the interface between the gate insulating layer and the semiconductor layer can be repaired.

Then, a first interlayer insulating layer is formed to cover the gate electrode layer and the gate insulating layer. In this embodiment mode, the first interlayer insulating layer has a stacked structure of an insulating film 167 provided with an opening and an insulating film 168 provided with an opening. The insulating film 167 and the insluting film 168 can be formed using a silicon nitride film, a silicon nitride oxide film, a silicon oxynitride film, a silicon oxide film, or the like by a sputtering method or a plasma CVD method, Or another insulating film containing silicon may be used as a single layer or a stacked structure of three or more layers.

In addition, heat treatment is performed in a nitrogen atmosphere at 300° C. to 550° C. for 1 to 12 hours to hydrogenate the semiconductor layer. Preferably, it is performed at 400° C. to 500° C. This step is a step of terminating dangling bonds of the semiconductor layer with hydrogen which is contained in the insulating film 167 that is the interlayer insulating layer. In this embodiment mode, heat treatment is performed at 410° C.

The insulating film 167 and the insulating film 168 can be formed using a material selected from aluminum nitride (AlN), aluminum oxynitride (AlON), aluminum nitride oxide (AlNO) having a higher content of nitrogen than that of oxygen, aluminum oxide, diamond-like carbon (DLC), nitrogen-containing carbon (CN), polysilazane, and other substances containing an inorganic insulating material. Alternatively, a material containing siloxane may be used. An organic insulating material may also be used, and as an organic material, polyimide, acrylic, polyamide, polyimide amide, a resist, or benzocyclobutene can be used. Moreover, an oxazole resin can be used, and for example, a photo-curing polybenzoxazole or the like can be used.

In this embodiment mode, each of the gate insulating layer 157, the insulating film 167, and the insulating film 168 is formed to have openings which expose source and drain regions of the semiconductor layers using a tube as shown in Embodiment modes 1 and 2. The tube is arranged in an opening formation region of the gate insulating layer 157, the insulating film 167, and the insulating film 168 so as to be in contact with the insulating film 168. A treatment agent (etching gas or etchant) is discharged (jetted) to the insulating layer through the tube. With the discharged (jetted) treatment agent (etching gas or etchant), the gate insulating layer 157, the insulating film 167, and the insulating film 168 are selectively removed, so that an opening is formed in the gate insulating layer 157, the insulating film 167, and the insulating film 168.

Thus, the gate insulating layer 157, the insulating film 167, and the insulating film 168 each of which has openings above the source and drain regions of the semiconductor layers are formed, so that the source and drain regions of the semiconductor layers that are located below the gate insulating layer 157, the insulating film 167, and the insulating film 168 are exposed at the bottom of the openings.

In each of the steps for forming the gate insulating layer 157, the insulating film 167, and the insulating film 168, openings which reach the source and drain regions of the semiconductor layers may be formed using the present invention. Alternatively, openings may be formed in the insulating film 168 that is an upper layer above the source and drain regions of the semiconductor layers, and then, the insulating film 167 and the gate insulating layer 157 may be etched by using the insulating film 168 provided with the openings as a mask, so that openings which reach the source and drain regions of the semiconductor layers may be formed.

Further, after the openings are formed in the insulating layer using the tube of the present invention, a material for forming a film (such as a conductive composition) in a liquid state may be discharged to the openings through the tube, and a conductive layer is formed. With minute openings, it may be difficult to fill the openings assuredly with a liquid material for forming a film by the surface tension; however, in the present invention, the openings are assuredly filled with a material for forming a film by the tubes stuck into the openings, and thus, a film can be formed without a defective shape.

Since the shape of the opening reflects the shapes of the tube and its discharging outlet for discharging an etching substance, the shape of the tube may be selected so that a desired shape of the opening can be obtained. The tube may have a columnar shape (prism, cylinder, or triangular prism) or a needle shape. The depth of the opening can be determined by force at a time when the tube is provided and intensity of the semiconductor layer over which the tube is placed. In addition, the depth in a thickness direction can also be determined by setting etching conditions such as etching time. When a needle-shaped tube whose end has a sharp point is provided so as to be partially embedded in the semiconductor layer, an opening with a recessed portion in the semiconductor layer can be formed. Further, after the opening is formed, an exposed part of the semiconductor layer at the bottom of the opening may be removed by etching, using the insulating layer provided with the opening as a mask.

In the present invention, the tube is arranged to be in contact with the insulating layer in the opening formation region. Therefore, the opening formation region of the insulating layer can be provided physically, so that the opening can be assuredly formed in a desired position. Therefore, a semiconductor device and a display device can be manufactured with high yield by using the present invention.

According to the present invention, the opening can be selectively formed in a thin film without using a photolithography step. Therefore, the number of steps and materials can be reduced.

Next, source and drain electrode layers are formed in the openings where the source and drain regions of the semiconductor layers are exposed, whereby the source and drain regions of the semiconductor layers can be electrically connected to the source and drain electrode layers, respectively.

The source and drain electrode layers can be formed by the steps of depositing a conductive film by a PVD method, a CVD method, an evaporation method, or the like and patterning the film into desired shapes. Further, a droplet discharging method, a printing method, a dispenser method, an electroplating method, or the like can also be used to selectively form conductive layers at predetermined positions. Furthermore, a reflow method or a damascene method can also be used. As a material for forming the source and drain electrode layers, the following can be used: metals such as Ag, Au, Cu, Ni, Pt, Pd, Ir, Rh, W, Al, Ta, Mo, Cd, Zn, Fe, Ti, Si, Ge, Zr, and Ba, or an alloy or nitride of such metals. In addition, a stacked structure of such materials may also be used.

Each of the gate electrode layers, the semiconductor layers, the source electrode layers, and the drain electrode layers which constitute the display device shown in this embodiment mode can also be formed by the method shown in Embodiment Mode 3: a light-absorbing film of a conductive material or a semiconductor material is formed on a transposing substrate and irradiated with a laser beam, to be formed selectively over a transposed substrate and processed into a desired shape. Therefore, a photolithography step is not used and the process can be simplified. Further, since the loss of materials can be prevented, cost reduction can be achieved.

Through the above process, an active matrix substrate can be manufactured, in which a p-channel thin film transistor 285 having a p-type impurity region in a Lov region and an n-channel thin film transistor 275 having an n-type impurity region in a Lov region are formed in a peripheral driver circuit region 204; and an n-channel thin film transistor 265 with a multi-channel structure which has an n-type impurity region in a Loff region and a p-channel thin film transistor 255 having a p-type impurity region in a Lov region are formed in a pixel region 206.

The structures of the thin film transistors are not limited to those shown in this embodiment mode. For example, any of the following structures may be used: a single-gate structure in which one channel formation region is formed, a double-gate structure in which two channel formation regions are formed, and a triple-gate structure in which three channel formation regions are formed. Further, thin film transistors in the peripheral driver circuit region may also have any of a single-gate structure, a double-gate structure, and a triple-gate structure.

Next, an insulating film 181 is formed as a second interlayer insulating layer. In FIGS. 15A and 15B, the display device includes a cut-off region 201 which is to be cut off by scribing, an external terminal connection region 202 which is a portion to which an FPC is attached, a wiring region 203 which is a lead wiring region of a peripheral portion, the peripheral driver circuit region 204, and the pixel region 206. Wirings 179a and 179b are provided in the wiring region 203, and a terminal electrode layer 178 connected to an external terminal is provided in the external terminal connection region 202.

The insulating film 181 can be formed using a material selected from silicon oxide, silicon nitride, silicon oxynitride, silicon nitride oxide, aluminum nitride (AlN), aluminum oxide containing nitrogen (also referred to as aluminum oxynitride; AlON), aluminum nitride containing oxygen (also referred to as aluminum nitride oxide; AlNO), aluminum oxide, diamond-like carbon (DLC), nitrogen-containing carbon (CN), PSG (phosphosilicate glass), BPSG (borophosphosilicate glass), alumina, and other substances containing an inorganic insulating material. Further, a siloxane resin or an organic insulating material can also be used. The organic material can be either photosensitive or non-photosensitive. For example, polyimide, acrylic, polyamide, polyimide amide, resist, benzocyclobutene, polysilazane, or a low-dielectric constant (low-k) material can be used. Besides, an oxazole resin such as photo-curing polybenzoxazole can also be used. An interlayer insulating layer provided for planarization is required to have high heat resistance, high insulating property, and high planarization factor; therefore, the insulating film 181 is preferably formed by a coating method typified by a spin coating method.

The insulating film 181 can also be formed by using a dipping method, spray coating, a doctor knife, a roll coater, a curtain coater, a knife coater, a CVD method, an evaporation method, or the like. Alternatively, the insulating film 181 can be formed by a droplet discharging method. When a droplet discharging method is used, a liquid material can be saved. As a further alternative, a method by which patterns can be transferred or drawn like a droplet discharging method, for example, a printing method (e.g., a method for forming a pattern such as screen printing or offset printing), a dispenser method, or the like can be used.

Next, a minute opening, i.e., a contact hole is formed in the insulating film 181 of the pixel region 206. The source or drain electrode layer is electrically connected to a first electrode layer 185 at the opening of the insulating film 181. It is also possible to form the opening in the insulating film 181 using a tube as shown in Embodiment Modes 1 and 2.

The tube is arranged to be in contact with the insulating film 181 in an opening formation region. A treatment agent (etching gas or etchant) is discharged (jetted) to the insulating film 181 through the tube. With the discharged (jetted) treatment agent (etching gas or etchant), the insulating film 181 is selectively removed, so that an opening which reaches the source or drain electrode layer is formed in the insulating film 181.

The first electrode layer 185 is formed in the opening where the source or drain electrode layer is exposed, whereby the source or drain electrode layer can be electrically connected to the first electrode layer 185.

The first electrode layer 185 functions as an anode or a cathode, and may be formed with a total thickness of 100 nm to 800 nm, using a film mainly including an element such as Ti, Ni, W, Cr, Pt, Zn, Sn, In or Mo; an alloy material or a compound material containing the element as a main component, such as titanium nitride $TiSi_xN_y$, $WSi_x$, tungsten nitride, $WSi_xN_y$, or NbN; or a stacked film of the materials.

In this embodiment mode, a light-emitting element is used as a display element and light emitted from the light-emitting element is extracted through the first electrode layer 185. Therefore, the first electrode layer 185 has a light-transmitting property. The first electrode layer 185 is formed by the steps of depositing a transparent conductive film and etching it into a desired shape.

In the present invention, the first electrode layer 185 which is a light-transmitting electrode layer may be formed using a transparent conductive film made of a light-transmitting conductive material. Specifically, indium oxide containing tungsten oxide, indium zinc oxide containing tungsten oxide, indium oxide containing titanium oxide, indium tin oxide containing titanium oxide, or the like can be used. Of course, indium tin oxide (ITO), indium zinc oxide (IZO), indium tin oxide doped with silicon oxide (ITSO), or the like can also be used.

Further, even a material such as a metal film which does not have a light-transmitting property can be used for the first electrode layer 185 on the condition that the film is formed to be thin (preferably, a thickness of about 5 nm to 30 nm) so as to transmit light. Examples of the thin metal film that can be used for the first electrode layer 185 include a conductive film made of titanium, tungsten, nickel, gold, platinum, silver, aluminum, magnesium, calcium, lithium, or an alloy of such metals.

The first electrode layer 185 can be formed by an evaporation method, a sputtering method, a CVD method, a printing method, a dispenser method, a droplet discharging method, or the like. In this embodiment mode, the first electrode layer 185 is formed by a sputtering method using indium zinc oxide containing tungsten oxide. The first electrode layer 185 is preferably formed with a total thickness of 100 nm to 800 nm. The first electrode layer 185 can also be formed by the method shown in Embodiment Mode 3: a conductive light-absorbing film is formed on a transposing substrate and irradiated with a laser beam, to be formed selectively over a transposed substrate and processed into a desired shape.

The first electrode layer 185 may be wiped or polished by a CMP method or using a polyvinyl alcohol based porous body so as to have a flat surface. Further, after the first electrode layer 185 is polished by a CMP method, ultraviolet irradiation, oxygen plasma treatment, or the like may be performed on the surface of the first electrode layer 185.

After the formation of the first electrode layer 185, heat treatment may be performed. Since this heat treatment can dissipate moisture contained in the first electrode layer 185, the first electrode layer 185 can be free from degasification. Thus, even when a light-emitting material which will easily deteriorate by moisture is formed over the first electrode layer 185, the light-emitting material does not deteriorate, whereby a highly reliable display device can be manufactured.

Next, an insulating layer 186 (also referred to as a partition, partition wall, or the like) which covers an end portion of the first electrode layer 185 and the source or drain electrode layer is formed.

The insulating layer 186 can be formed using silicon oxide, silicon nitride, silicon oxynitride, silicon nitride oxide, or the like, and can have either a single-layer structure or a stacked structure of two or more layers. Alternatively, the insulating layer 186 can be formed using a material such as aluminum nitride, aluminum oxynitride having a higher content of oxygen than that of nitrogen, aluminum nitride oxide having a higher content of nitrogen than that of oxygen, aluminum oxide, diamond-like carbon (DLC), nitrogen-containing carbon, polysilazane, or other substances containing an inorganic insulating material. As a further alternative, a material containing siloxane or an organic insulating material can also be used. The organic material can be either photosensitive or non-photosensitive. For example, polyimide, acrylic, polyamide, polyimide amide, resist, benzocyclobutene, or polysilazane can be used. Besides, an oxazole resin such as photocuring polybenzoxazole can also be used.

The insulating layer 186 can be formed by a sputtering method, a PVD (Physical Vapor Deposition) method, or a CVD (Chemical Vapor Deposition) method such as a low-pressure CVD (LPCVD) method or a plasma CVD method. It is also possible to use a droplet discharging method by which a pattern can be selectively formed, a printing method by which a pattern can be transferred or drawn (e.g., a method for forming a pattern such as screen printing or offset printing), a dispenser method, a coating method such as a spin coating method, a dipping method, and the like.

An etching process for forming a desired shape may be performed by using either plasma etching (dry etching) or wet etching. However, plasma etching is more suitable for processing a large-sized substrate. As an etching gas, a fluorine based gas such as $CF_4$ or $NF_3$ and a chlorine based gas such as $Cl_2$ or $BCl_3$ is used, to which an inert gas such as He or Ar may be appropriately added. Further, when etching treatment is performed by atmospheric discharge plasma, local discharge processing is possible; therefore, there is no need to form a mask layer over the entire surface of the substrate.

In a connection region 205 shown in FIG. 15A, a wiring layer that is formed through the same steps and with the same material as a second electrode layer is electrically connected to a wiring layer that is formed through the same steps and with the same material as the gate electrode layer.

A light-emitting layer 188 is formed over the first electrode layer 185. Although only one pixel is shown in FIG. 15B, electroluminescent layers corresponding to R (Red), G (Green), and B (Blue) colors are selectively formed in this embodiment mode.

Next, a second electrode layer 189 made of a conductive film is provided over the light-emitting layer 188. The second electrode layer 189 can be formed using Al, Ag, Li, or Ca; an alloy or compound thereof such as MgAg, MgIn, AlLi, or $CaF_2$; or calcium nitride. Thus, a light-emitting element 190 having the first electrode layer 185, the light-emitting layer 188, and the second electrode layer 189 is formed (FIG. 15B).

In the display device of this embodiment mode shown in FIGS. 15A and 15B, light emitted from the light-emitting element 190 is emitted in the direction of the arrow in FIG. 15B from the side of the first electrode layer 185.

In this embodiment mode, an insulating layer may be provided as a passivation film (a protective film) over the second electrode layer 189. It is effective to provide a passivation film so as to cover the second electrode layer 189. The passivation film is formed of an insulating film containing silicon nitride, silicon oxide, silicon oxynitride, silicon nitride oxide, aluminum nitride, aluminum oxynitride, aluminum nitride oxide having a higher content of nitrogen than that of oxygen, aluminum oxide, diamond-like carbon (DLC), or nitrogen-containing carbon. Such an insulating film can be either a single layer or stacked layers. Further, a siloxane resin can also be used.

As a passivation film, it is preferable to use a film that can continuously cover the underlying region. For example, a carbon film such as a DLC film is particularly effective. A DLC film can be deposited at temperatures ranging from the room temperature to 100° C.; therefore, it can be easily deposited even above the light-emitting layer 188 with low heat resistance. A DLC film can be formed by a plasma CVD method (typically, an RF plasma CVD method, a microwave CVD method, an electron cyclotron resonance (ECR) CVD method, a hot-filament CVD method, or the like), a combustion flame method, a sputtering method, an ion beam deposition method, a laser deposition method, or the like. As a reactive gas used for deposition of the film, a hydrogen gas and a hydrocarbon based gas (e.g., $CH_4$, $C_2H_2$, or $C_6H_6$) are used, and the reactive gas is ionized by glow discharge so that the ions are accelerated to collide against a negatively self-biased cathode and thus a film can be deposited. In the case of depositing a CN film, a $C_2H_4$ gas and a $N_2$ gas may be used as a reactive gas. A DLC film has a high blocking effect against oxygen and can suppress oxidation of the light-emitting layer 188. Therefore, the DLC film can prevent a problem that the light-emitting layer 188 might be oxidized during a subsequent sealing step.

The substrate 150 having the light-emitting element 190 and a sealing substrate 195 are bonded with a sealant 192, so that the light-emitting element is sealed (FIGS. 15A and 15B). The sealant 192 is preferably a visible-light curing resin, an ultraviolet curing resin, or a thermosetting resin. For example, the following epoxy resins can be used: a bisphenol A liquid resin, a bisphenol A solid resin, a bromine-containing epoxy resin, a bisphenol F resin, a bisphenol AD resin, a phenol resin, a cresol resin, a novolac resin, a cycloaliphatic epoxy resin, an Epi-Bis type epoxy resin, a glycidyl ester resin, a glycidyl amine based resin, a heterocyclic epoxy resin, a modified epoxy resin, and the like. It is to be noted that a region surrounded by the sealant may be filled with a filler 193, or with a nitrogen gas or the like by performing a sealing step under a nitrogen atmosphere. In this embodiment mode, a bottom-emission display device is manufactured; therefore, the filler 193 is not required to have a light-transmitting property. However, when a structure in which light is extracted through the filler 193 is employed, the filler 193 should have a light-transmitting property. Typically, a visible-light curing resin, an ultraviolet curing resin, or a thermosetting resin can be used. Through the above process, a display device which includes light-emitting elements and has a display function of this embodiment mode is completed. The filler can be introduced into the display device by being dripped in a liquid state. When a hydroscopic substance such as a drying agent is used as a filler, a water-absorbing effect can be increased, whereby deterioration of the element can be prevented.

In order to prevent deterioration due to moisture of the element, a drying agent is provided in the EL display panel. In this embodiment mode, the drying agent is provided in a recessed portion that is formed in the sealing substrate so as to surround the pixel region, so that a thin display panel can be manufactured. Further, when a drying agent is also provided in a region corresponding to a gate wiring layer to increase the water-absorbing area, a higher water-absorbing effect can be obtained. In addition, when a drying agent is provided above the gate wiring layer which does not directly emit light, light extraction efficiency is not lowered.

Although this embodiment mode illustrates the case where the light-emitting element is sealed with a glass substrate, any of the following sealing treatment which can protect the light-emitting element against moisture can be used: a mechanical sealing method with a covering material, a sealing method with a thermosetting resin or an ultraviolet curing resin, and a sealing method with a thin film having a high barrier property such as metal oxide or metal nitride. For a covering material, glass, ceramics, plastics, or metal can be used. However, when light is emitted to the side of the covering material, the covering material should have a light-transmitting property. In addition, the covering material and the substrate having the light-emitting element are bonded with a sealant such as a thermosetting resin or an ultraviolet curing resin, followed by heat treatment or ultraviolet irradiation for hardening the resin so that a hermetically sealed space is formed. It is also effective to provide a hydroscopic material typified by barium oxide in the hermetically sealed space. This hydroscopic material may be provided to be in contact with the sealant or provided above the partition or in the peripheral portion so as not to block light emitted from the light-emitting element.

Further, a space between the covering material and the substrate having the light-emitting element can also be filled with a thermosetting resin or an ultraviolet curing resin. In that case, it is effective to add a hydroscopic material typified by barium oxide into the thermosetting resin or the ultraviolet curing resin.

The source or drain electrode layer does not have to be directly connected to the first electrode layer, but may be electrically connected to the first electrode layer through a wiring layer.

In this embodiment mode, an FPC 194 is connected to the terminal electrode layer 178 through an anisotropic conductive layer 196 in the external terminal connection region 202, so that TFTs are electrically connected to an external portion. In addition, as shown in FIG. 15A which is a plan view of the display device, the display device manufactured in this embodiment mode is provided with peripheral driver circuit regions 204 and 209 having signal line driver circuits as well as peripheral driver circuit regions 207 and 208 having scan line driver circuits.

Although the display device in this embodiment mode is constructed from the above-described circuits, the present invention is not limited thereto. For example, IC chips may be mounted as the peripheral driver circuits by a COG method or a TAB method as described above. Further, the number of each of the gate line driver circuits and the source line driver circuits can be either one or plural.

Furthermore, a driving method for image display of the display device in the present invention is not specifically limited. For example, a dot sequential driving method, a line sequential driving method, a frame sequential driving method, or the like can be used. Typically, a line sequential driving method is used, and a time division gray scale driving method or an area division gray scale driving method may be combined as appropriate. In addition, video signals input to source lines of the display device may be either analog signals or digital signals, and driver circuits and the like may be appropriately designed in conformity with the video signals.

This embodiment mode can be appropriately combined with Embodiment Modes 1 to 3.

Thus, in accordance with this embodiment mode, a contact hole can be formed in the insulating layer without forming a mask, so that the process can be simplified. Further, it is not necessary to perform light-exposure and development after application of a photoresist or the like, so that the cost of materials required for processing can be reduced. Furthermore, the contact hole can be assuredly formed, whereby the yield in manufacturing a semiconductor device and a display device can be improved.

Embodiment Mode 6

Thin film transistors can be formed by using the present invention, and a display device can be formed by using such thin film transistors. When light-emitting elements are used and n-channel transistors are used as transistors for driving the light-emitting elements, light emitted from the light-emitting elements is emitted to the bottom side, the top side, or both the top and bottom sides. Here, a stacked structure of a light-emitting element for each case will be described with reference to FIGS. 17A to 17C.

In this embodiment mode, channel-protective thin film transistors 461, 471, and 481 which apply the present invention are used. The thin film transistor 481 is provided over a light-transmitting substrate 480, and includes a gate electrode layer 493, a gate insulating film 497, a semiconductor layer, n-type semiconductor layers 495a and 495b, a source or drain electrode layer 487*a*, a source or drain electrode layer 487*b*, a channel-protective layer 496, an insulating layer 499, a wiring layer 498, and an insulating layer 482. Each of the gate electrode layer, the semiconductor layer, and the source or drain electrode layer can be formed by the method shown in Embodiment Mode 3: a conductive light-absorbing film is formed on a transposing substrate and irradiated with a laser beam, to be formed selectively over a transposed substrate and processed into a desired shape. In that case, the process can be simplified and the loss of materials can be prevented; therefore, cost reduction can be achieved.

Figure 17A:
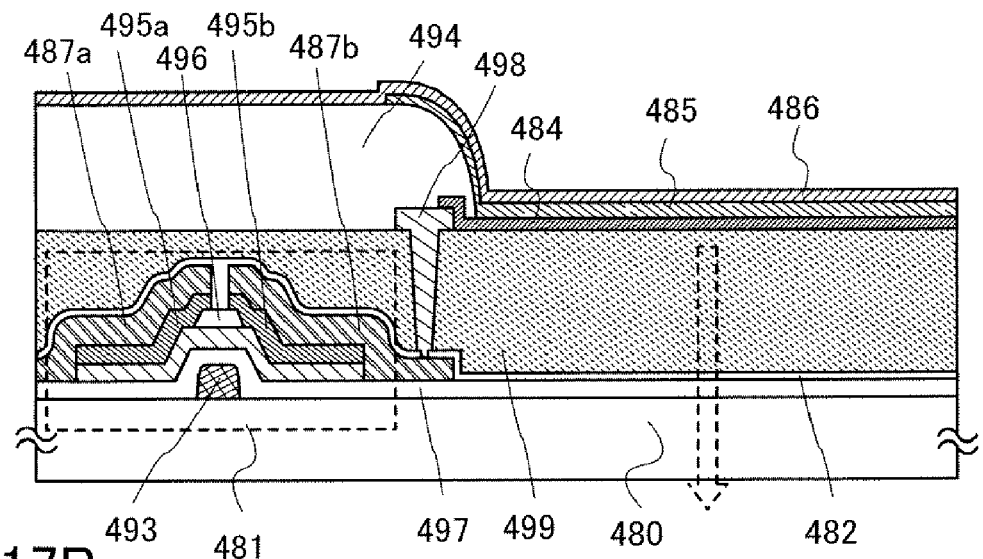
FIGS. 17A to 17C are explanatory views of a display device of the present invention.
Figure 17B:
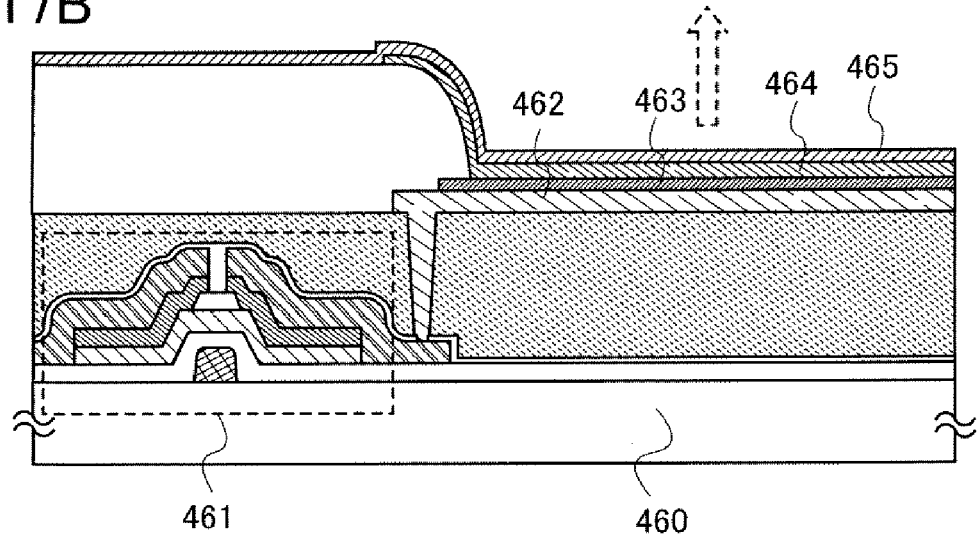
Figure 17C:
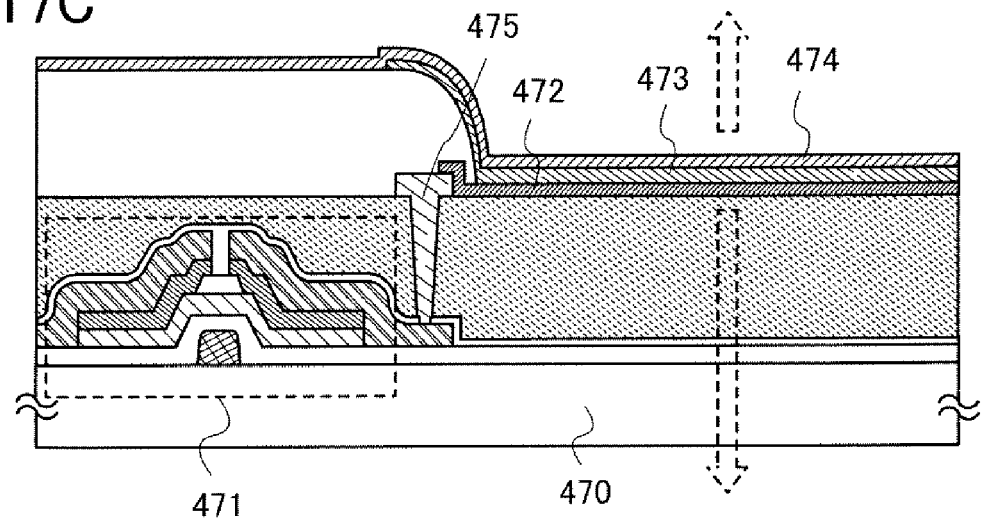

In FIGS. 17A to 17C shown in this embodiment mode, a contact hole (an opening) which reaches the source or drain electrode layer 487*b* is formed in the insulating layers 482 and 499 using a tube as shown in Embodiment Modes 1 and 2.

The tube is arranged so as to be embedded in the insulating layer 499, and a first opening is formed in the insulating layer 499 by physical force. Then, an etching gas is jetted from the tube to remove the insulating layer 482 selectively, so that a second opening is formed. Thus, a contact hole (opening) which reaches the source or drain electrode layer 487*b* can be formed in the insulating layers 482 and 499.

Since the shape of the opening reflects the shapes of the tube and its discharging outlet for discharging an etching substance, the shape of the tube may be selected so that a desired shape of the opening can be obtained. The tube may have a columnar shape (prism, cylinder, or triangular prism) or a needle shape. The depth of the opening can be determined by force at a time when the tube is provided and intensity of the film on which the tube is placed. In addition, the depth in a thickness direction can also be determined by setting etching conditions such as etching time. When a needle-shaped tube whose end has a sharp point is provided so as to be partially embedded in the conductive layer, an opening with a recessed portion in the conductive layer can be formed. Further, after the opening is formed, an exposed part of the conductive layer at the bottom of the opening may be removed by etching, using the insulating layer provided with the opening as a mask.

In the present invention, the tube is arranged to be in contact with the insulating layer in the opening formation region. Therefore, the opening formation region of the insulating layer can be provided physically, so that the opening can be assuredly formed in a desired position. Therefore, a semiconductor device and a display device can be manufactured with high yield by using the present invention.

According to the present invention, the opening can be selectively formed in a thin film without using a photolithography step. Therefore, the number of steps and materials can be reduced.

Next, a wiring layer 498 is formed in the opening where the source or drain electrode layer 487*b* is exposed, so that the source or drain electrode layer 487*b* can be electrically connected to the wiring layer 498. The wiring layer 498 is formed in contact with a first electrode layer 484 of a light-emitting element; therefore, the thin film transistor 481 and the light-emitting element are electrically connected through the wiring layer 498. An insulating layer 494 is formed so as to cover the wiring layer 498.

Further, after the opening is formed in the insulating layers 482 and 499 using the tube of the present invention, a material for forming a film (such as a conductive composition) in a liquid state may be discharged to the opening through the tube to form the wiring layer 498. With a minute opening, it may be difficult to fill the opening assuredly with a liquid material for forming a film by the surface tension; however, in the present invention, the opening can be assuredly filled with a material for forming a film by the tube stuck into the opening, and thus, a film can be formed without a defective shape.

In this embodiment mode, an amorphous semiconductor layer is used as a semiconductor layer. However, the semiconductor layer is not limited thereto. A crystalline semiconductor layer may be used as a semiconductor layer and an n-type semiconductor layer may be used as a semiconductor layer having one conductivity type. Instead of forming the n-type semiconductor layer, a conductivity type may be provided to the semiconductor layer by performing plasma treatment with a $PH_3$ gas. In the case of using a crystalline semiconductor layer such as polysilicon, an impurity region having one conductivity type may be formed by doping the crystalline semiconductor layer with an impurity instead of forming a semiconductor layer having one conductivity type. In addition, it is also possible to use an organic semiconductor such as pentacene. When such an organic semiconductor is selectively formed by a droplet discharging method, the process can be simplified.

The case of using a crystalline semiconductor layer as a semiconductor layer will be described. First, an amorphous semiconductor layer is crystallized to form a crystalline semiconductor layer. In the crystallization step, an amorphous semiconductor layer is doped with an element which promotes crystallization (also referred to as a catalytic element or a metal element) and heat treatment (550° C. to 750° C. for three minutes to 24 hours) is performed for crystallization. As a metal element which promotes crystallization of silicon, one or more elements selected from iron (Fe), nickel (Ni), cobalt (Co), ruthenium (Ru), rhodium (Rh), palladium (Pd), osmium (Os), iridium (Ir), platinum (Pt), copper (Cu), and gold (Au) can be used.

In order to remove or reduce the element which promotes crystallization from/in the crystalline semiconductor layer, a semiconductor layer containing an impurity element is formed to be in contact with the crystalline semiconductor layer so that the semiconductor layer containing an impurity element functions as a gettering sink. As the impurity element, an impurity element which imparts n-type conductivity, an impurity element which imparts p-type conductivity, a rare gas element, or the like can be used. For example, one or more elements selected from phosphorus (P), nitrogen (N), arsenic (As), antimony (Sb), bismuth (Bi), boron (B), helium (He), neon (Ne), argon (Ar), krypton (Kr), and xenon (Xe) can be used. An n-type semiconductor layer is formed on the crystalline semiconductor layer containing an element which promotes crystallization, and heat treatment (550° C. to 750° C. for three minutes to 24 hours) is performed. Then, the element which promotes crystallization and is in contained in the crystalline semiconductor layer moves toward the n-type semiconductor layer, so that the element which promotes crystallization in the crystalline semiconductor layer is removed or reduced; thus, the semiconductor layer is formed. Meanwhile, the n-type semiconductor layer becomes an n-type semiconductor layer containing a metal element which promotes crystallization, and is patterned into a desired shape in a subsequent step. In this manner, the n-type semiconductor layer functions as a gettering sink of the semiconductor layer and also functions as source and drain regions.

The crystallization step and the gettering step of the semiconductor layer may be performed by heat treatment either a plurality of times or only once. In the latter case, the following steps may be performed: forming an amorphous semiconductor layer, doping the amorphous semiconductor layer with an element which promotes crystallization, forming a semiconductor layer to function as a gettering sink, and performing heat treatment.

In this embodiment mode, the gate insulating layer is formed to have a plurality of stacked layers. Specifically, the gate insulating film 497 having a two-layer structure is formed by sequentially depositing a silicon nitride oxide film and a silicon oxynitride film over the gate electrode layer 493. The stacked insulating layers are preferably formed consecutively in the same chamber at the same temperature by switching reactive gases without breaking a vacuum. When the insulating layers are consecutively formed without breaking a vacuum, an interface between the stacked films can be prevented from being contaminated.

The channel-protective layer 496 may be formed by dripping polyimide, polyvinyl alcohol, or the like by using a droplet discharging method. As a result, a light-exposure step can be omitted. The channel-protective layer can be formed using a film made of one or more of an inorganic material (e.g., silicon oxide, silicon nitride, silicon oxynitride, or silicon nitride oxide), a photosensitive or non-photosensitive organic material (an organic resin material such as polyimide, acrylic, polyamide, polyimide amide, resist, or benzocyclobutene), and a low-dielectric constant material, or stacked layers of such films. Alternatively, a siloxane material may also be used. As a method for forming the channel-protective layer 496, a vapor deposition method such as a plasma CVD method or a thermal CVD method, or a sputtering method can be used. Further, a droplet discharging method, a dispenser method, or a printing method (e.g., a method for forming a pattern such as screen printing or offset printing) can also be used. It is also possible to use a SOG film obtained by a coating method or the like.

First, a case where light is emitted to the substrate 480 side, i.e., a bottom-emission structure will be described with reference to FIG. 17A. In this case, the wiring layer 498 is formed in contact with the source or drain electrode layer 487b so as to be electrically connected to the thin film transistor 481. The first electrode layer 484, an electroluminescent layer 485, and a second electrode layer 486 are sequentially stacked. The substrate 480 through which light passes should have a light-transmitting property with respect to light at least in the visible range.

Next, a case where light is emitted to the side opposite to a substrate 460, i.e., a top-emission structure will be described with reference to FIG. 17B. The thin film transistor 461 can be formed in a similar way to the above-described thin film transistor 481. A source or drain electrode layer 462 electrically connected to the thin film transistor 461 is in contact with and electrically connected to a first electrode layer 463. The first electrode layer 463, an electroluminescent layer 464, and a second electrode layer 465 are sequentially stacked. The source or drain electrode layer 462 is a reflective metal layer and reflects light emitted from the light-emitting element to the top side as shown by the arrow. Since the source or drain electrode layer 462 and the first electrode layer 463 are stacked, even when the first electrode layer 463 is formed of a light-transmitting material and light passes therethrough, the light is reflected by the source or drain electrode layer 462 and emitted toward the side opposite to the substrate 460. Of course, the first electrode layer 463 may be formed using a reflective metal film. Since light emitted from the light-emitting element is emitted through the second electrode layer 465, the second electrode layer 465 is formed using a material which transmits light at least in the visible range.

Finally, a case where light is emitted to both the substrate 470 side and the side opposite to the substrate 470, i.e., a dual-emission structure will be described with reference to FIG. 17C.

The thin film transistor 471 is also a channel-protective thin film transistor. A wiring layer 475 and a first electrode layer 472 are electrically connected to the source or drain electrode layer which is electrically connected to the semiconductor layer of the thin film transistor 471. The first electrode layer 472, an electroluminescent layer 473, and a second electrode layer 474 are sequentially stacked. Each of the first electrode layer 472 and the second electrode layer 474 is formed to be thin enough to transmit light or using a material which transmits light at least in the visible range, whereby a dual-emission structure is realized. In this case, the insulating layers and the substrate 470 through which light passes should also have a light-transmitting property with respect to light at least in the visible range.

This embodiment mode can be appropriately combined with Embodiment Modes 1 to 5.

Thus, in accordance with this embodiment mode, a contact hole can be formed in the insulating layer without forming a mask, so that the process can be simplified. Further, it is not necessary to perform light-exposure and development after application of a photoresist or the like, so that the cost of materials required for processing can be reduced. Furthermore, the contact hole can be assuredly formed, whereby the yield in manufacturing a semiconductor device and a display device can be improved.

Embodiment Mode 7

This embodiment mode will describe an example of a display device that is manufactured through a more simplified process at low cost. More specifically, a light-emitting display device using a light-emitting element as a display element will be described. In this embodiment mode, a structure of a light-emitting element used as a display element of a display device of the present invention will be described with reference to FIGS. 22A to 22D.

In this embodiment mode, structures of light-emitting elements that can be applied to display elements of the display device of the present invention will be described with reference to FIGS. 22A to 22D.

FIGS. 22A to 22D each illustrate a structure of a light-emitting element in which an electroluminescent layer 860 containing a mixture of an organic compound and an inorganic compound is sandwiched between a first electrode layer 870 and a second electrode layer 850. The electroluminescent layer 860 includes a first layer 840, a second layer 803, and a third layer 802 as shown in the drawings.

The first layer 804 is a layer having a function of transporting holes to the second layer 803, and includes at least a first organic compound and a first inorganic compound which exhibits an electron accepting property with respect to the first organic compound. What is important is that the first organic compound and the first inorganic compound are not simply mixed but the first inorganic compound exhibits an electron accepting property with respect to the first organic compound. With such a structure, many hole carriers are generated in the first organic compound which inherently has few carriers, whereby excellent hole injection/transport properties can be obtained.

Therefore, the first layer 804 can provide not only effects (e.g., improvement in heat resistance) that are considered to be obtained by mixture with an inorganic compound, but also excellent conductivity (in particular, the hole injection/transport properties with regard to the first layer 804). Such effects cannot be obtained by a conventional hole transport layer in which an organic compound and an inorganic compound that have no mutual electronic interaction are simply mixed. By such effects, driving voltage can be lowered compared to the conventional structure. Further, since the first layer 804 can be formed to be thick without causing an increase in driving voltage, short circuit of the light-emitting element due to a dust or the like can be suppressed.

As described above, since hole carriers are generated in the first organic compound, the first organic compound is preferably an organic compound having a hole transport property. Examples of the organic compound having a hole transport property include, but not limited to, phthalocyanine (abbreviation: $H_2Pc$), copper phthalocyanine (abbreviation: CuPc), vanadyl phthalocyanine (abbreviation: VOPc), 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 1,3,5-tris[N,N-di(m-tolyl)amino]benzene (abbreviation: m-MTDAB), N,N'-diphenyl-N,N'-bis(3-methylphenyl)-1,1'-biphenyl-4,4'-diamine (abbreviation: TPD), 4,4'-bis[N-(1-naphthyl)-N-phenylamino]biphenyl (abbreviation: NPB), 4,4'-bis{N-[4-di(m-tolyl)amino]phenyl-N-phenylamino}biphenyl (abbreviation: DNTPD), and 4,4',4"-tris(N-carbazolyl)triphenylamine (abbreviation: TCTA). Among the above-described compounds, aromatic amine compounds typified by TDATA, MTDATA, m-MTDAB, TPD, NPB, DNTPD, TCTA, and the like can easily generate hole carriers and thus are suitable for the first organic compound.

On the other hand, the first inorganic compound can be any material as long as it can easily receive electrons from the first organic compound, and various metal oxides or metal nitrides can be used. For example, oxides of transition metals of Group 4 to Group 12 in the periodic table, which can easily exhibit an electron accepting property, are suitable. Specifically, titanium oxide, zirconium oxide, vanadium oxide, molybdenum oxide, tungsten oxide, rhenium oxide, ruthenium oxide, zinc oxide, and the like can be given as examples. Among the above-described metal oxides, oxides of transition metals of Group 4 to Group 8 in the periodic table, which exhibit a high electron accepting property, are preferable. In particular, vanadium oxide, molybdenum oxide, tungsten oxide, and rhenium oxide are preferable because they can be deposited in vacuum and are easy to be handled.

It is to be noted that the first layer 804 can also be formed by stacking a plurality of layers each having a combination of the above-described organic compound and inorganic compound. Further, the first layer 804 can also contain another organic compound or inorganic compound.

Next, the third layer 802 will be described. The third layer 802 is a layer having a function of transporting electrons to the second layer 803, and contains at least a third organic compound and a third inorganic compound which exhibits an electron donating property with respect to the third organic compound. What is important is that the third organic compound and the third inorganic compound are not simply mixed but the third inorganic compound exhibits an electron donating property with respect to the third organic compound. With such a structure, many electron carriers are generated in the third organic compound which inherently has few carriers, whereby excellent electron injection/transport properties can be obtained.

Therefore, the third layer 802 can provide not only effects (e.g., improvement in heat resistance) that are considered to be obtained by mixture with an inorganic compound, but also excellent conductivity (in particular, the electron injection/transport properties with regard to the third layer 802). Such effects cannot be obtained by a conventional electron transport layer in which an organic compound and an inorganic compound that have no mutual electronic interaction are simply mixed. By such effects, driving voltage can be lowered than that in the conventional structure. Further, since the third layer 802 can be formed to be thick without causing an increase in driving voltage, short circuit of the light-emitting element due to a dust or the like can be suppressed.

As described above, since electron carriers are generated in the third organic compound, the third organic compound is preferably an organic compound having an electron transport property. Examples of the organic compound having an electron transport property include, but not limited to, tris(8-quinolinolato)aluminum (abbreviation: $Alq_3$), tris(4-methyl-8-quinolinolato)aluminum (abbreviation: $Almq_3$), bis(10-hydroxybenzo[h]-quinolinato)beryllium (abbreviation: $BeBq_2$), bis(2-methyl-8-quinolinolato)(4-phenylphenolato)aluminum (abbreviation: BAlq), bis[2-(2'-hydroxyphenyl)benzoxazolato]zinc (abbreviation: $Zn(BOX)_2$), bis[2-(2'-hydroxyphenyl)benzothiazolato]zinc (abbreviation: $Zn(BTZ)_2$), bathophenanthroline (abbreviation: BPhen), bathocuproin (abbreviation: BCP), 2-(4-biphenylyl)-5-(4-tert-butylphenyl)-1,3,4-oxadiazole (abbreviation: PBD), 1,3-bis[5-(4-tert-buthylphenyl)-1,3,4-oxadiazol-2-yl]benzene (abbreviation: OXD-7), 2,2',2"-(1,3,5-benzenetriyl)-tris(1-phenyl-1H-benzimidazole) (abbreviation: TPBI), 3-(4-biphenylyl)-4-phenyl-5-(4-tert-butylphenyl)-1,2,4-triazole (abbreviation: TAZ), and 3-(4-biphenylyl)-4-(4-ethylphenyl)-5-(4-tert-butylphenyl)-1,2,4-triazole (abbreviation: p-EtTAZ). Among the above-described compounds, chelate metal complexes having a chelate ligand including an aromatic ring typified by $Alq_3$, $Almq_3$, $BeBq_2$, BAlq, $Zn(BOX)_2$, and $Zn(BTZ)_2$, organic compounds having a phenanthroline skeleton typified by BPhen and BCP, and organic compounds having an oxadiazole skeleton typified by PBD and OXD-7 can easily generate electron carriers and thus are suitable for the third organic compound.

On the other hand, the third inorganic compound can be any material as long as it can easily donate electrons to the third organic compound, and various metal oxides or metal nitrides can be used. For example, alkali metal oxide, alkaline-earth metal oxide, rare-earth metal oxide, alkali metal nitride, alkaline-earth metal nitride, and rare-earth metal nitride, which can easily exhibit an electron donating property, are suitable. Specifically, lithium oxide, strontium oxide, barium oxide, erbium oxide, lithium nitride, magnesium nitride, calcium nitride, yttrium nitride, lanthanum nitride, and the like can be given as examples. In particular, lithium oxide, barium oxide, lithium nitride, magnesium nitride, and calcium nitride are preferable because they can be deposited in vacuum and are easy to be handled.

It is to be noted that the third layer 802 can also be formed by stacking a plurality of layers each having a combination of the above-described organic compound and inorganic compound. Further, the third layer 802 can also contain another organic compound or inorganic compound.

Next, the second layer 803 will be described. The second layer 803 is a layer having a light-emitting function and contains a second organic compound having a light-transmitting property. The second layer 803 may also contain a second inorganic compound. The second layer 803 can be formed using various light-emitting organic compounds and inorganic compounds. It is to be noted that the second layer 803 is preferably formed with a thickness of about 10 nm to 100 nm because it is considered that current can less easily flow through the second layer 803 compared to the first layer 804 and the third layer 802.

The second organic compound can be any material as long as it is a light-emitting organic compound. Examples of the second organic compound include, but not limited to, 9,10- di(2-naphthyl)anthracene (abbreviation: DNA), 9,10-di(2-naphthyl)-2-tert-butylanthracene (abbreviation: t-BuDNA), 4,4'-bis(2,2-diphenylvinyl)biphenyl (abbreviation: DPVBi), Coumarin 30, Coumarin 6, Coumarin 545, Coumarin 545T, perylene, rubrene, periflanthene, 2,5,8,11-tetra(tert-butyl) perylene (abbreviation: TBP), 9,10-diphenylanthracene (abbreviation: DPA), 5,12-diphenyltetracene, 4-(dicyanomethylene)-2-methyl-[p-(dimethylamino)styryl]-4H-pyran (abbreviation: DCM1), 4-(dicyanomethylene)-2-methyl-6-[2-(julolidin-9-yl)ethenyl]-4H-pyran (abbreviation: DCM2), and 4-(dicyanomethylene)-2,6-bis[p-(dimethylamino) styryl]-4H-pyran (abbreviation: BisDCM). In addition, it is also possible to use a compound capable of generating phosphorescence such as bis[2-(4',6'-difluorophenyl)pyridinato-$N,C^{2'}$]iridium(picolinate) (abbreviation: FIrpic), bis{2-[3',5'-bis(trifluoromethyl)phenyl]pyridinato-$N,C^{2'}$}iridium (picolinate) (abbreviation: Ir($CF_3$ ppy)$_2$(pic)), tris(2-phenylpyridinato-$N,C^{2'}$)iridium (abbreviation: Ir(ppy)$_3$), bis (2-phenylpyridinato-$N,C^{2'}$)iridium(acetylacetonate) (abbreviation: Ir(ppy)$_2$(acac)), bis[2-(2'-thienyl)pyridinato-$N,C^{3'}$]iridium(acetylacetonate) (abbreviation: Ir(thp)$_2$ (acac)), bis(2-phenylquinolinato-$N,C^{2'}$)iridium(acetylacetonate) (abbreviation: Ir(pq)$_2$(acac)), or bis[2-(2'-benzothienyl) pyridinato-$N,C^{3'}$]iridium(acetylacetonate) (abbreviation: Ir(btp)$_2$(acac)).

The second Layer 803 can also be formed using a triplet excitation light-emitting material containing a metal complex or the like in addition to a singlet excitation light-emitting material. For example, among pixels which emit red light, green light, and blue light, red pixels whose luminance half-decay lifetime is relatively short are formed by using a triplet excitation light-emitting material, while the other pixels are formed by using a singlet excitation light-emitting material. The feature of a triplet excitation light-emitting material is exemplified by high luminous efficiency; therefore, low power consumption is needed to obtain the same luminance. That is, when a triplet excitation light-emitting material is applied to red pixels, the amount of current supplied to the light-emitting elements can be suppressed, whereby reliability can be improved. In order to achieve low power consumption, it is also possible to form red pixels and green pixels by using a triplet excitation light-emitting material and form blue pixels by using a singlet excitation light-emitting material. When light-emitting elements of a green color which is highly visible to human eyes are also formed with a triplet excitation light-emitting material, further reduction in power consumption can be achieved.

Further, the second layer 803 can contain another organic compound in addition to the above-described second organic compound which exhibits light-emission. Examples of another organic compound that can be added to the second organic compound include, but not limited to, TDATA, MTDATA, m-MTDAB, TPD, NPB, DNTPD, TCTA, Alq$_3$, Almq$_3$, BeBq$_2$, BAlq, Zn(BOX)$_2$, Zn(BTZ)$_2$, BPhen, BCP, PBD, OXD-7, TPBI, TAZ, p-EtTAZ, DNA, t-BuDNA, and DPVBi, which are previously described. Further, 4,4'-bis(N-carbazolyl)biphenyl (abbreviation: CBP), 1,3,5-tris[4-(N-carbazolyl)phenyl]benzene (abbreviation: TCPB), and the like can also be used. It is preferable that the organic compound, which is added in addition to the second organic compound, have higher excitation energy than the second organic compound and be added in larger quantities than the second organic compound so that the second organic compound can emit light efficiently (which makes it possible to prevent concentration quenching of the second organic compound). Alternatively, as another function, the organic compound may emit light together with the second organic compound (which makes it possible to emit white light or the like).

The second layer 803 may be formed to have a structure to perform color display by forming light-emitting layers having different emission wavelength ranges in the respective pixels. Typically, light-emitting layers corresponding to R (Red), G (Green), and B (Blue) are formed. Further, by providing the light-emission side of each pixel with a filter which transmits light of its emission wavelength range, color purity can be improved and a pixel portion can be prevented from having a mirror surface (reflection). By providing such a filter, a circularly polarizing plate and the like that have conventionally been required can be omitted. Further, the loss of light emitted from the light-emitting layer can be eliminated. Furthermore, changes in color tone, which occur when a pixel portion (display screen) is viewed obliquely, can be reduced.

Either a low-molecular organic light-emitting material or a high-molecular organic light-emitting material can be used as a material of the second layer 803. A high-molecular organic light-emitting material has higher physical strength than a low-molecular organic light-emitting material and is superior in durability of the element. In addition, since a high-molecular organic light-emitting material can be deposited by coating, manufacturing of the element is relatively easy.

The emission color is determined by a material that forms the light-emitting layer; therefore, a light-emitting element which exhibits desired light emission can be formed by selecting an appropriate material for the light-emitting layer. Examples of high-molecular electroluminescent materials that can be used for formation of the light-emitting layer include a polyparaphenylene-vinylene-based material, a polyparaphenylene-based material, a polythiophene-based material, and a polyfluorene-based material.

Examples of the polyparaphenylene-vinylene-based material include derivatives of poly(paraphenylenevinylene) [PPV] such as poly(2,5-dialkoxy-1,4-phenylenevinylene) [RO-PPV], poly(2-(2'-ethyl-hexoxy)-5-methoxy-1,4-phenylenevinylene) [MEH-PPV], and poly(2-(dialkoxyphenyl)-1,4-phenylenevinylene) [ROPh-PPV]. Examples of the polyparaphenylene-based material include derivatives of polyparaphenylene [PPP] such as poly(2,5-dialkoxy-1,4-phenylene) [RO-PPP] and poly(2,5-dihexoxy-1,4-phenylene). Examples of the polythiophene-based material include derivatives of polythiophene [PT] such as poly(3-alkylthiophene) [PAT], poly(3-hexylthiophen) [PHT], poly (3-cyclohexylthiophen) [PCHT], poly(3-cyclohexyl-4-methylthiophene) [PCHMT], poly(3,4-dicyclohexylthiophene) [PDCHT], poly[3-(4-octylphenyl)-thiophene] [POPT], and poly[3-(4-octylphenyl)-2,2bithiophene] [PTOPT]. Examples of the polyfluorene-based material include derivatives of polyfluorene [PF] such as poly(9,9-dialkylfluorene) [PDAF] and poly(9,9-dioctylfluorene) [PDOF].

The second inorganic compound can be any inorganic compound as long as it does not easily quench the light-emission of the second organic compound, and various metal oxides or metal nitrides can be used. In particular, oxides of metals of Group 13 or 14 in the periodic table, which do not easily quench the light-emission of the second organic compound, are suitable. Specifically, aluminum oxide, gallium oxide, silicon oxide, or germanium oxide can be preferably used. However, the second inorganic compound is not limited thereto.

It is to be noted that the second layer 803 can also be formed by stacking a plurality of layers each having a combination of the above-described organic compound and inorganic compound. Further, the second layer 803 can also contain another organic compound or inorganic compound. The structure of the light-emitting layer can be changed, and modification thereof is possible without departing the spirit and scope of the present invention. For example, instead of providing a specific electron injecting region or light-emitting region, an electrode layer for injecting electrons may be provided or a light-emitting material may be dispersed in the layer.

The light-emitting element formed using the above-described materials emits light when it is forwardly biased. Pixels of a display device formed using light-emitting elements can be driven by a passive matrix driving method or an active matrix driving method. In either case, each pixel is controlled to emit light upon application of a forward bias at specific timing, whereas the pixel does not emit light during a given period of time. By applying a reverse bias to the light-emitting element in the non-emission period, reliability of the light-emitting element can be improved. Deterioration modes of a light-emitting element include deterioration in which the emission intensity becomes lower under given driving conditions and deterioration in which a non-emission region of a pixel increases and the apparent luminance decreases. However, the deterioration speed can be retarded by performing AC drive in which a forward bias and a reverse bias are alternately applied, whereby reliability of the light-emitting display device can be improved. Further, either digital driving or analog driving can be applied.

In addition, a seating substrate may be provided with color filters (colored layers). Color filters (colored layers) can be formed by an evaporation method or a droplet discharging method. Using color filters (colored layers) can achieve high-definition display because broad peaks of the RGB emission spectra can be corrected to be sharp.

When a material which exhibits monochromatic light-emission is formed and combined with color filters or color conversion layers, full color display can be performed. The color filters (the colored layers) or the color conversion layers can be formed on, for example, a sealing substrate, and the sealing substrate may be attached to the element substrate.

Of course, display of monochromatic light-emission can also be performed. For example, an area-color display device using monochromatic light-emission may be formed. Such an area-color display is suitable for a passive matrix display portion, and can mainly display characters and symbols.

Figure 22A:
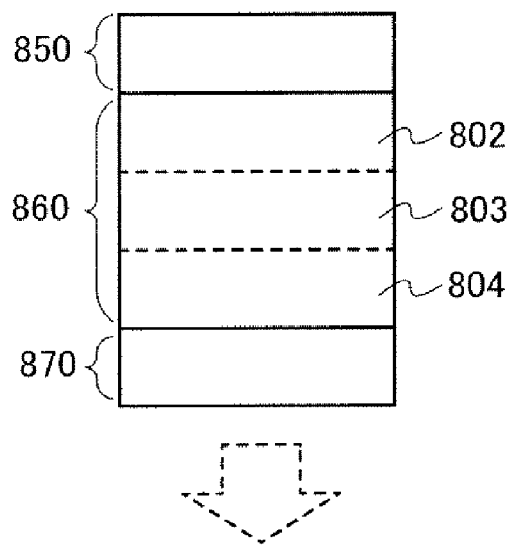
FIGS. 22A to 22D are explanatory views of structures of light-emitting elements which can be applied to the present invention.
Figure 22B:
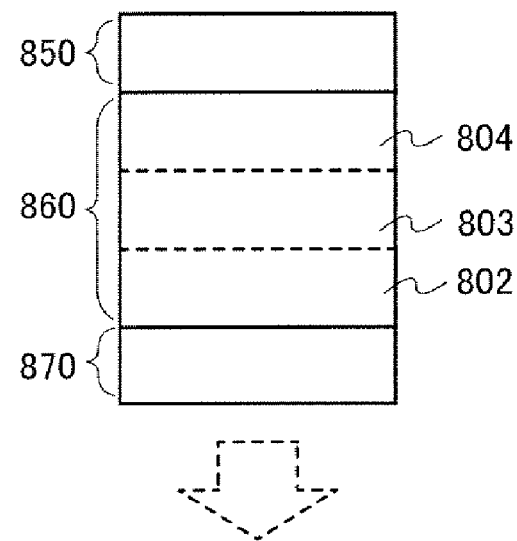

Materials of the first electrode layer 870 and the second electrode layer 850 should be selected in consideration of work functions. Each of the first electrode layer 870 and the second electrode layer 850 can be an anode or a cathode depending on the pixel structure. When a p-channel thin film transistor is used as a driving transistor, it is preferable that the first electrode layer 870 be an anode and the second electrode layer 850 be a cathode as shown in FIG. 22A. Meanwhile, when an n-channel thin film transistor is used as a driving transistor, it is preferable that the first electrode layer 870 be a cathode and the second electrode layer 850 be an anode as shown in FIG. 22B. Materials that can be used for the first electrode layer 870 and the second electrode layer 850 will now be described. When the first electrode layer 870 or the second electrode layer 850 functions as an anode, it is preferably formed with a material having a high work function (specifically, a work function not lower than 4.5 eV). On the other hand, when the first electrode layer 870 or the second electrode layer 850 functions as a cathode, it is preferably formed with a material having a low work function (specifically, a work function not higher than 3.5 eV). However, since the first layer 804 has excellent hole injection/transport properties and the third layer 802 has excellent electron injection/transport properties, the first electrode layer 870 and the second electrode layer 850 can be formed with various materials with few restrictions of work functions.

In the light-emitting elements shown in FIGS. 22A and 22B, light is extracted through the first electrode layer 870. Therefore, the second electrode layer 850 does not necessarily have a light-transmitting property. The second electrode layer 850 may be formed to have a total thickness of 100 nm to 800 nm, using an element such as Ti, Ni, W, Cr, Pt, Zn, Sn, In, Ta, Al, Cu, Au, Ag, Mg, Ca, Li, or Mo; an alloy material or a compound material containing such an element as a main component such as titanium nitride, $TiSi_xN_y$, $WSi_x$, tungsten nitride, $WSi_xN_y$, NbN; or a stacked film of such materials.

The second electrode layer 850 can be formed by an evaporation method, a sputtering method, a CVD method, a printing method, a dispenser method, a droplet discharge method, or the like.

When the second electrode layer 850 is formed using a light-transmitting conductive material like a material used for the first electrode layer 870, light is also extracted through the second electrode layer 850, whereby a dual-emission structure can be constructed. In that case, light emitted from the Light-emitting element is extracted from both the first electrode layer 870 and the second electrode layer 850.

It is to be noted that the light-emitting element of the present invention can have various forms by changing the kinds of the first electrode layer 870 and the second electrode layer 850.

FIG. 22B shows an example where the electroluminescent layer 860 has a structure in which the third layer 802, the second layer 803, and the first layer 804 are sequentially stacked over the first electrode layer 870.

As described above, in the light-emitting element of the present invention, the electroluminescent layer 860 having a composite layer of an organic compound and an inorganic compound is sandwiched between the first electrode layer 870 and the second electrode layer 850. In addition, the light-emitting element of the present invention is an organic-inorganic-composite type light-emitting element which includes layers (i.e., the first layer 804 and the third layer 802) having a high carrier injection property and a high carrier transport property that are formed by mixing an organic compound and an inorganic compound. Such a carrier injection property and carrier transport property could not be obtained in the case where only one of the organic compound and the inorganic compound is used. When the first layer 804 or the third layer 802 is provided on the side of the first electrode layer 870, it should particularly be a composite layer of an organic compound and an inorganic compound. On the other hand, when the first layer 804 or the third layer 802 is provided on the side of the second electrode layer 850, it may contain only an organic compound or an inorganic compound.

It is to be noted that the electroluminescent layer 860 which is a layer having a mixture of an organic compound and an inorganic compound can be formed by various methods. For example, it is possible to use a method of evaporating both an organic compound and an inorganic compound by resistance heating so that the organic compound and the inorganic compound can be co-deposited. Alternatively, it is also possible to use a method of evaporating an organic compound by resistance heating, while at the same time evaporating an inorganic compound by electron beams (EB) so that the organic compound and the inorganic compound can be co-deposited. Further, it is also possible to use a method of evaporating an organic compound by resistance heating, while at the same time depositing an inorganic compound by sputtering so that the organic compound and the inorganic compound can be co-deposited. As a further alternative, a wet method can also be used.

Likewise, the first electrode layer 870 and the second electrode layer 850 can also be formed by a resistance heating evaporation method, an EB evaporation method, a sputtering method, a wet method, or the like. Further, each of the first electrode layer 870 and the second electrode layer 850 can also be formed by the method shown in Embodiment Mode 3: a conductive light-absorbing film is formed on a transposing substrate and irradiated with a laser beam, to be formed selectively over a transposed substrate and processed into a desired shape.

Figure 22C:
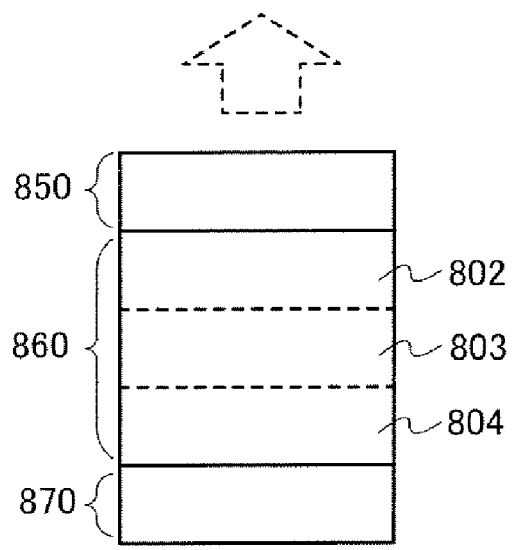
Figure 22D:
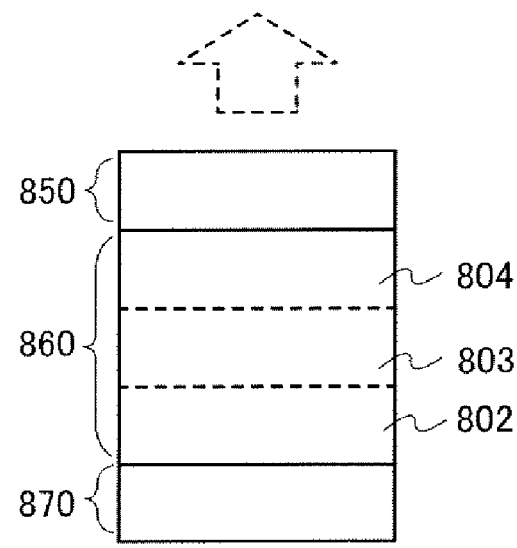

FIG. 22C illustrates a structure in which a reflective electrode layer is used for the first electrode layer 870 and a light-transmitting electrode layer is used for the second electrode layer 850 in FIG. 22A. Light emitted from the light-emitting element is reflected by the first electrode layer 870 so that it passes through the second electrode layer 850. Similarly, FIG. 22D illustrates a structure in which a reflective electrode layer is used for the first electrode layer 870 and a light-transmitting electrode layer is used for the second electrode layer 850 in FIG. 22B. Light emitted from the light-emitting element is reflected by the first electrode layer 870 so that it passes through the second electrode layer 850.

This embodiment mode can be freely combined with another embodiment mode which illustrates a display device having the above-described light-emitting elements. In addition, this embodiment mode can be appropriately combined with any of Embodiment Modes 1 to 5.

Thus, in accordance with this embodiment mode, a contact hole can be formed in the insulating layer without forming a mask, so that the process can be simplified. Further, it is not necessary to perform light-exposure and development after application of a photoresist or the like, so that the cost of materials required for processing can be reduced. Furthermore, the contact hole can be assuredly formed, whereby the yield in manufacturing a semiconductor device and a display device can be improved.

Embodiment Mode 8

This embodiment mode will describe an example of a display device that is manufactured through a more simplified process at low cost. More specifically, a light-emitting display device that uses light-emitting elements as display elements will be described. The structures of light-emitting elements that can be applied to the display elements of the display device of the present invention will be described with reference to FIGS. 23A to 23C and 24A to 24C.

Light-emitting elements using electroluminescence can be roughly classified into light-emitting elements that use an organic compound as a light-emitting material and light-emitting elements that use an inorganic compound as a light-emitting material. Generally, the former light-emitting element is referred to as an organic EL element, while the latter light-emitting element is referred to as an inorganic EL element.

Inorganic EL elements are divided into a dispersion-type inorganic EL element and a thin-film-type inorganic EL element according to their element structures. The difference between the two EL elements lies in that the former dispersion-type inorganic EL element includes an electroluminescent layer in which a particulate light-emitting material is dispersed in a binder, while the latter thin-film-type inorganic EL element includes an electroluminescent layer made of a thin film of a light-emitting material. Although the two light-emitting elements are different in the above points, they have a common characteristic in that both require electrons that are accelerated by a high electric field. As types of light-emission mechanisms, there are luminescence obtained by donor-acceptor recombination which utilizes a donor level and an acceptor level, and local luminescence which utilizes inner-shell electron transition of metal ions. Generally, a dispersion-type inorganic EL element exhibits luminescence through donor-acceptor recombination, while a thin-film-type inorganic EL element exhibits local luminescence in many cases.

A light-emitting material that can be used in the present invention contains a base material and an impurity element which serves as a luminescence center. By changing the impurity element to be contained in the light-emitting material, light emission of various colors can be obtained. As a method of forming a light-emitting material, various methods such as a solid-phase method and a liquid-phase method (a coprecipitation method) can be used. Further, an evaporative decomposition method, a double decomposition method, a method utilizing thermal decomposition reaction of a precursor, a reversed micelle method, a method which combines the foregoing method with high-temperature baking, a liquid-phase method such as a freeze-drying method, or the like can also be used.

A solid-phase method is a method which includes the steps of weighing a base material and an impurity element or a compound containing an impurity element, mixing them in a mortar, and heating and baking them in an electric furnace, so that reaction occurs and the impurity element is contained in the base material. The baking temperature is preferably 700° C. to 1500° C. This is because the solid-phase reaction will not proceed at a too low temperature, whereas the base material will be decomposed at a too high temperature. The baking may be performed in a powder state; however, it is preferably performed in a pellet state. Although the solid-phase method requires baking at a relatively high temperature, the solid-phase method is easy to perform and has high productivity. Thus, it is suitable for mass production.

A liquid-phase method (a coprecipitation method) is a method which includes the steps of reacting a base material or a compound containing a base material with an impurity element or a compound containing an impurity element in a solution, drying them, and baking them. Particles of a light-emitting material are uniformly diffused, whereby reaction can proceed even when the particle size is small and the baking temperature is low.

As a base material of a light-emitting material, sulfide, oxide, or nitride can be used. Examples of sulfide include zinc sulfide (ZnS), cadmium sulfide (CdS), calcium sulfide (CaS), yttrium sulfide ($Y_2S_3$), gallium sulfide ($Ga_2S_3$), strontium sulfide (SrS), and barium sulfide (BaS). Examples of oxide include zinc oxide (ZnO) and yttrium oxide ($Y_2O_3$). Examples of nitride include aluminum nitride (AlN), gallium nitride (GaN), and indium nitride (InN). Further, it is also possible to use zinc selenide (ZnSe), zinc telluride (ZnTe), or ternary mixed crystals such as calcium gallium sulfide ($CaGa_2S_4$), strontium gallium sulfide ($SrGa_2S_4$), and barium gallium sulfide ($BaGa_2S_4$), and the like.

For a luminescence center of an EL element which exhibits local luminescence, the following can be used: manganese (Mn), copper (Cu), samarium (Sm), terbium (Tb), erbium (Er), thulium (Tm), europium (Eu), cerium (Ce), praseodymium (Pr), and the like. It is to be noted that a halogen element such as fluorine (F) or chlorine (Cl) may also be added. A halogen element can function to compensate charges.

Meanwhile, for a luminescence center of an EL element which exhibits luminescence through donor-acceptor recombination, a light-emitting material containing a first impurity element which forms a donor level and a second impurity element which forms an acceptor level can be used. Examples of the first impurity element include fluorine (F), chlorine (Cl), and aluminum (Al). Meanwhile, examples of the second impurity element include copper (Cu) and silver (Ag).

In the case of synthesizing a light-emitting material of an EL element which exhibits luminescence through donor-acceptor recombination by using a solid-phase method, the following steps are performed: weighing a base material, weighing a first impurity element or a compound containing the first impurity element, weighing a second impurity element or a compound containing the second impurity element, mixing them in a mortar, and heating and baking them in an electric furnace. As a base material, the above-described base materials can be used. As a first impurity element or a compound containing the first impurity element, fluorine (F), chlorine (Cl), aluminum sulfide ($Al_2S_3$), or the like can be used, for example. As a second impurity element or a compound containing the second impurity element, copper (Cu), silver (Ag), copper sulfide ($Cu_2S$), silver sulfide ($Ag_2S$), or the like can be used, for example. The baking temperature is preferably 700° C. to 1500° C. This is because the solid-phase reaction will not proceed at a too low temperature, whereas the base material will be decomposed at a too high temperature. The baking may be performed in a powder state; however, it is preferably performed in a pellet state.

In the case of performing solid-phase reaction, it is also possible to use a compound containing the first impurity element and the second impurity element. In that case, the impurity elements can be easily diffused, and solid-phase reaction can easily proceed; therefore, a uniform light-emitting material can be obtained. Further, since unnecessary impurity elements are not be mixed, a light-emitting material with high purity can be obtained. Examples of the compound containing the first impurity element and the second impurity element include copper chloride (CuCl) and silver chloride (AgCl).

It is to be noted that the concentration of the impurity elements with respect to the base material may be 0.01 atomic % to 10 atomic %, preferably 0.05 atomic % to 5 atomic %.

With regard to a thin-film-type inorganic EL element, an electroluminescent layer is a layer containing the above-described light-emitting materials, which can be formed by the following methods: a physical vapor deposition (PVD) method or a chemical vapor deposition (CVD) method, e.g. a vacuum evaporation method such as a resistance heating evaporation method or an electron beam evaporation (EB evaporation) method, a sputtering method, a metal organic CVD method, or a low-pressure hydride transport CVD method; or an atomic layer epitaxy (ALE) method; and the like.

Figure 23A:
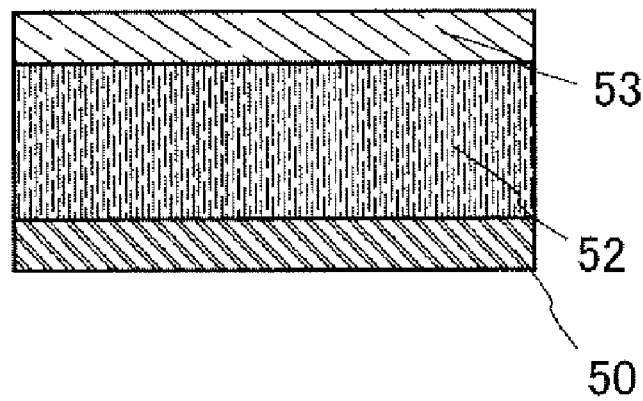
FIGS. 23A to 23C are explanatory views of structures of light-emitting elements which can be applied to the present invention.
Figure 23B:
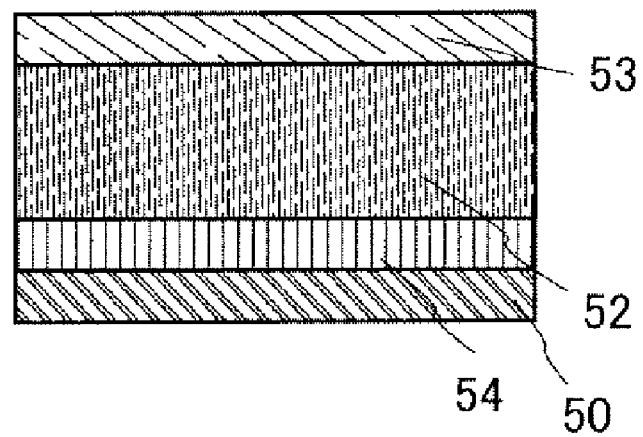
Figure 23C:
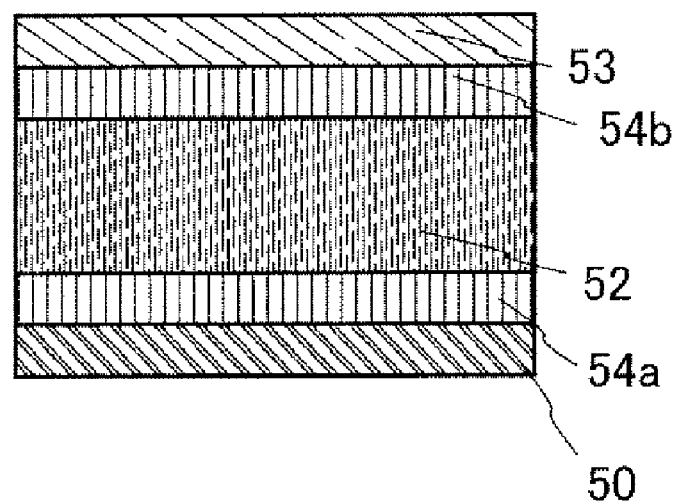

FIGS. 23A to 23C each show an example of a thin-film-type inorganic EL element that can be used as a light-emitting element. Each of the light-emitting elements shown in FIGS. 23A to 23C includes a first electrode layer 50, an electroluminescent layer 52, and a second electrode layer 53.

The light-emitting elements shown in FIGS. 23B and 23C each have a structure in which an insulating layer is provided between the electrode layer and the electroluminescent layer of the light-emitting element shown in FIG. 23A. The light-emitting element shown in FIG. 23B has an insulating layer 54 between the first electrode layer 50 and the electroluminescent layer 52. The light-emitting element shown in FIG. 23C has an insulating layer 54a between the first electrode layer 50 and the electroluminescent layer 52, and an insulating layer 54b between the second electrode layer 53 and the electroluminescent layer 52. As described above, the insulating layer may be provided between one or each of the pair of electrode layers and the electroluminescent layer. In addition, the insulating layer can be either a single layer or a plurality of stacked layers.

Although the insulating layer 54 in FIG. 23B is provided to be in contact with the first electrode layer 50, the insulating layer 54 may also be provided to be in contact with the second electrode layer 53 by reversing the order of the insulating layer and the electroluminescent layer.

In the case of forming a dispersion-type inorganic EL element, a film-form electroluminescent layer is formed by dispersing a particulate light-emitting material in a binder. When particles with a desired size cannot be obtained depending on a method of forming a light-emitting material, the material may be processed into particulate forms by being ground in a mortar or the like. A binder is a substance for fixing a particulate light-emitting material to be in a dispersed state in order to keep the shape of the electroluminescent layer. A light-emitting material is uniformly dispersed and fixed in the electroluminescent layer by the binder.

The electroluminescent layer of the dispersion-type inorganic EL element can be also formed by a droplet discharging method by which an electroluminescent layer can be selectively formed, a printing method (e.g., screen printing or offset printing), a coating method such as a spin coating method, a dipping method, a dispenser method, or the like. The thickness of the electroluminescent layer is not limited to a specific value; however, it is preferably in the range of 10 nm to 1000 nm. In the electroluminescent layer which contains a light-emitting material and a binder, the percentage of the light-emitting material is preferably greater than or equal to 50 wt % and less than or equal to 80 wt %.

Figure 24A:
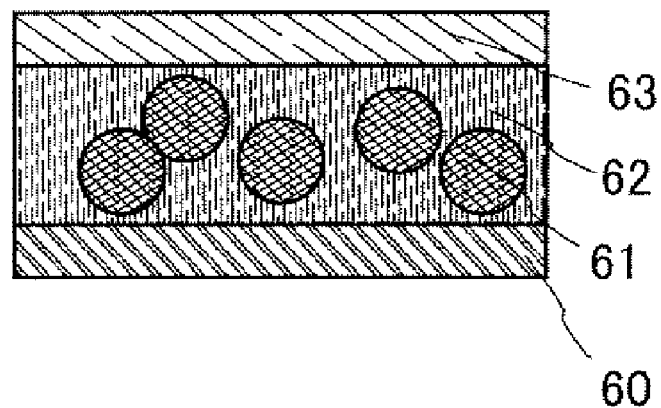
FIGS. 24A to 24C are explanatory views of structures of light-emitting elements which can be applied to the present invention.
Figure 24B:
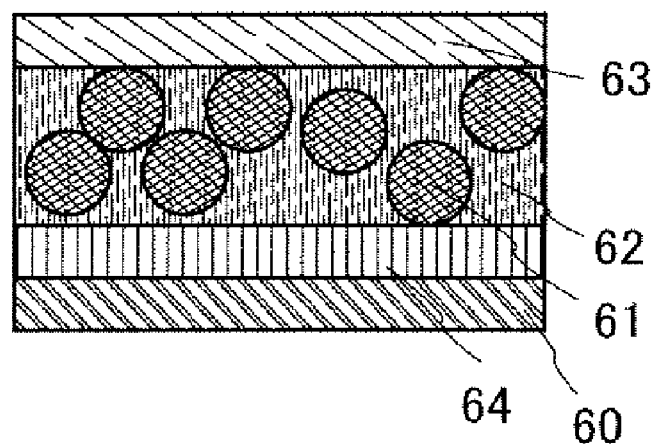
Figure 24C:
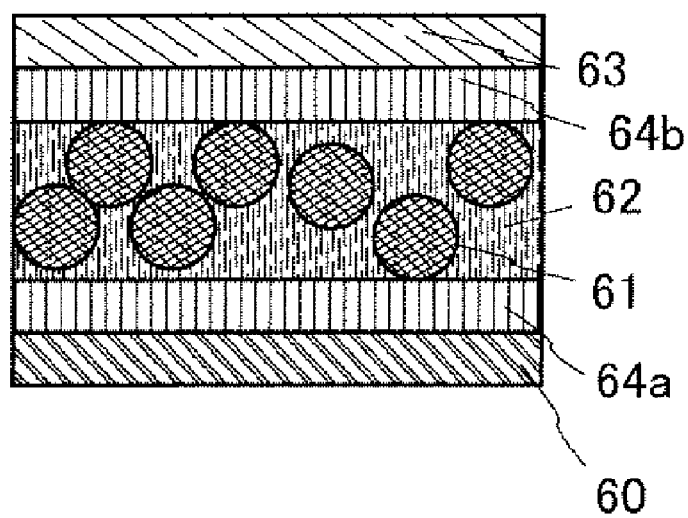

FIGS. 24A to 24C each show an example of a dispersion-type inorganic EL element that can be used as a light-emitting element. The light-emitting element shown in FIG. 24A has a structure in which a first electrode layer 60, an electroluminescent layer 62, and a second electrode layer 63 are stacked, and the electroluminescent layer 62 contains a light-emitting material 61 fixed by a binder.

Each of the first electrode layers 50 and 60 and the second electrode layers 53 and 63 can be formed by the method shown in Embodiment Mode 3: a conductive light-absorbing film is formed on a transposing substrate and irradiated with a laser beam, to be formed selectively over a transposed substrate and processed into a desired shape.

In this embodiment mode, an insulating material can be used as a binder. Either an organic material or an inorganic material can be used, or even a mixed material of an organic material and an inorganic material can be used. As an organic insulating material, the following resins can be used: a polymer having a relatively high dielectric constant such as a cyanoethyl cellulose based resin, a polyethylene resin, a polypropylene resin, a polystyrene based resin, a silicone resin, an epoxy resin, and vinylidene fluoride. Further, it is also possible to use thermally stable high molecular materials such as aromatic polyamide and polybenzimidazole, or a siloxane resin. It is to be noted that a siloxane resin is a resin having the bond of Si—O—Si. Siloxane has a skeletal structure with the bond of silicon (Si) and oxygen (O). As a substituent of siloxane, an organic group containing at least hydrogen (e.g., an alkyl group or aromatic hydrocarbon) is used. Alternatively, a fluoro group may be used as the substituent, or both a fluoro group and an organic group containing at least hydrogen may be used as the substituent. Further, it is also possible to use a resin material such as a vinyl resin (e.g. polyvinyl alcohol or polyvinyl butyral), a phenol resin, a novolac resin, an acrylic resin, a melamine resin, a urethane resin, or an oxazole resin (e.g., polybenzoxazole). When high-dielectric-constant microparticles such as barium titanate ($BaTiO_3$), strontium titanate ($SrTiO_3$), and the like are mixed as appropriate into the above-described resin, the dielectric constant of the material can be controlled.

As an inorganic insulating material contained in the binder, the following materials can be used: silicon oxide ($SiO_x$), silicon nitride ($SiN_x$), silicon containing oxygen and nitrogen, aluminum nitride (AlN), aluminum containing oxygen and nitrogen, aluminum oxide ($Al_2O_3$), titanium oxide ($TiO_2$), $BaTiO_3$, $SrTiO_3$, lead titanate ($PbTiO_3$), potassium niobate ($KNbO_3$), lead niobate ($PbNbO_3$), tantalum oxide ($Ta_2O_5$), barium tantalate ($BaTa_2O_6$), lithium tantalate ($LiTaO_3$), yttrium oxide ($Y_2O_3$), zirconium oxide ($ZrO_2$), and other substances containing an inorganic insulating material. When a high-dielectric-constant inorganic material is mixed into an organic material (by doping or the like), it becomes possible to control the dielectric constant of the electroluminescent layer which contains a light-emitting material and a binder more efficiently, whereby the dielectric constant can be further increased. When a mixed layer of an inorganic material and an organic material is used as a binder to obtain a high dielectric constant, larger charge can be induced by a light-emitting material.

In the manufacturing process, a light-emitting material is dispersed in a solution containing a binder. As a solvent of the solution containing a binder that can be used in this embodiment mode, it is preferable to select a solvent in which a binder material can be dissolved and with which a solution having a viscosity suitable for a method of forming the electroluminescent layer (various wet processes) and a desired film thickness can be formed. An organic solvent or the like can be used. For example, when a siloxane resin is used as a binder, organic solvents such as propylene glycolmonomethyl ether, propylene glycolmonomethyl ether acetate (also referred to as PGMEA), and 3-methoxy-3-methyl-1-butanol (also referred to as MMB) can be used.

The light-emitting elements shown in FIGS. 24B and 24C each have a structure in which an insulating layer is provided between the electrode layer and the electroluminescent layer of the light-emitting element shown in FIG. 24A. The light-emitting element shown in FIG. 24B has an insulating layer 64 between the first electrode layer 60 and the electroluminescent layer 62. The light-emitting element shown in FIG. 24C has an insulating layer 64a between the first electrode layer 60 and the electroluminescent layer 62, and an insulating layer 64b between the second electrode layer 63 and the electroluminescent layer 62. As described above, the insulating layer may be provided between one or each of the pair of electrode layers and the electroluminescent layer. In addition, the insulating layer can be either a single layer or a plurality of stacked layers.

In addition, although the insulating layer 64 is provided to be in contact with the first electrode layer 60 in FIG. 24B, the insulating layer 64 may also be provided to be in contact with the second electrode layer 63 by reversing the order of the insulating layer and the electroluminescent layer.

Although the insulating layers 54 and 64 shown in FIGS. 23B, 23C, 24B and 24C are not particularly limited to certain types, such insulating layers preferably have a high withstand voltage and dense film quality. Further, such insulating layers preferably have a high dielectric constant. For example, the following materials can be used: silicon oxide ($SiO_2$), yttrium oxide ($Y_2O_3$), titanium oxide ($TiO_2$), aluminum oxide ($Al_2O_3$), hafnium oxide ($HfO_2$), tantalum oxide ($Ta_2O_5$), barium titanate ($BaTiO_3$), strontium titanate ($SrTiO_3$), lead titanate ($PbTiO_3$), silicon nitride ($Si_3N_4$), zirconium oxide ($ZrO_2$), and the like. Alternatively, a mixed film of such materials or a stacked film containing two or more of such materials can also be used. Such insulating films can be formed by sputtering, evaporation, CVD, or the like. Alternatively, it is also possible to form an insulating layer by dispersing a particulate insulating material in a binder. The binder material may be formed using a material and method similar to those of the binder contained in the electroluminescent layer. Although the thickness of such an insulating layer is not particularly limited, it is preferably in the range of 10 nm to 1000 nm.

The light-emitting element shown in this embodiment mode emits light when a voltage is applied between the pair of electrode layers which sandwich the electroluminescent layer, and can be operated by either DC driving or AC driving.

Thus, in accordance with this embodiment mode, a contact hole can be formed in the insulating layer without forming a mask, so that the process can be simplified. Further, it is not necessary to perform light-exposure and development after application of a photoresist or the like, so that the cost of materials required for processing can be reduced. Furthermore, the contact hole can be assuredly formed, whereby the yield in manufacturing a semiconductor device and a display device can be improved.

This embodiment mode can be appropriately combined with any of Embodiment Modes 1 to 5.

Embodiment Mode 9

This embodiment mode will describe an example of a display device that is manufactured through a more simplified process at low cost. Specifically, a liquid crystal display device that uses liquid crystal display elements as display elements will be described.

FIG. 19A is a plan view of a liquid crystal display device, and FIG. 19B is a cross-sectional view taken along a line G-H of FIG. 19A.

As shown in FIG. 19A, a pixel region 606 and driver circuit regions 608a and 608b which are scan line driver circuits are sealed between a substrate 600 and a counter substrate 695 with a sealant 692. In addition, a driver circuit region 607 which is a signal line driver circuit constructed using an IC driver is provided over the substrate 600. A transistor 622 and a capacitor 623 are provided in the pixel region 606. A driver circuit having transistors 620 and 621 is provided in the driver circuit region 608b. An insulating substrate similar to those described in the preceding embodiment modes can be used for the substrate 600. Although there is a concern that a substrate made of a synthetic resin may have a low temperature limit in general compared to other substrates, the synthetic resin substrate can be used when the following steps are performed: forming circuit components on a highly heat-resistant substrate and then transferring them to a synthetic resin substrate.

In the pixel region 606, the transistor 622 to serve as a switching element is provided over base films 604a and 604b. In this embodiment mode, a multi-gate thin film transistor (TFT) is used for the transistor 622, which includes a semiconductor layer having impurity regions functioning as source and drain regions, a gate insulting layer, a gate electrode layer having a two-layer structure, and source and drain electrode layers. The source or drain electrode layer is in contact with and electrically connected to the impurity region of the semiconductor layer and a pixel electrode layer 630.

The source or drain electrode layer has a stacked-layer structure. Source or drain electrode layers 644a and 644b are electrically connected to the pixel electrode layer 630 at an opening formed in an insulating layer 615.

In this embodiment mode, openings which expose source and drain regions of the semiconductor layers are formed in a gate insulating layer, an insulating film 611, and an insulating film 612 using a tube as shown in Embodiment modes 1 and 2.

The tube is arranged in an opening formation region of the gate insulating layer, the insulating film 611, and the insulating film 612 so as to be in contact with the insulating film 612. A treatment agent (etching gas or etchant) is discharged (jetted) to the insulating layer 612 through the tube. With the discharged (jetted) treatment agent (etching gas or etchant), the gate insulating layer, the insulating film 611, and the insulating film 612 are selectively removed, so that openings which reach the source and drain regions of the semiconductor layers are formed in the gate insulating layer, the insulating film 611, and the insulating film 612.

In the steps for forming the openings in the gate insulating layer, the insulating film 611, and the insulating film 612, the tube of the present invention may be used so that the openings which reach the source and drain regions of the semiconductor layers may be formed. Alternatively, the openings may be formed in the insulating film 612 that is an upper layer above the source and drain regions of the semiconductor layers using the tube of the present invention, and then, the insulating film 611 and the gate insulating layer may be etched by using the insulating film 612 provided with the openings as a mask, so that the openings which reach the source and drain regions of the semiconductor layers may be formed.

Since the shape of the opening reflects the shape of the tube, the shape of the tube may be selected so that a desired shape of the opening can be obtained. The tube may have a columnar shape (prism, cylinder, or triangular prism) or a needle shape. Further, after the opening is formed, an exposed part of the semiconductor layer at the bottom of the opening may be removed by etching, using the insulating layer provided with the opening as a mask.

In FIGS. 19A and 19B, the tube of the present invention can also be used to form an opening at which the pixel electrode layer 630 and the source or drain electrode layers 644a and 644b are electrically connected. The display device of FIGS. 19A and 19B is an example in which the opening goes through the source or drain electrode layer 644b, and the source or drain electrode layer 644a is exposed at the bottom of the opening.

The source and drain electrode layers are formed in the openings where the source and drain regions of the semiconductor layers are exposed, so that the source and drain regions of the semiconductor layers are electrically connected to the source and drain electrode layers, respectively.

Thin film transistors can be formed by various methods. For example, a crystalline semiconductor film is used as an active layer A gate electrode is provided over the crystalline semiconductor film with a gate insulating film interposed therebetween. Then, the active layer can be doped with an impurity element, using the gate electrode as a mask. In this manner, when the active layer is doped with an impurity element using the gate electrode as a mask, a mask for adding an impurity element is not required. The gate electrode can have either a single-layer structure or a stacked-layer structure. Impurity regions can be formed as high-concentration impurity regions and low-concentration impurity regions by controlling the concentration of the impurity element. A thin film transistor having tow-concentration impurity regions is referred to as a TFT having an LDD (Lightly Doped Drain) structure. Further, the low-concentration impurity regions may be formed to overlap with the gate electrode. A thin film transistor having such a structure is referred to as a TFT having a GOLD (Gate Overlapped LDD) structure. Thin film transistors in this embodiment mode are formed to be an n-channel type by using phosphorus (P) for the impurity regions. When forming p-channel thin film transistors, boron (B) or the like may be used. After that, the insulating films 611 and 612 are formed to cover the gate electrode and the like. Dangling bonds of the crystalline semiconductor film can be terminated by a hydrogen element mixed in the insulating film 611 (and the insulating film 612).

Further, in order to enhance a level of planarity, an insulating layer 615 may be formed as an interlayer insulating layer. The insulating layer 615 can be formed using an organic material, an inorganic material, or a stacked structure of them. For example, the insulating layer 615 can be formed using a material such as silicon oxide, silicon nitride, silicon oxynitride, silicon nitride oxide, aluminum nitride, aluminum oxynitride, aluminum nitride oxide having a higher content of nitrogen than that of oxygen, aluminum oxide, diamond-like carbon (DLC), polysilazane, nitrogen-containing carbon, PSG (phosphosilicate glass), BPSG (borophosphosilicate glass), alumina, and other substances containing an inorganic insulating material. Further, an organic insulating material can also be used. The organic material can be either photosensitive or non-photosensitive. For example, polyimide, acrylic, polyamide, polyimide amide, resist, benzocyclobutene, a siloxane resin, or the like can be used. It is to be noted that a siloxane resin is a resin having the bond of Si—O—Si. Siloxane has a skeletal structure with the bond of silicon (Si) and oxygen (O). As a substituent of siloxane, an organic group containing at least hydrogen (e.g., an alkyl group or aromatic hydrocarbon) is used. Alternatively, a fluoro group may be used as the substituent, or both a fluoro group and an organic group containing at least hydrogen may be used as the substituent.

When a crystalline semiconductor film is used, a pixel region and a driver circuit region can be formed over the same substrate. In that case, transistors in the pixel portion and transistors in the driver circuit region 608b are formed at the same time. Transistors used for the driver circuit region 608b constitute a CMOS circuit. Although the thin film transistors that constitute the CMOS circuit have a GOLD structure, an LDD structure like the transistor 622 can also be used.

The structures of thin film transistors are not limited to those shown in this embodiment mode. For example, thin film transistors in the pixel region may have any of a single-gate structure in which one channel formation region is formed, a double-gate structure in which two channel formation regions are formed, and a triple-gate structure in which three channel formation regions are formed. Further, thin film transistors in the peripheral driver circuit region may also have any of a single-gate structure, a double-gate structure, and a triple-gate structure.

It is to be noted that the present invention can be applied not only to the structures of the thin film transistors shown in this embodiment mode but also to a top-gate structure (e.g., a staggered thin film transistor), a bottom-gate structure (e.g., an inversely staggered thin film transistor), or a dual-gate structure in which two gate electrode layers are provided above and below a channel region with gate insulating films interposed therebetween, and another structure.

Next, an insulating layer 631 called an alignment film is formed so as to cover the pixel electrode layer 630 by a printing method or a droplet discharging method. It is to be noted that when a screen printing method or an offset printing method is used, the insulating layer 631 can be formed selectively. After that, rubbing treatment is performed. This rubbing treatment is not required to be performed depending on modes of liquid crystals, e.g., a VA mode. The same as the insulating layer 631 can be said for an insulating layer 633 functioning as an alignment film. Next, the sealant 692 is formed in a peripheral region 603 of pixels by a droplet discharging method.

Then, a counter substrate 695, which has the insulating layer 633 functioning as the alignment film, a conductive layer 634 functioning as a counter electrode, a colored layer 635 functioning as a color filter, and a polarizer 641 (also referred to as polarizing plate), is attached to the substrate 600 that is a TFT substrate with a spacer 637 interposed therebetween. A gap between the two substrates is provided with a liquid crystal layer 632. The liquid crystal display device in this embodiment mode is a transmissive type. Therefore, a polarizer (a polarizing plate) 643 is also provided on the side opposite to the surface of the substrate 600 having elements. The polarizer can be provided on the substrate with an adhesive layer. In addition, a filler may be mixed in the sealant and further, a light-shielding film (black matrix) or the like may be formed on the counter substrate 695. When the liquid crystal display device is formed to be a full-color display device, color filters and the like may be formed using materials which exhibit red (R), green (G), and blue (B) colors. On the other hand, when the liquid crystal display device is formed to be a monochrome display device, colored layers are not required. Alternatively, a colored layer which exhibits at least one color may be formed.

It is to be noted that when a successive additive color mixture method (a field sequential method) is employed in which ROB light-emitting diodes (LEDs) and the like are used as a backlight and color display is performed by a time division method, color filters are not required to be provided. The black matrix, which can reduce reflection of external light by wirings of transistors or CMOS circuits, is preferably provided so as to overlap with the transistors or the CMOS circuits. It is to be noted that the black matrix may also be provided so as to overlap with a capacitor, and in such a case, reflection of light by metal films of the capacitor can be prevented.

The liquid crystal layer can be formed by a dispenser method (a dripping method) or an injection method in which the substrate 600 having elements and the counter substrate 695 are bonded first and then liquid crystals are injected into a space therebetween by using a capillary phenomenon. When handling a large-sized substrate to which the injection method is difficult to be applied, the dripping method is preferably used.

The spacer can be provided by dispersing particles with a size of several μm. In this embodiment mode, however, a method of forming a resin film over the entire surface of the substrate, followed by etching is employed. After applying such a spacer material by a spinner, the material is subjected to light-exposure and development treatment, so that a desired pattern is formed. Further, the material is heated at 150° C. to 200° C. in a clean oven or the like so as to be hardened. Although the shape of the spacer formed in the above manner can vary depending on the conditions of light-exposure and development treatment, the shape of the spacer is preferably a columnar shape with a flat top. This is because mechanical strength that is high enough as a liquid crystal display device can be secured when attaching the counter substrate to the TFT substrate. The shape of the spacer can also be conic or pyramidal, but the present invention is not limited thereto.

Next, an FPC 694 which is a connection wiring board is connected to terminal electrode layers 678a and 678b that are electrically connected to the pixel region in an external terminal connection region 602, with an anisotropic conductive layer 696 interposed therebetween. The FPC 694 functions to transmit signals and potentials from outside. Through the above process, a liquid crystal display device having a display function can be manufactured.

The wirings and the gate electrode layers of the transistors, the pixel electrode layer 630, and the conductive layer 634 functioning as the counter electrode layer can be formed using the following materials: indium tin oxide (ITO), indium zinc oxide (IZO) in which zinc oxide (ZnO) is mixed with indium oxide, a conductive material in which silicon oxide ($SiO_2$) is mixed with indium oxide, organic indium, organic tin, indium oxide containing tungsten oxide, indium zinc oxide containing tungsten oxide, indium oxide containing titanium oxide, indium tin oxide containing titanium oxide, or the like. Alternatively, it is also possible to use metals such as tungsten (W), molybdenum (Mo), zirconium (Zr), hafnium (Hf), vanadium (V), niobium (Nb), tantalum (Ta), chromium (Cr), cobalt (Co), nickel (Ni), titanium (Ti), platinum (Pt), aluminum (Al), copper (Cu), and silver (Ag), or an alloy or nitride of such metals.

A retardation plate may also be provided between the polarizing plate and the liquid crystal layer.

Although a TN liquid crystal panel is shown in this embodiment mode, the above-described process can be similarly applied to liquid crystal panels of other modes. For example, this embodiment mode can be applied to a liquid crystal panel of a horizontal electric filed mode in which liquid crystals are aligned parallel to the glass substrate by application of an electric filed. Further, this embodiment mode can also be applied to a VA (Vertical Alignment) mode liquid crystal panel.

Figure 37:
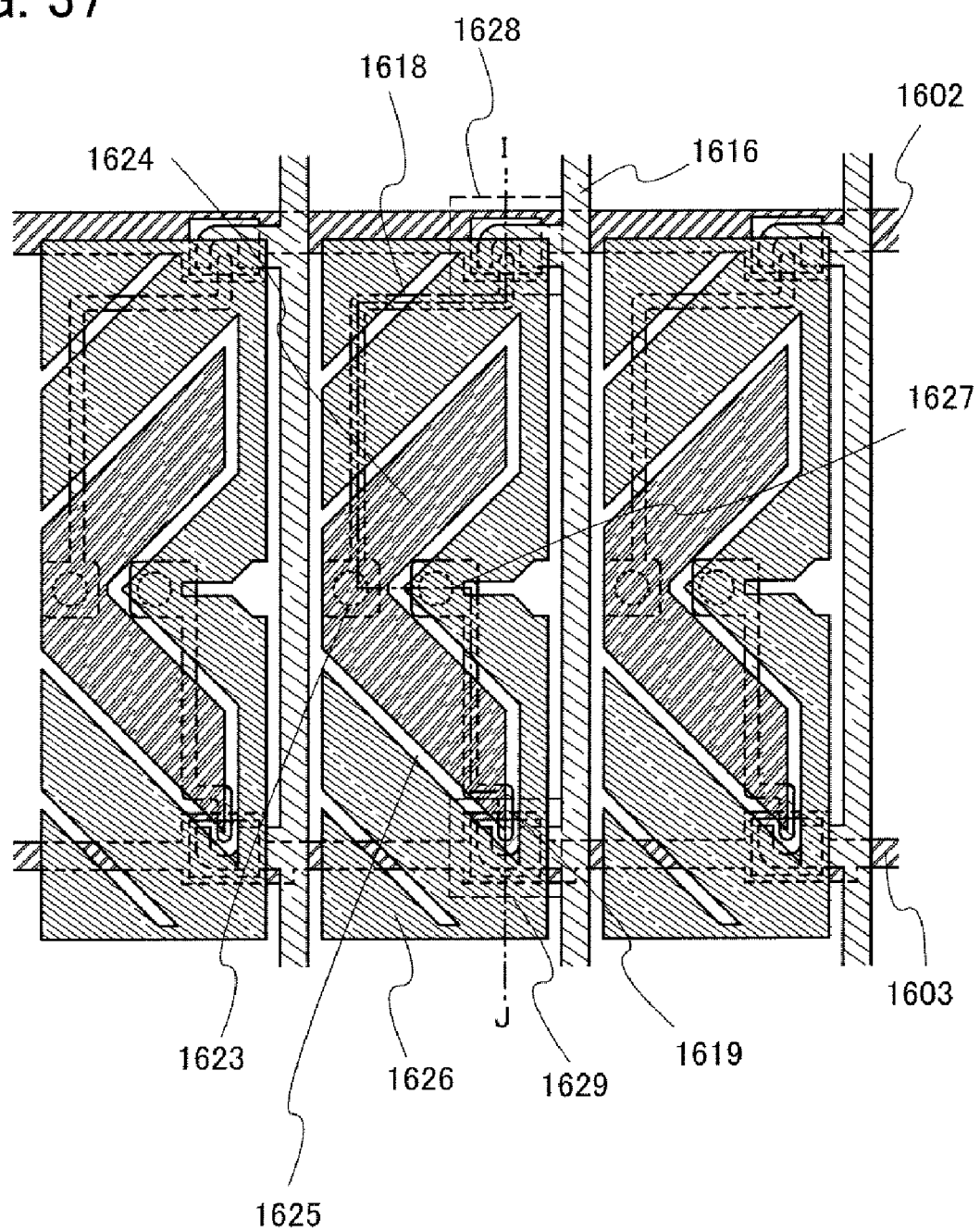
FIG. 37 is an explanatory view of a display device of the present invention.
Figure 38:
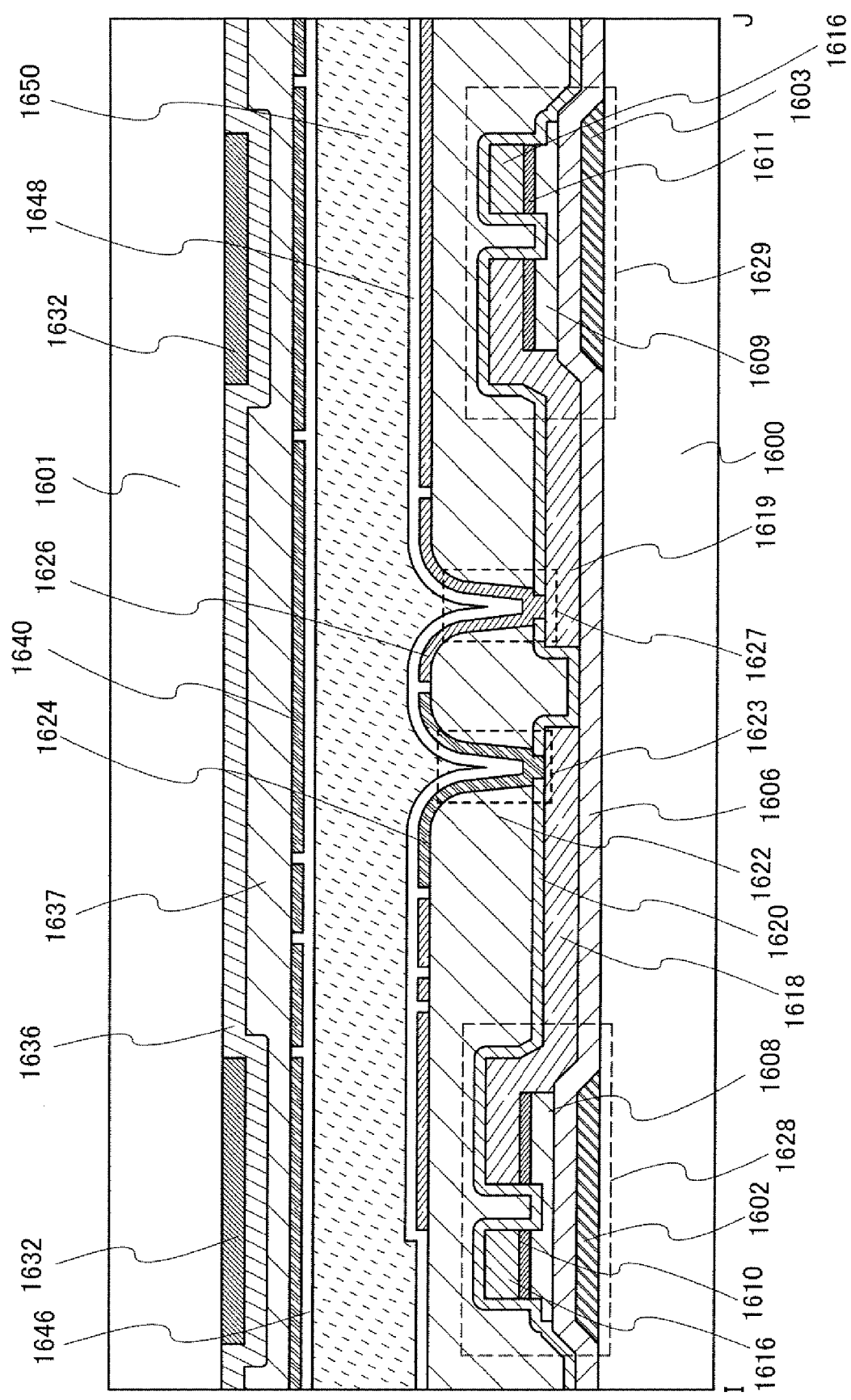
FIG. 38 is an explanatory view of a display device of the present invention.

FIGS. 37 and 38 each show the pixel structure of a VA mode liquid crystal panel. FIG. 37 is a plan view and FIG. 38 shows a cross-sectional structure taken along line I-J of FIG. 37. Description below will be given with reference to both the drawings.

In this pixel structure, a plurality of pixel electrodes are provided in one pixel, and a TFT is connected to each pixel electrode. The plurality of TFTs are constructed so as to be driven by different gate signals. That is, signals that are applied to individual pixel electrodes in a multi-domain pixel are controlled independently of each other.

A pixel electrode layer 1624 is connected to a TFT 1628 through a wiring layer 1618 at an opening (a contact hole) 1623. In addition, a pixel electrode layer 1626 is connected to a TFT 1629 through a wiring layer 1619 at an opening (a contact hole) 1627. A gate wiring layer 1602 of the TFT 1628 and a gate electrode layer 1603 of the TFT 1629 are separated so as to be supplied with different gate signals. On the other hand, a wiring layer 1616 functioning as a data line is used in common by both the TFTs 1628 and 1629. The opening (contact hole) 1623 can be formed using the tube of the present invention.

Each of the pixel electrode layers 1624 and 1626 can be formed by the method shown in Embodiment Mode 3: a conductive light-absorbing film is formed on a transposing substrate and irradiated with a laser beam, to be formed selectively over a transposed substrate and processed into a desired shape. In this manner, the use of the present invention can simplify a process and prevent loss of materials; therefore, a display device can be manufactured at low cost with high productivity.

Figure 39:
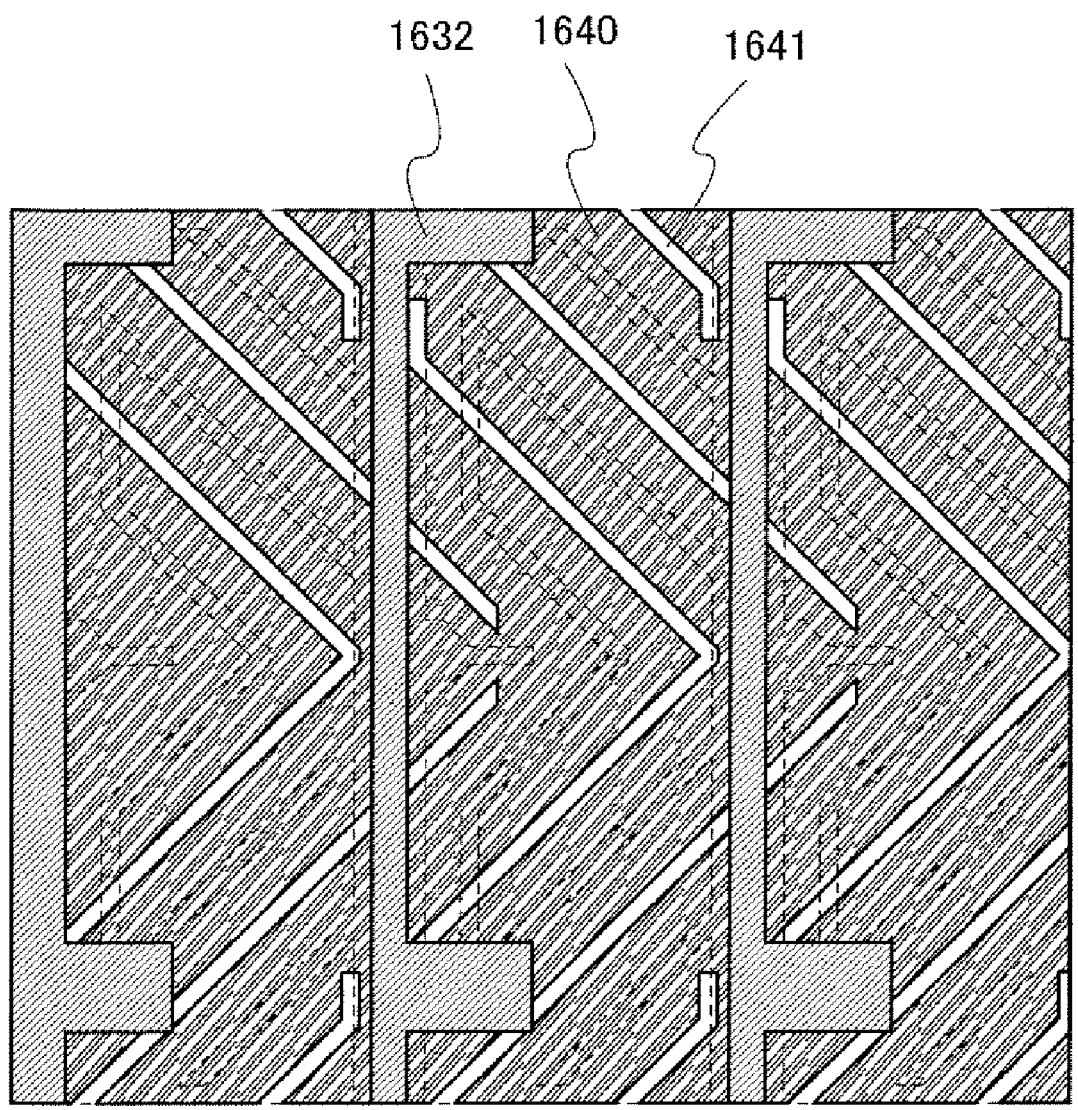
FIG. 39 is an explanatory view of a display device of the present invention.

The pixel electrode layers 1624 and 1626 have different shapes, and they are separated by a slit 1625. The pixel electrode layer 1626 is formed so as to surround the pixel electrode layer 1624 that expands into a V-shape. Application timings of voltages to the pixel electrode layers 1624 and 1626 are varied by the TFTs 1628 and 1629, whereby the orientation of liquid crystals is controlled. The TFT 1628 includes the gate wiring layer 1602, a gate insulating layer 1606, a semiconductor layer 1608, a semiconductor layer 1610 having one conductivity type, a wiring layer 1616 and a wiring layer 1618 over the substrate 1600. The TFT 1629 includes the gate wiring layer 1603, the gate insulating layer 1606, a semiconductor layer 1609, a semiconductor layer 1611 having one conductivity type, a wiring layer 1616 and a wiring layer 1619 over the substrate 1600. An insulating layer 1620 and an insulating layer 1622 are formed over the wiring layers 1616, 1618 and 1619. A counter substrate 1601 is provided with a light-shielding film 1632, a colored layer 1636, and a counter electrode layer 1640. In addition, a planarization film 1637 is formed between the colored layer 1636 and the counter electrode layer 1640 so as to prevent disorder of orientation of the liquid crystals of a liquid crystal layer 1650. FIG. 39 shows the structure of the counter substrate side. The counter electrode layer 1640 is used in common by different pixels and has a slit 1641. The slit 1641 and the slit 1625 on the side of the pixel electrode layers 1624 and 1626 are arranged so as to alternately engage with each other, whereby an oblique electric field can be effectively generated to control the orientation of liquid crystals. Accordingly, the orientation of the liquid crystals can be varied in different places, so that the viewing angle is widened. An alignment film 1648 is formed on the pixel electrode layer 1626 and an alignment film 1646 is formed on the counter electrode layer 1640.

As described above, a liquid crystal panel can be manufactured by using a composite material of an organic compound and an inorganic compound for a pixel electrode layer. When such a pixel electrode layer is used, it is not necessary to use a transparent conductive film containing indium as a main component, and bottleneck of materials can be overcome.

This embodiment mode can be appropriately combined with Embodiment Modes 1 to 3.

Thus, in accordance with this embodiment mode, a contact hole can be formed in the insulating layer without forming a mask, so that the process can be simplified. Further, it is not necessary to perform light-exposure and development after application of a photoresist or the like, so that the cost of materials required for processing can be reduced. Furthermore, the contact hole can be assuredly formed, whereby the yield in manufacturing a semiconductor device and a display device can be improved.

Embodiment Mode 10

This embodiment mode will describe an example of a display device that is manufactured through a more simplified process at low cost. More specifically, a liquid crystal display device that uses liquid crystal display elements as display elements will be described.

Figure 18:
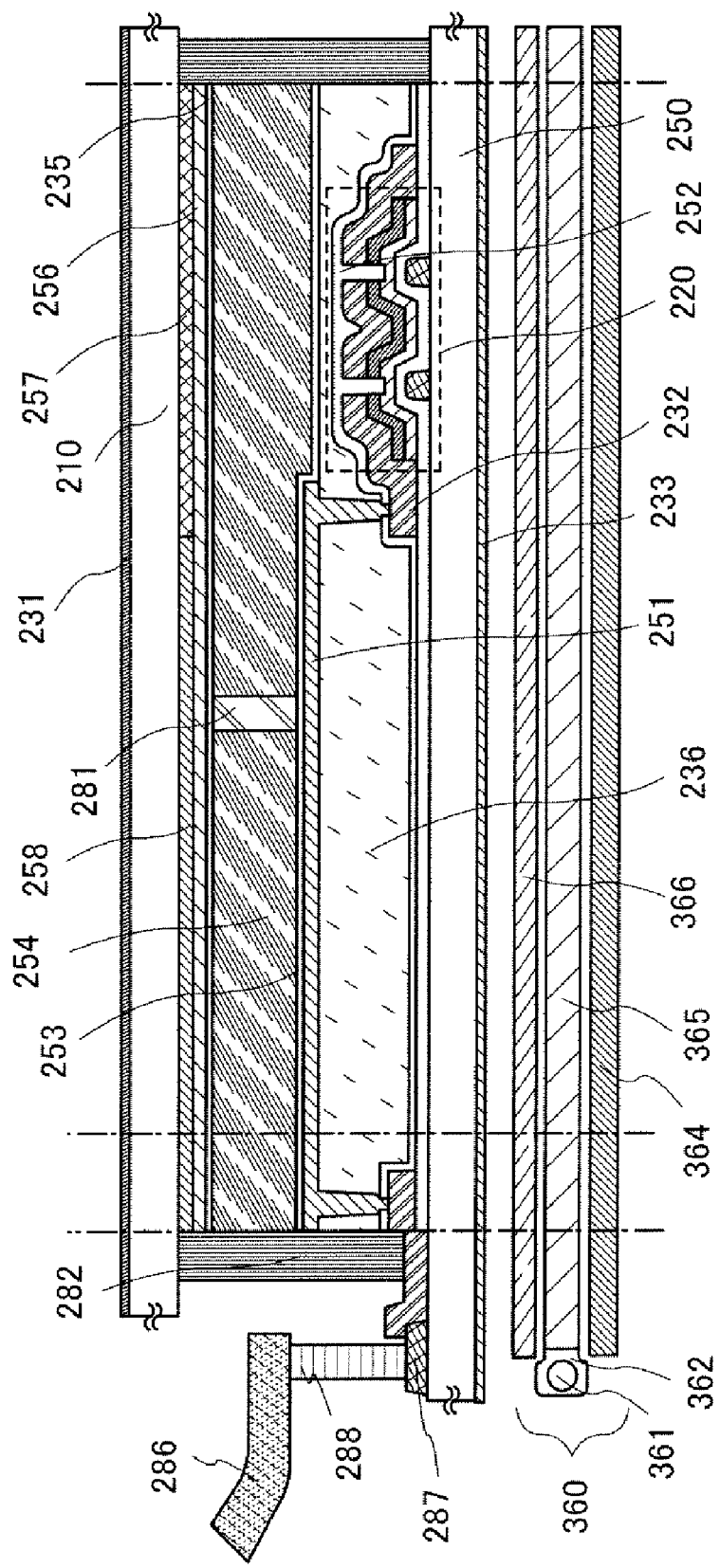
FIG. 18 is an explanatory view of a display device of the present invention.

A display device shown in FIG. 18 includes, over a substrate 250, a transistor 220 which is an inversely staggered thin film transistor, a pixel electrode layer 251, insulating layers 252 and 253, a liquid crystal layer 254, a spacer 281, an insulating layer 235, a counter electrode layer 256, a color filter 258, a black matrix 257, a counter substrate 210, and polarizing plates (polarizers) 231 and 233 in a pixel region; and includes a sealant 282, a terminal electrode layer 287, an anisotropic conductive layer 288, and an FPC 286 in a sealing region.

Each of a gate electrode layer, a semiconductor layer, a source electrode layer, and a drain electrode layer of the transistor 220 which is the inversely staggered thin film transistor manufactured in this embodiment mode as well as the pixel electrode 251 can be formed by the method shown in Embodiment Mode 3: a light-absorbing film of a conductive material or a semiconductor material is formed on a transposing substrate and irradiated with a laser beam, to be formed selectively over a transposed substrate and processed into a desired shape. In this manner, the use of the present invention can simplify a process and prevent loss of materials; therefore, a display device can be manufactured at low cost with high productivity.

In this embodiment mode, an amorphous semiconductor layer is used as a semiconductor layer, and a semiconductor layer having one conductivity type may be formed as needed. In this embodiment mode, a semiconductor layer and an n-type amorphous semiconductor layer that is a semiconductor layer having one conductivity type are stacked. When an n-type semiconductor layer is formed, an n-channel thin film transistor with an NMOS structure can be obtained; when a p-type semiconductor layer is formed, a p-channel thin film transistor with a PMOS structure can be obtained. Further, it is also possible to form a CMOS structure having an n-channel thin film transistor and a p-channel thin film transistor.

In order to impart a conductivity type to the semiconductor layer, the semiconductor layer may be doped with an element which imparts a conductivity type so that impurity regions are formed in the semiconductor layer, whereby an n-channel thin film transistor or a p-channel thin film transistor can be formed. Instead of forming an n-type semiconductor layer, it is also possible to impart a conductivity type to the semiconductor layer by performing plasma treatment with a $PH_3$ gas.

In this embodiment mode, the transistor 220 is an inversely staggered n-channel thin film transistor. It is also possible to use a channel-protective inversely staggered thin film transistor in which a protective layer is provided over a channel region of a semiconductor layer.

Next, the structure of a backlight unit 360 will be described. The backlight unit 360 includes a light source 361 which emits light, such as a cold cathode tube, a hot cathode tube, a light emitting diode, an inorganic EL element, or an organic EL element; a lamp reflector 362 which efficiently guides light to a light guide plate 365; the light guide plate 365 which totally reflects light and guides the light to the entire plane; a diffusion plate 366 which reduces unevenness of luminance; and a reflection plate 364 which reuses light that has leaked to the bottom side of the light guide plate 365.

A control circuit for controlling the luminance of the light source 361 is connected to the backlight unit 360. The luminance of the light source 361 can be controlled by signals supplied from the control circuit.

In FIG. 18 of this embodiment mode, a contact hole (opening) which reaches a source or drain electrode layer 232 is formed in the insulating layers 252 and 236 using a tube as shown in Embodiment Modes 1 and 2.

The tube is arranged so as to be embedded in the insulating layer 236, and a first opening is formed in the insulating layer 236 by physical force. Then, an etching gas is jetted from the tube to remove the insulating layer 252 selectively, so that a second opening is formed. Thus, a contact hole (opening)

which reaches the source or drain electrode layer 232 can be formed in the insulating layers 252 and 236.

Since the shape of the opening reflects the shapes of the tube and its discharging outlet for discharging an etching substance, the shape of the tube may be selected so that a desired shape of the opening can be obtained. The tube may have a columnar shape (prism, cylinder, or triangular prism) or a needle shape. The depth of the opening can be determined by force at a time when the tube is provided and intensity of the film on which the tube is placed. In addition, the depth in a thickness direction can also be determined by setting etching conditions such as etching time. When a needle-shaped tube whose end has a sharp point is provided so as to be partially embedded in the conductive layer, an opening with a recessed portion in the conductive layer can be formed. Further, after the opening is formed, an exposed part of the conductive layer at the bottom of the opening may be removed by etching, using the insulating layer provided with the opening as a mask.

In the present invention, the tube is arranged to be in contact with the insulating layer in the opening formation region. Therefore, the opening formation region of the insulating layer can be provided physically, so that the opening can be assuredly formed in a desired position. Therefore, a semiconductor device and a display device can be manufactured with high yield by using the present invention.

According to the present invention, the opening can be selectively formed in a thin film without using a photolithography step. Therefore, the number of steps and materials can be reduced.

Next, the pixel electrode layer 251 is formed in the opening where the source or drain electrode layer is exposed, so that the source or drain electrode layer can be electrically connected to the pixel electrode layer 251.

Further, after the opening is formed in the insulating layers 252 and 236 using the tube of the present invention, a material for forming a film (such as a conductive composition) in a liquid state may be discharged to the opening through the tube to form the pixel electrode layer 251. With a minute opening, it may be difficult to fill the opening assuredly with a liquid material for forming a film by the surface tension; however, in the present invention, the opening is assuredly filled with a material for forming a film by the tube stuck into the opening, and thus, a film can be formed without a defective shape.

This embodiment mode can be appropriately combined with Embodiment Modes 1 to 3.

Thus, in accordance with this embodiment mode, a contact hole can be formed in the insulating layer without forming a mask, so that the process can be simplified. Further, it is not necessary to perform light-exposure and development after application of a photoresist or the like, so that the cost of materials required for processing can be reduced. Furthermore, the contact hole can be assuredly formed, whereby the yield in manufacturing a semiconductor device and a display device can be improved.

Embodiment Mode 11

This embodiment mode will describe an example of a display device that is manufactured through a more simplified process at low cost.

Figure 21:
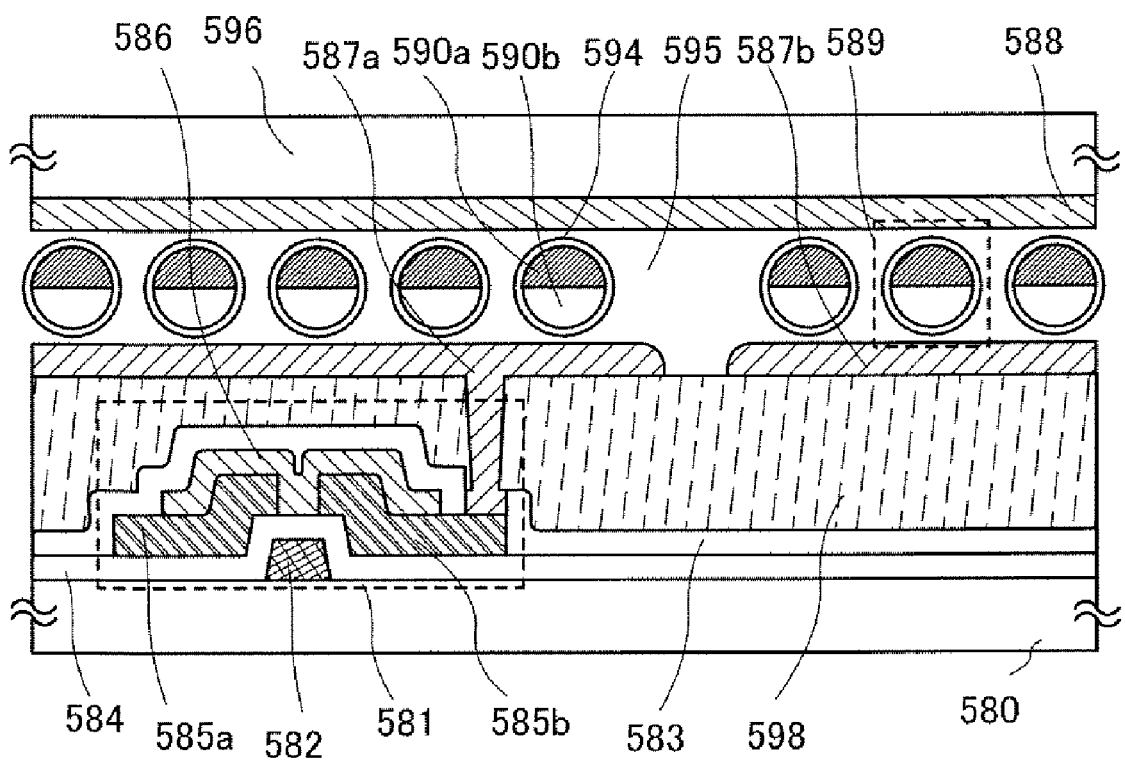
FIG. 21 is an explanatory view of a display device of the present invention.

FIG. 21 shows active matrix electronic paper which applies the present invention. Although an active matrix structure is shown in FIG. 21, the present invention can also be applied to a passive matrix structure.

A twist ball display method can be applied to the electronic paper. A twist ball display method is a method in which spherical particles each colored in black and white are arranged between a first electrode layer and a second electrode layer, and a potential difference is generated between the first electrode layer and the second electrode layer so as to control the direction of the spherical particles, whereby display is performed.

A transistor 581 over a substrate 580 is an inverse coplanar thin film transistor and includes a gate electrode layer 582, a gate insulating layer 584, wiring layers 585a and 585b, and a semiconductor layer 586. In addition, the wiring layer 585b is in contact with and electrically connected to first electrode layers 587a and 587b at an opening formed in insulating layers 583 and 598. Between the first electrode layers 587a and 587b and a second electrode layer 588 on a counter substrate 596, spherical particles 589 each having a black region 590a and a white region 590b are provided, which are surrounded by a cavity 594 filled with a liquid. The circumference of the spherical particles 589 is filled with a filler 595 such as resin (FIG. 21).

In this embodiment mode, each of the gate electrode layer, the semiconductor layer, the source electrode layer, the drain electrode layer, the electrode layer, and the like can be formed by the method shown in Embodiment Mode 3: a conductive light-absorbing film is formed on a transposing substrate and irradiated with a laser beam, to be formed selectively over a transposed substrate and processed into a desired shape. In this manner, the use of the present invention can simplify a process and prevent loss of materials; therefore, cost reduction can be achieved.

In this embodiment mode, an opening (contact hole) which reaches the wiring layer 585b is formed in the insulating layers 583 and 598 using a tube as shown in Embodiment Modes 1 and 2.

The tube is arranged so as to be embedded in the insulating layer 598, and a first opening is formed in the insulating layer 598 by physical force. Then, an etching gas is jetted from the tube to remove the insulating layer 583 selectively, so that a second opening is formed. Thus, a contact hole (opening) which reaches the wiring layer 585b can be formed in the insulating layers 583 and 598.

Since the shape of the opening reflects the shapes of the tube and its discharging outlet for discharging an etching substance, the shape of the tube may be selected so that a desired shape of the opening can be obtained. The tube may have a columnar shape (prism, cylinder, or triangular prism) or a needle shape. The depth of the opening can be determined by force at a time when the tube is provided and intensity of the film on which the tube is placed. In addition, the depth in a thickness direction can also be determined by setting etching conditions such as etching time. This embodiment mode is an example in which etching conditions are controlled so that the opening in the insulating layer 583 is wider than that in the insulating layer 598. When a needle-shaped tube whose end has a sharp point is provided so as to be partially embedded in the conductive layer, an opening with a recessed portion in the conductive layer can be formed. Further, after the opening is formed, an exposed part of the conductive layer at the bottom of the opening may be removed by etching, using the insulating layer provided with the opening as a mask.

In the present invention, the tube is arranged to be in contact with the insulating layer in the opening formation region. Therefore, the opening formation region of the insulating layer can be provided physically, so that the opening can be assuredly formed in a desired position. Therefore, a semiconductor device and a display device can be manufactured with high yield by using the present invention.

According to the present invention, the opening can be selectively formed in a thin film without using a photolithography step. Therefore, the number of steps and materials can be reduced.

Next, the first electrode layer 587a is formed in the opening where the wiring layer 585b is exposed, so that the wiring layer 585b can be electrically connected to the first electrode layer 587a.

Further, after the opening is formed in the insulating layers 583 and 598 using the tube of the present invention, a material for forming a film (such as a conductive composition) in a liquid state may be discharged to the opening through the tube to form the first electrode layer 587a. With a minute opening, it may be difficult to fill the opening assuredly with a liquid material for forming a film by the surface tension; however, in the present invention, the opening is assuredly filled with a material for forming a film by the tube stuck into the opening, and thus, a film can be formed without a defective shape.

Instead of twist balls, an electrophoretic element can also be used. In that case, transparent liquid and microcapsules with a diameter of about 10 μm to 200 μm which contain positively charged white microparticles and negatively charged black microparticles are used. When an electric field is applied to the microcapsules by the first and second electrode layers, the white and black microparticles move in directions opposite to each other, whereby white or black can be displayed. A display element utilizing such a principle is an electrophoretic display element, which is generally called electronic paper. The electrophoretic display element has higher reflectivity than a liquid crystal display element. Therefore, it does not require an auxiliary light, consumes low power, and a display portion can be recognized even in a dim place. In addition, even when power is not supplied to the display portion, an image that has been displayed once can be retained. Therefore, even when a display device having a display function is put away from a radio source, an image that has been displayed once can be retained.

The transistor may have any structure as long as it can function as a switching element. Further, a semiconductor layer can be formed using various semiconductors such as an amorphous semiconductor, a crystalline semiconductor a polycrystalline semiconductor, and a microcrystalline semiconductor. It is also possible to form an organic transistor using an organic compound.

Although a display device with an active matrix structure is specifically described in this embodiment mode, the present invention can also be applied to a passive matrix display device. For a passive matrix display device also, a wiring layer, an electrode layer, and the like can be formed by the method shown in Embodiment Mode 3: a conductive light-absorbing film is formed on a transposing substrate and irradiated with a laser beam, to be formed selectively over a transposed substrate and processed into a desired shape.

This embodiment mode can be appropriately combined with any of Embodiment Modes 1 to 3.

Thus, in accordance with this embodiment mode, a contact hole can be formed in the insulating layer without forming a mask, so that the process can be simplified. Further, it is not necessary to perform light-exposure and development after application of a photoresist or the like, so that the cost of materials required for processing can be reduced. Furthermore, the contact hole can be assuredly formed, whereby the yield in manufacturing a semiconductor device and a display device can be improved.

Embodiment Mode 12

Next, an example where driver circuits are mounted on a display panel that is manufactured in accordance with Embodiment Modes 4 to 11 will be described.

First, a display device formed using a COG method will be described with reference to FIG. 26A. A pixel portion 2701 which displays information such as characters and images is formed over a substrate 2700. A substrate having a plurality of driver circuits is cut into rectangles, and driver circuits (also referred to as driver ICs) 2751 obtained thereby are mounted on the substrate 2700. FIG. 26A shows an example where a plurality of driver ICs 2751 are provided and FPCs 2750 are mounted on the ends of the driver ICs 2751. Further, it is also possible to provide a single driver IC with a length after cutting approximately equal to the length of a side of the pixel portion on the signal line side, and to mount a tape on the end of the driver IC.

Alternatively, a TAB method may also be used. In that case, as shown in FIG. 26B, a plurality of tapes may be attached to a display panel, and driver ICs may be mounted on the tapes. It is also possible to mount a single driver IC on a single tape just as in the case of the COG method. In that case, it is preferable to use a metal piece or the like for fixing the driver IC for reinforcement purposes.

In order to improve productivity, the above-described driver ICs that are mounted on the display panel are preferably formed in plural numbers over a rectangular substrate with one side of 300 mm to 1000 mm.

That is, a plurality of circuit patterns, each of which has a driver circuit portion and input/output terminals as one unit, may be formed over a substrate and the circuit patterns may be divided finally. The length of a long side of a driver IC is determined in consideration of the length of one side of the pixel portion or the pixel pitch. For example, a driver IC may be formed to be a rectangle with a long side of 15 mm to 80 mm and a short side of 1 mm to 6 mm. Alternatively, a driver IC may be formed to have a length equal to the length of one side of the pixel portion or the sum of the lengths of one side of the pixel portion and one side of each driver circuit.

The advantage of providing driver ICs, when compared to IC chips, in the external dimensions is the length of a long side. When driver ICs each having a long side of 15 mm to 80 mm are used, the number of the driver ICs required to be mounted corresponding to a pixel portion can be suppressed compared to the case of using IC chips. Therefore, production yield can be improved. Further, when driver ICs are formed over a glass substrate, there is no restriction on the shape of a base substrate. Therefore, productivity is not lowered. This is a great advantage compared to the case of forming IC chips out of a circular silicon wafer.

Further, when a scan line driver circuit 3702 is formed over the same substrate as the pixel portion as shown in FIG. 25B, driver ICs having signal line driver circuits are provided in the external region of a pixel portion 3701. These driver ICs are driver circuits on the signal line side. In order to form a pixel region that can perform RGB full-color display, 3072 signal lines are required for the XGA class and 4800 signal lines are required for the UXGA class. The signal lines of such numbers are gathered per block at the end of the pixel portion 3701, and lead wires are formed. The lead wires are gathered in accordance with the pitch of external terminals of the driver ICs.

Driver ICs are preferably formed by using a crystalline semiconductor over a substrate. Such a crystalline semiconductor is preferably formed by CW laser irradiation. Therefore, a CW solid-state laser or gas laser is used as a laser oscillator which can generate the CW laser beam. Using a CW laser can form a polycrystalline semiconductor layer with few crystal defects and large grain size to form a transistor. Further, excellent mobility and response speed can be achieved, and therefore, high-speed driving is possible, and the operation frequency of elements can be improved compared to conventional techniques. Further, because of fewer variations in characteristics, high reliability can be achieved. In order to further improve the operation frequency, it is preferable to control the channel length direction of transistors and laser scan direction to be the same direction. This is because the highest mobility can be obtained when the channel length direction of transistors and the laser scan direction with respect to the substrate are approximately in parallel with each other (preferably, −30 to 30 degrees, inclusive) in the laser crystallization process with a CW laser. It is to be noted that a channel length direction is the same direction as a current flow direction, i.e., the direction in which charges move in the channel formation region. A transistor formed in this manner has an active layer formed of a polycrystalline semiconductor layer whose crystal grains extend in the channel direction. This means that crystal grain boundaries are formed roughly along the channel direction.

In performing laser crystallization, the width of laser beam is preferably reduced to a large degree. Specifically, the width of the laser beam (beam spot) is preferably reduced to about 1 mm to 3 mm, inclusive, which is equal to the length of the short side of the driver IC. In addition, in order to secure sufficient and efficient energy density for an irradiation object, an irradiation region of the laser beam preferably has a linear form. It is to be noted that a "linear form" herein does not mean a line in a strict sense but means a rectangle or a prolate ellipsoid with an aspect ratio of two or more (preferably, 10 to 10000, inclusive). In this manner, when the width of the laser beam (beam spot) is made equal to the length of the short side of a driver IC, a method of manufacturing a display device with improved productivity can be provided.

It is also possible to form both the scan line driver circuit and the signal line driver circuit using driver ICs as shown in FIGS. 26A and 26B. In that case, driver ICs with different specifications are preferably used for the scan line driver circuit and the signal line driver circuit.

In the pixel region, signal lines and scan lines intersect with each other to form a matrix, and a transistor is formed at each intersection. In the present invention, TFTs whose channels are formed from an amorphous semiconductor or a semi-amorphous semiconductor are used as the transistors disposed in the pixel region. An amorphous semiconductor is formed by a plasma CVD method, a sputtering method, or the like. A semi-amorphous semiconductor can be formed by a plasma CVD method at a temperature less than or equal to 300° C. When a semi-amorphous semiconductor is used, transistors with a desired thickness can be formed in a short time even over a non-alkali glass substrate having external dimensions of, for example, 550 mm×650 mm. Such a technique is effective for manufacturing a display device with a large display screen. A semi-amorphous TFT whose channel formation region is formed from SAS can obtain an electron field-effect mobility of 2 $cm^2$/V·sec to 10 $cm^2$/V·sec. Further, using the present invention can form a desired pattern with high controllability, and therefore, minute wirings without defects such as a short circuit can be stably formed. Thus, a display panel which can realize a system-on-panel can be manufactured.

When TFTs whose semiconductor layers are formed from SAS are used, a scan line driver circuit can also be formed over the same substrate as a pixel portion. Meanwhile, when TFTs whose semiconductor layers are formed from AS are used, both a scan line driver circuit and a signal line driver circuit are preferably formed using driver ICs.

In that case, driver ICs with different specifications are preferably used for the scan line driver circuit and the signal line driver circuit. For example, although transistors that constitute the scan line driver IC are required to have a withstand voltage of about 30 V, they require a driving frequency less than or equal to 100 kHz. Therefore, not a very high-speed operation is required. Thus, the transistors that constitute the scan line driver IC are preferably designed to have a sufficiently long channel (L). On the other hand, although it is sufficient when transistors that constitute the signal line driver IC have a withstand voltage of about 12 V, they require a driving frequency of about 65 MHz at 3 V, and thus require a high-speed operation. Therefore, the channel length and the like of the transistors that constitute the driver ICs are preferably designed at the micron scale.

A method for mounting the driver ICs is not particularly limited, and a COG method, a wire bonding method, or a TAB method can be used.

When the thickness of each driver IC is designed to have a thickness equal to that of a counter substrate, the driver IC and the counter substrate can have substantially the same height. Therefore, a display device as a whole can be made thin. Further, when the substrates are formed using the same material, thermal stress is not generated even when a temperature change occurs in the display device. Therefore, the characteristics of the circuit having TFTs are not degraded. Furthermore, when driver circuits are formed using driver ICs that are longer than IC chips as shown in this embodiment mode, the number of driver ICs to be mounted for one pixel region can be reduced.

In this manner, the driver circuits can be built into the display panel.

Embodiment Mode 13

An example where a semiconductor layer of a display panel (an EL display panel or a liquid crystal display panel) manufactured in accordance with Embodiment Modes 4 to 11 is formed using an amorphous semiconductor or SAS and a scan line driver circuit is formed over a substrate will be described.

Figure 31:
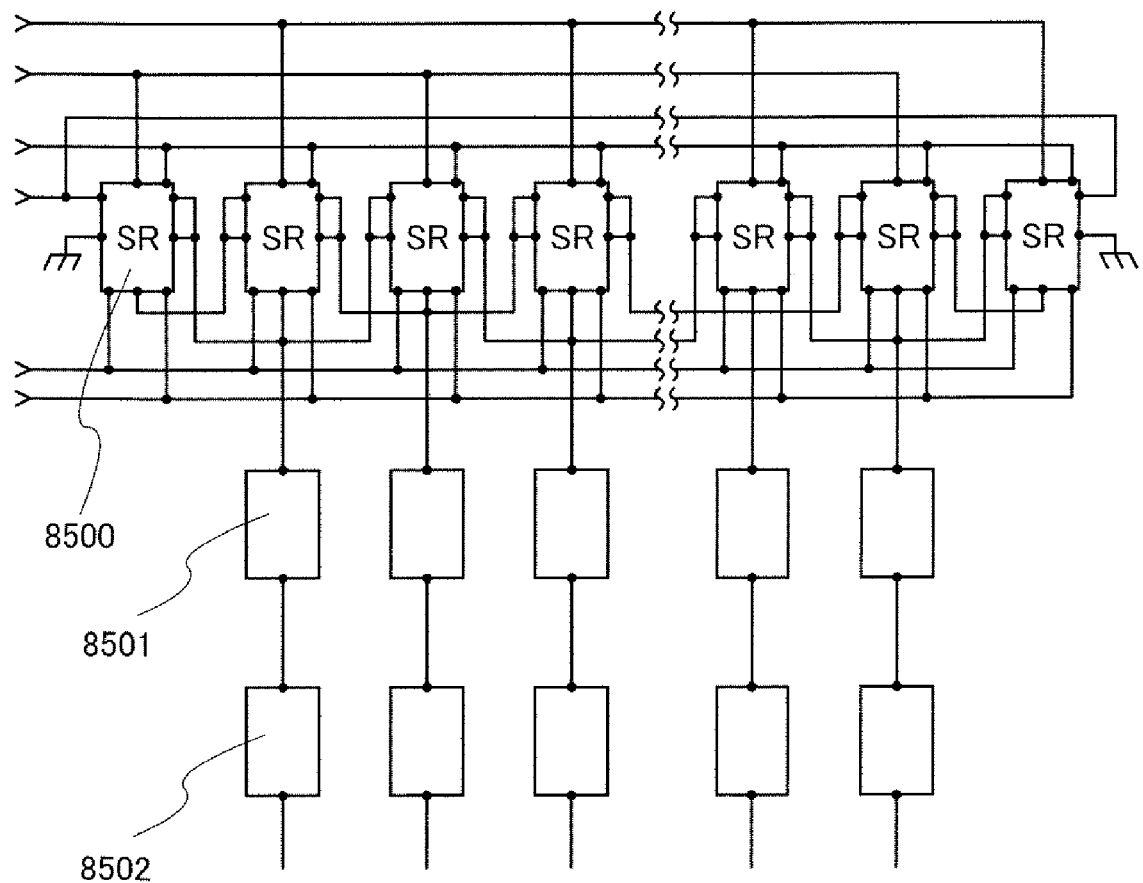
FIG. 31 is an explanatory diagram of a circuit configuration in the case where a scan line driver circuit is formed using a TFT in a display panel of the present invention.

FIG. 31 is a block diagram of a scan line driver circuit constructed from n-channel TFTs that are formed using SAS having an electron field-effect mobility of 1 $cm^2$/V·sec to 15 $cm^2$/V·sec.

In FIG. 31, a block indicated by reference numeral 8500 corresponds to a pulse output circuit which outputs sampling pulses of one stage, and a shift-register includes n number of pulse output circuits. Reference numeral 8501 denotes a buffer circuit, which is connected to a pixel 8502.

Figure 32:
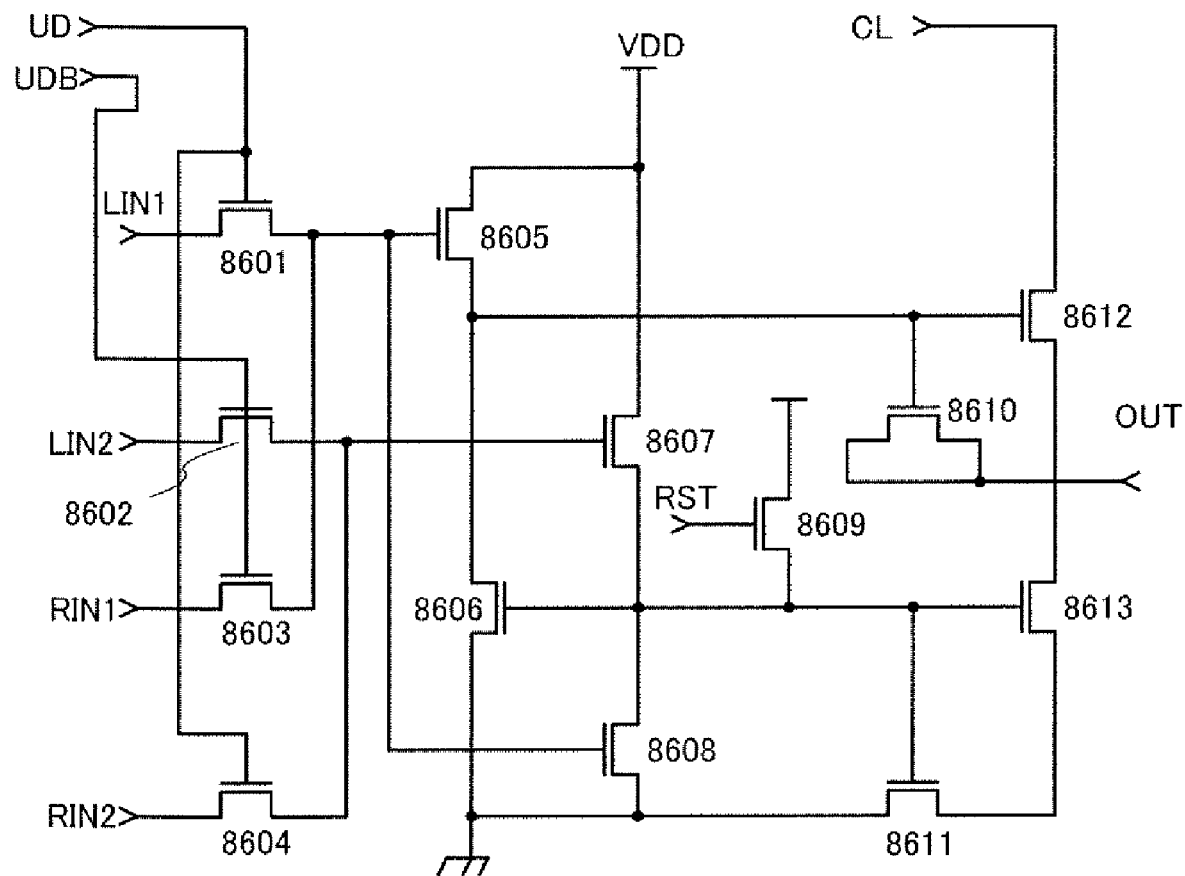
FIG. 32 is an explanatory diagram of a circuit configuration (shift register circuit) in the case where a scan line driver circuit is formed using a TFT in a display panel of the present invention.

FIG. 32 shows a specific configuration of the pulse output circuit 8500, which is constructed from n-channel TFTs 8601 to 8613. The size of the n-channel TFTs formed from SAS may be determined in consideration of the operating characteristics of the TFTs. For example, provided that the channel length is 8 μm, the channel width may be designed to be in the range of 10 μm to 80 μm.

Figure 33:
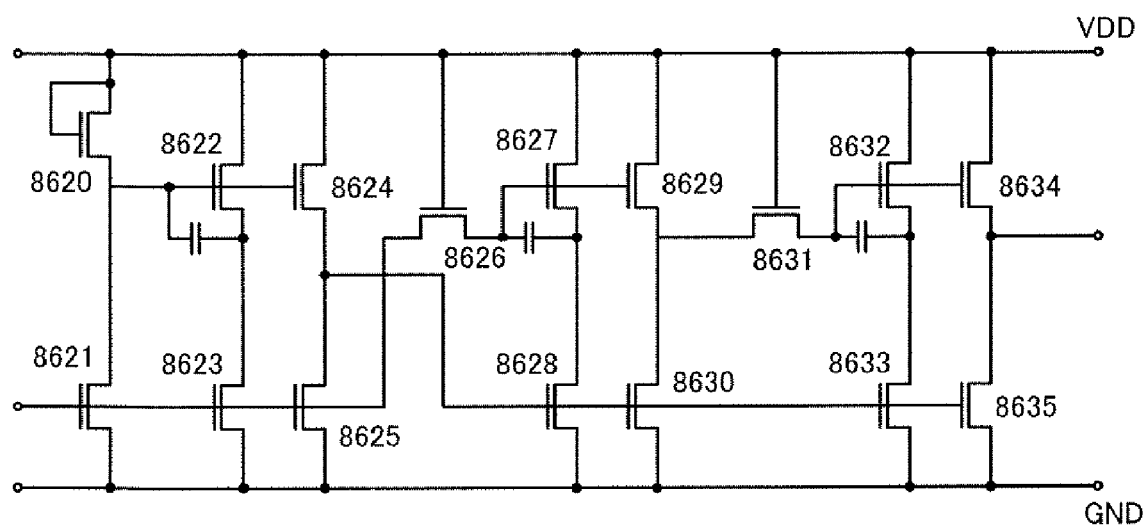
FIG. 33 is an explanatory diagram of a circuit configuration (buffer circuit) in the case where a scan line driver circuit is formed using a TFT in a display panel of the present invention.

FIG. 33 shows a specific configuration of the buffer circuit 8501. The buffer circuit is also constructed from n-channel TFTs 8620 to 8635. The size of the n-channel TFTs formed from SAS may be determined in consideration of the operating characteristics of the TFTs. For example, provided that the channel length is 10 μm, the channel width is designed to be in the range of 10 μm to 1800 μm.

In order to build such circuits, TFTs should be connected through wirings.

In this manner, driver circuits can be built into a display panel.

Embodiment Mode 14

Figure 16:
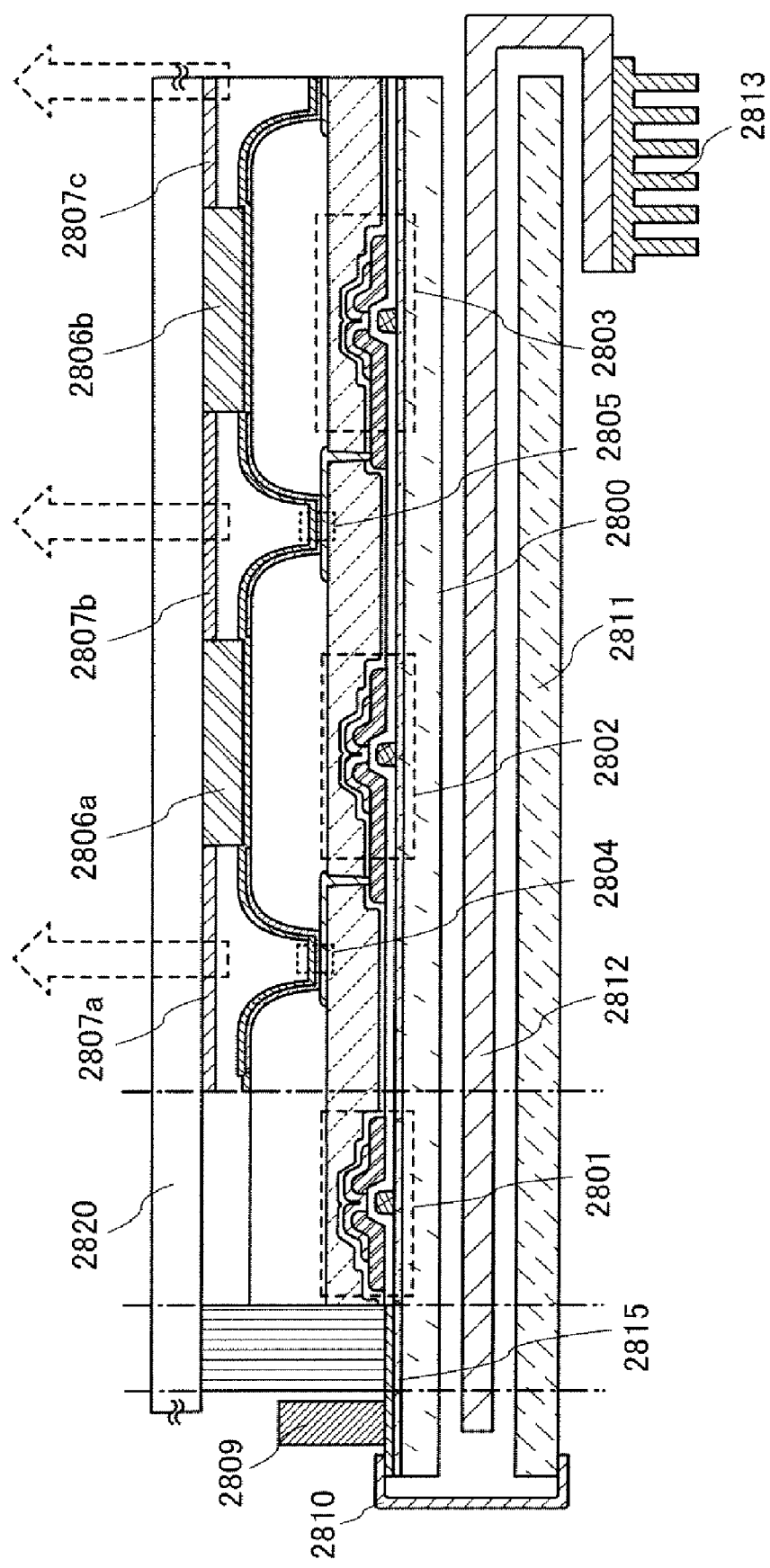
FIG. 16 is an explanatory cross-sectional view of a structure of a display module of the present invention.

This embodiment mode will be described with reference to FIG. 16. FIG. 16 shows an example where an EL display module is constructed by using a TFT substrate 2800 that is manufactured in accordance with the present invention. In FIG. 16, a pixel portion having pixels is formed over the TFT substrate 2800.

In FIG. 16, a protection circuit 2801, which includes a TFT similar to the TFT formed in the pixel or such a TFT whose gate and source or drain are connected together to function as a diode, is provided on the outer side of the pixel portion (between a driver circuit and the pixels). A driver circuit 2809 can be any of a driver IC formed from a single-crystalline semiconductor, a stick driver IC formed from a polycrystalline semiconductor film over a glass substrate, a driver circuit formed from SAS, and the like.

A sealing substrate 2820 is attached to the TFT substrate 2800 with spacers 2806a and 2806b, which are formed by a droplet discharging method, interposed therebetween. The spacers are preferably provided to keep a constant distance between the two substrates even when the substrates are thin or the area of the pixel portion is large. A space above light-emitting elements 2804 and 2805 connected to TFTs 2802 and 2803, respectively between the TFT substrate 2800 and the sealing substrate 2820 may be filled with a solidified resin material which has a light-transmitting property with respect to light at least in the visible range, or may be filled with anhydrous nitrogen or an inert gas.

FIG. 16 shows a top-emission structure in which light emitted from the light-emitting elements 2804 and 2805 is emitted in the direction of the arrows in the drawing. Pixels having different emission colors, i.e., red, green, and blue are formed, whereby multi-color display can be performed. Further, when colored layers 2807a to 2807c corresponding to red, green, and blue colors are provided on the sealing substrate 2820, the color purity of light emitted to the outside can be increased. Furthermore, it is also possible to form white-light-emitting elements in the pixels and combine them with the colored layers 2807a to 2807c.

The driver circuit 2809 that is an external circuit is connected to scan line connection terminals or signal line connection terminals provided at one end of an external circuit board 2811 through a wiring board 2810. In addition, a heat pipe 2813 (a pipe-form highly efficient heat conduction device) and a heat sink 2812, which are used to dissipate heat to the outside of the device, may also be provided to be in contact with or close to the TFT substrate 2800 on which an insulating layer 2815 is formed in order to increase the heat-sink effect.

Although FIG. 16 shows an EL display module with a

Such an EL display module may also be constructed so as to block reflected light from outside by using retardation plates and a polarizing plate. In the case of constructing a display device with a top-emission structure, an insulating layer functioning as a partition may be colored to form a black matrix. Such a partition can be formed by a droplet discharging method or the like, and can be formed with a black resin such as pigment or with a mixture of a resin material such as polyimide and carbon black or the like. Stacked layers of such materials may also be used. Further, a partition may also be formed by discharging different materials in the same region a plurality of times by a droplet discharging method. As the retardation plates, a $\lambda/4$ plate and a $\lambda/2$ plate may be used and designed so as to control light. Specifically, light-emitting elements, a sealing substrate (a sealant), retardation plates (a $\lambda/4$ plate and a $\lambda/2$ plate), and a polarizing plate are sequentially stacked from the side of the TFT element substrate, whereby tight emitted from the light-emitting elements passes through these stacked layers and finally passes through the polarizing plate to go to outside. Such retardation plates and a polarizing plate may be provided on the light-emission side. As for a dual-emission display device in which light is emitted to both the top and bottom sides, such retardation plates and a polarizing plate may be provided on each side. Further, an anti-reflection film may also be provided on the outer side of the polarizing plate. Accordingly, images with higher definition and resolution can be displayed.

It is also possible to form a sealed structure by bonding a resin film to the side of the pixel portion of the TFT substrate 2800 with the use of a sealant or an adhesive resin. Although a glass substrate is used for sealing in this embodiment mode, various sealing methods using a resin, plastics, a film, and the like can also be used. Further, a gas barrier film for preventing moisture penetration is preferably provided on the surface of the resin film. With a film-sealed structure, further reduction in thickness and weight can be achieved.

This embodiment mode can be appropriately combined with any of Embodiment Modes 1 to 8, 12, and 13.

Embodiment Mode 15

Figure 20A:
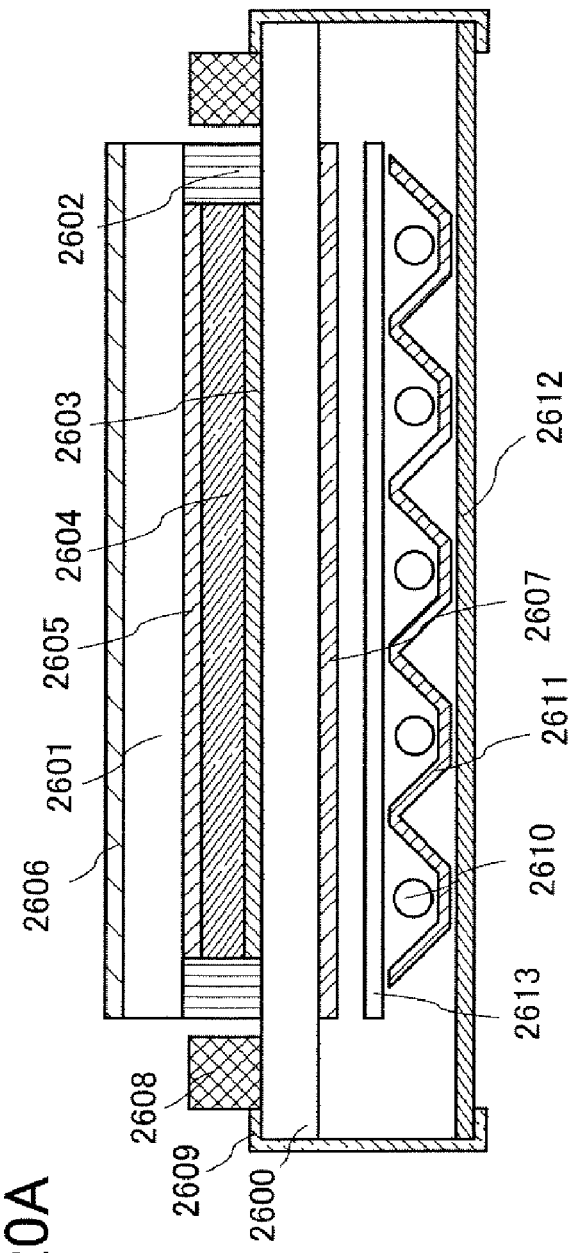
FIGS. 20A and 20B are explanatory cross-sectional views of a structure of a display module of the present invention.
Figure 20B:
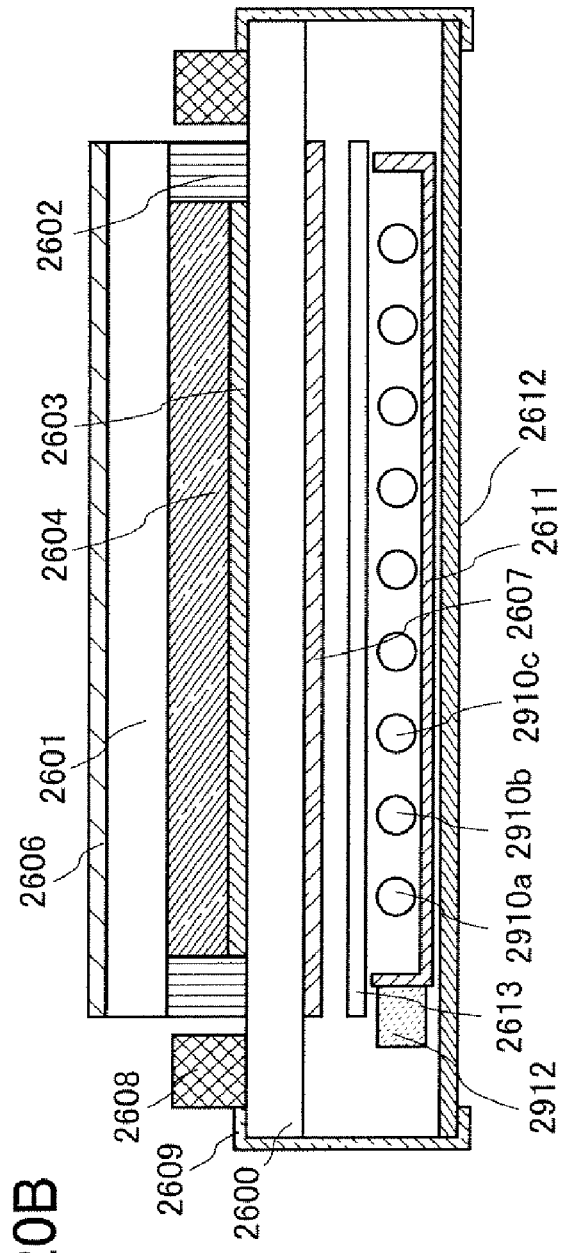

This embodiment mode will be described with reference to FIGS. 20A and 20B. FIGS. 20A and 20B each show an example of constructing a liquid crystal display module using a TFT substrate 2600 that is manufactured by using the present invention.

FIG. 20A shows an example of a liquid crystal display module in which the TFT substrate 2600 and a counter substrate 2601 are bonded with a sealant 2602, and a pixel portion 2603 and a liquid crystal layer 2604 are provided therebetween to form a display region. A colored layer 2605 is necessary to perform color display. In order to perform RGB display, colored layers corresponding to red, green, and blue colors are provided for respective pixels. A polarizing plate 2606 is provided on the outer side of the counter substrate 2601, while a polarizing plate 2607 and a diffusion plate 2613 are provided on the outer side of the TFT substrate 2600. A light source includes a cold cathode tube 2610 and a reflection plate 2611. A circuit board 2612, which has external circuits such as a control circuit and a power supply circuit, is connected to a wiring circuit 2608 of the TFT substrate 2600 with a flexible wiring board 2609. Further, a retardation plate may also be provided between the polarizing plate and the liquid crystal layer.

The liquid crystal display module can use any of a TN (Twisted Nematic) mode, an IPS (in-Plane-Switching) mode, an FFS (Fringe Field Switching) mode, an MVA (Multi-domain Vertical Alignment) mode, a PVA (Patterned Vertical Alignment) mode, an ASM (Axially Symmetric aligned Micro-cell) mode, an OCB (Optical Compensated Birefringence) mode, an FLC (Ferroelectric Liquid Crystal) mode, an AFLC (AntiFerroelectric Liquid Crystal) mode, and the like.

FIG. 20B shows an example of an FS-LCD (Field Sequential-LCD) in which an OCB mode is applied to the liquid crystal display module shown in FIG. 20A. The FS-LCD emits red light, green light, and blue light during one frame period and can perform color display by combining images using a time division method. Since each light is emitted by a light-emitting diode, a cold cathode tube, or the like, a color filter is not necessary. Therefore, it is not necessary to provide color filters of three primary colors and restrict the display region of each color, and thus all of three colors can be displayed in any region. On the other hand, since light of three colors is emitted during one frame period, high-speed response is required for liquid crystals. By using an FLC mode in combination with an FS method and an OCB mode for a display device of the present invention, a display device or a liquid crystal television device with high performance and high image quality can be completed.

An OCB-mode liquid crystal layer has a so-called π-cell structure. In the π-cell structure, liquid crystal molecules are aligned so that their pretilt angles are plane-symmetric with respect to a center plane between an active matrix substrate and a counter substrate. The alignment state of a π-cell structure is splay alignment when a voltage is not applied between the substrates and shifts to bend alignment when a voltage is applied therebetween. This bend alignment exhibits white display. When a voltage is further applied, liquid crystal molecules of bend alignment become perpendicular to both the substrates so that light is not transmitted. With the OCB mode, a response speed about 10 times higher than that of a conventional TN mode can be achieved.

As an alternative mode corresponding to the FS mode, it also possible to use, for example, HV(Half V)-FLC or SS(Surface Stabilized)-FLC that uses FLC (Ferroelectric Liquid Crystal) capable of high-speed operation. Nematic liquid crystals having relatively low viscosity can be used for the OCB mode, while smectic liquid crystals having a ferroelectric phase can be used for the HV-FLC and the SS-FLC.

The optical response speed of a liquid crystal display module can be increased by narrowing the cell gap of the liquid crystal display module. Alternatively, the optical response speed can also be increased by decreasing the viscosity of a liquid crystal material. The increase in response speed is particularly effective in the case where a pixel region of a TN-mode liquid crystal display module has a pixel pitch less than or equal to 30 μm. Furthermore, the response speed can also be increased by using an overdrive method by which a voltage applied is increased (or decreased) for a moment.

FIG. 20B shows a transmissive liquid crystal display module in which a red light source 2910*a*, a green light source 2910*b*, and a blue light source 2910*c* are provided as light sources. A controller 2912 is also provided for switching ON or OFF of the red light source 2910*a*, the green light source 2910*b*, and the blue light source 2910*c*. The controller 2912 controls the emission of each color. Light enters the liquid crystals, and images are combined by a time division method, so that color display is performed.

This embodiment mode can be appropriately combined with any of Embodiment Modes 1 to 3 and 9 to 13.

Embodiment Mode 16

Figure 27:
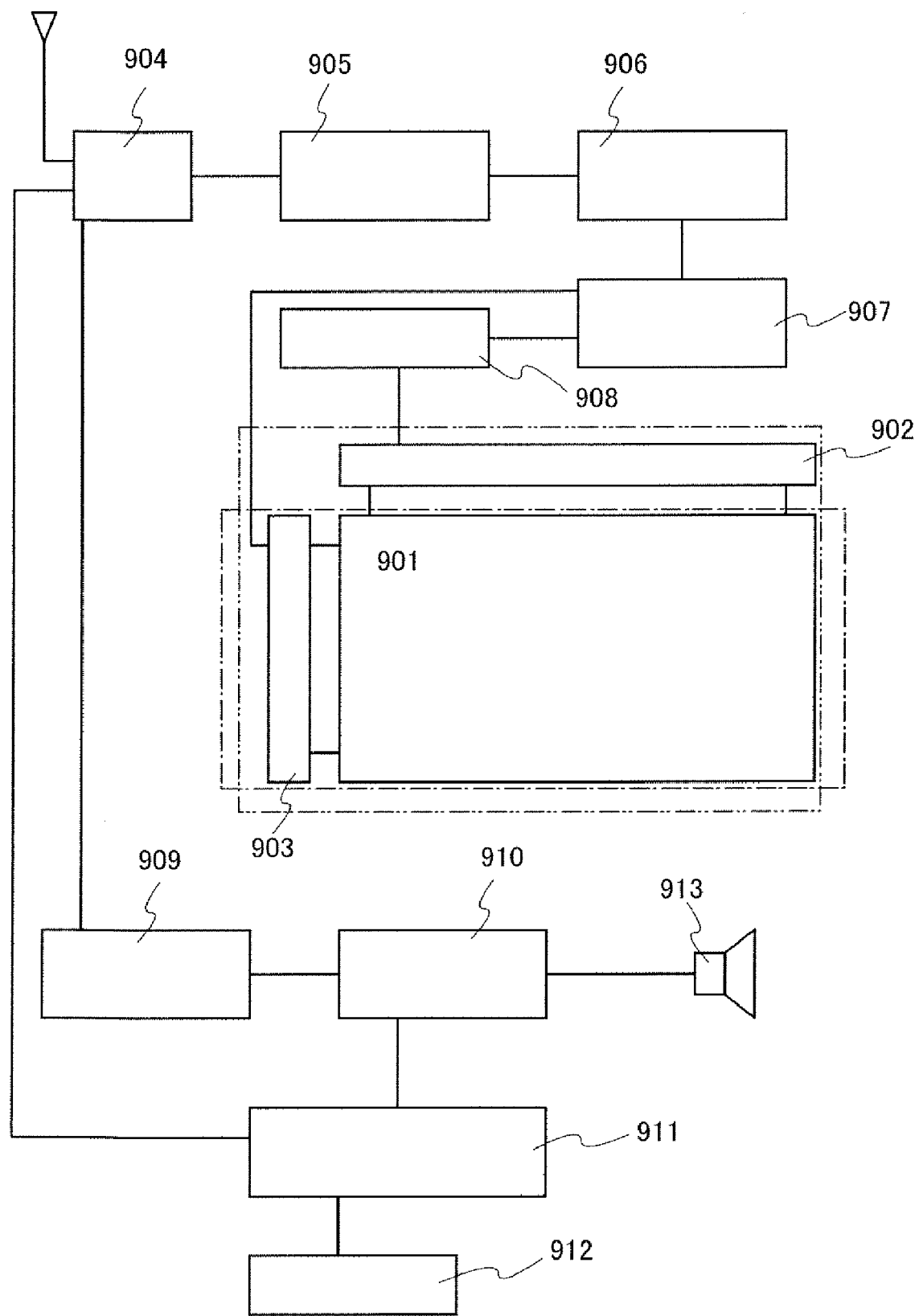
FIG. 27 is a block diagram illustrating a main structure of an electronic device to which the present invention can be applied.

With a display device formed in accordance with the present invention, a television device (or simply called a television or a television receiver) can be completed. FIG. 27 shows a block diagram showing the main structure of a television device.

FIG. 25A is a plan view showing the structure of a display panel in accordance with the present invention. A pixel portion 2701 having a matrix arrangement of pixels 2702, scan line input terminals 2703, and signal line input terminals 2704 are formed over a substrate 2700 having an insulating surface. The number of pixels can be determined in accordance with various standards. For examples, XGA for RGB full-color display requires 1024×768×3 (RGB) pixels; UXGA for RGB full-color display requires 1600×1200×3 (RGB) pixels; and full-spec high-vision ROB full-color display requires 1920×1080×3 (RGB) pixels.

Scan lines that extend from the scan line input terminals 2703 and signal lines that extend from the signal line input terminals 2704 intersect with each other, whereby the pixels 2702 are arranged in matrix. Each pixel 2702 in the pixel portion 2701 includes a switching element and a pixel electrode layer connected thereto. A typical example of the switching element is a TFT. A gate electrode layer of the TFT is connected to a scan line, while a source or drain of the TFT is connected to a signal line, whereby each pixel can be independently controlled by a signal input from outside.

Although FIG. 25A illustrates the structure of a display panel in which signals input to the scan lines and the signal lines are controlled by external driver circuits, it is also possible to mount driver ICs 2751 on the substrate 2700 by a COG (Chip on Glass) method as shown in FIG. 26A. Alternatively, a TAB (Tape Automated Bonding) method shown in FIG. 26B may also be employed. The driver ICs can be constructed either by forming circuits using a single-crystalline semiconductor substrate or forming a circuit with TFT over a glass substrate. In FIGS. 26A and 26B, the driver ICs 2751 are connected to FPCs (Flexible Printed Circuits) 2750.

In the case of forming TFTs provided in the pixels by using a crystalline semiconductor, it is possible to form a scan line driver circuit 3702 over a substrate 3700 as shown in FIG. 25B. In FIG. 25B, a pixel portion 3701 is controlled by external driver circuits connected to the signal line input terminals 3704 similarly to FIG. 25A. In the case of forming TFTs provided in the pixels by using a polycrystalline (or microcrystalline) semiconductor, a single-crystalline semiconductor, or the like which has high mobility, it is possible to form a pixel portion 4701, a scan line driver circuit 4702, and a signal line driver circuit 4704 over the same substrate 4700 as shown in FIG. 25C.

The display panel can have the structure shown in FIG. 25A in which only a pixel portion 901 in FIG. 27 is formed over the substrate, while a scan line driver circuit 903 and a signal line driver circuit 902 are mounted on the substrate by a TAB method as shown in FIG. 26B or a COG method as shown in FIG. 26A; the structure shown in FIG. 25B in which the pixel portion 901 and the scan line driver circuit 903 are formed with TFTs over the substrate, while the signal line driver circuit 902 is mounted on the substrate in the form of driver IC; or the structure shown in FIG. 25C in which the pixel portion 901, the signal line driver circuit 902, and the scan line driver circuit 903 are formed over the same substrate.

FIG. 27 shows the structures of other external circuits, which include a video signal amplifier circuit 905 for amplifying video signals among signals received at a tuner 904, a video signal processing circuit 906 for converting signals output from the video signal amplifier circuit 905 into color signals corresponding to red, green, and blue colors, a control circuit 907 for converting the video signals so as to be input to the driver ICs, and the like on the input side of the video signals. The control circuit 907 outputs signals to each of the scan line driver circuit 903 and the signal line driver circuit 902. In the case of digitally driving the display panel, a signal divider circuit 908 may be provided on the signal line driver circuit side so that input digital signals can be divided into m number of signals before supplied.

Audio signals among the signals received at the tuner 904 are transmitted to an audio signal amplifier circuit 909, and an output thereof is supplied to a speaker 913 through an audio signal processing circuit 910. The control circuit 911 receives control data on the receiving station (reception frequency) or sound volume from an input portion 912, and transmits signals to the tuner 904 and the audio signal processing circuit 910.

By incorporating the above-described display module into a housing as shown in FIGS. 28A and 28B, a television device can be completed. When a liquid crystal display module is used as a display module, a liquid crystal television device can be manufactured, and when an EL module is used, an EL television device can be manufactured. Further, a plasma television, electronic paper, and the like can also be manufactured. Referring to FIG. 28A, a display module constitutes a main display screen 2003, and other accessories such as speaker portions 2009 and operation switches are provided. As described above, a television device can be completed according to the present invention.

A display panel 2002 is built into a housing 2001. When the television device is connected to wired or wireless communications networks via a modem 2004, data communication of one way (from a transmitter to a receiver) or two ways (between a transmitter and a receiver or between receivers) as well as reception of general television broadcasting can be performed with a receiver 2005. The television device can be operated with switches incorporated in the housing or with a separate remote controller 2006. The remote controller 2006 may also be provided with a display portion 2007 for displaying data to be output.

In addition, the television device may also have additional functions of displaying channels or sound volume such as a sub-display screen 2008 having a second display panel in addition to the main display screen 2003. In this structure, both the main display screen 2003 and the sub-display screen 2008 can be formed with liquid crystal display panels of the present invention. Alternatively, it is also possible to form the main display screen 2003 with an EL display panel having an excellent viewing angle and form the sub-display screen 2008 with a liquid crystal display panel capable of low-power-consumption drive. As a further alternative, in order to achieve low-power-consumption drive, it is also possible to form the main display screen 2003 with a liquid crystal display panel and form the sub-display screen 2008 with an EL display panel, and the sub-display screen 2008 may have a blinking function. With the present invention, an inexpensive display device can be manufactured even when a large-sized substrate and a large number of TFTs and electronic components are used.

FIG. 28B shows a television device having a large display portion with a size of, for example, 20 inches to 80 inches and includes a housing 2010, a display portion 2011, a remote controller 2012 which is an operating portion, speaker portions 2013, and the like. The present invention is applied to the manufacturing of the display portion 2011. The television device shown in FIG. 28B is of a wall-hanging type and does not require large space.

Of course, the present invention can be applied not to only television devices but also various objects such as monitors of personal computers and large display media such as information display boards at the train station or the airport and advertising display boards on the streets.

This embodiment mode can be appropriately combined with any of Embodiment Modes 1 to 15.

Embodiment Mode 17

Electronic devices in accordance with the present invention include television devices (or simply called televisions or television receivers), cameras such as digital cameras and digital video cameras, mobile phone sets (or simply called mobile phones), portable information terminals such as PDA, portable game machines, computer monitors, computers, audio reproducing devices such as car audio sets, image reproducing devices having recording media such as home-use game machines, and the like. Specific examples of such electronic devices will now be described with reference to FIGS. 29A to 29E.

Figure 29A:
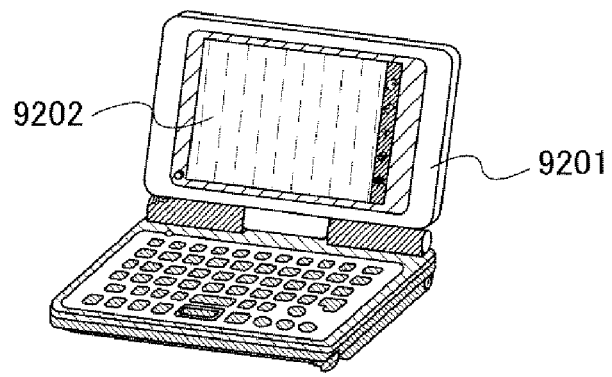
FIGS. 29A to 29E are views illustrating electronic devices to which the present invention can be applied.

A portable information terminal shown in FIG. 29A includes a main body 9201, a display portion 9202, and the like. The display device of the present invention can be applied to the display portion 9202. As a result, a manufacturing process can be simplified and cost reduction can be achieved. Therefore, a portable information terminal can be provided at low cost.

Figure 29B:
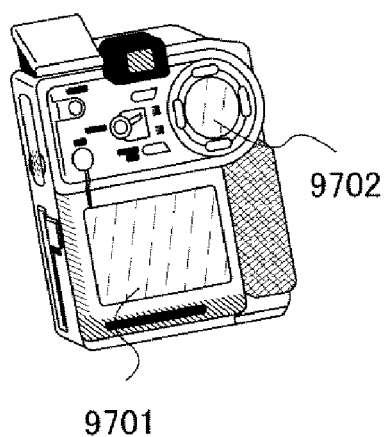

A digital video camera shown in FIG. 29B includes display portions 9701 and 9702 and the like. The display device of the present invention can be applied to the display portion 9701. As a result, a manufacturing process can be simplified and cost reduction can be achieved. Therefore, a digital video camera can be provided at low cost.

Figure 29C:
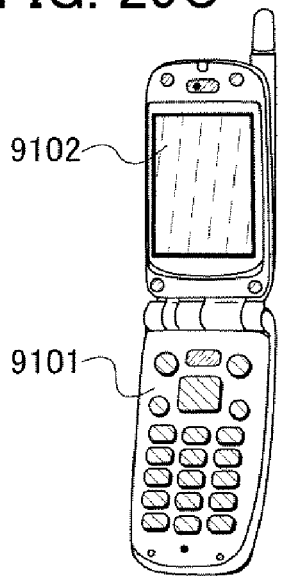

A portable phone shown in FIG. 29C includes a main body 9101, a display portion 9102, and the like. The display device of the present invention can be applied to the display portion 9102. As a result, a manufacturing process can be simplified and cost reduction can be achieved. Therefore, a portable phone can be provided at low cost.

Figure 29D:
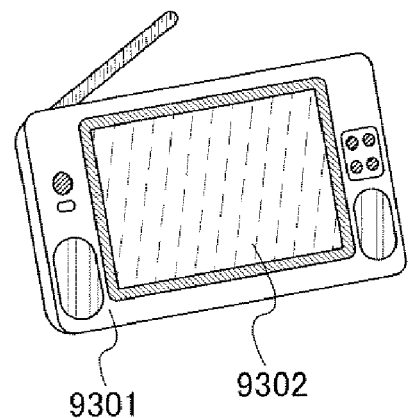

A portable television device shown in FIG. 29D includes a main body 9301, a display portion 9302, and the like. The display device of the present invention can be applied to the display portion 9302. As a result, a manufacturing process can be simplified and cost reduction can be achieved. Therefore, a television device can be provided at low cost. The display device of the present invention can be applied to various television devices such as a compact television device built into a portable terminal typified by a portable phone, a medium-size television device that can be carried about, and a large television device (e.g., 40 inches or more).

Figure 29E:
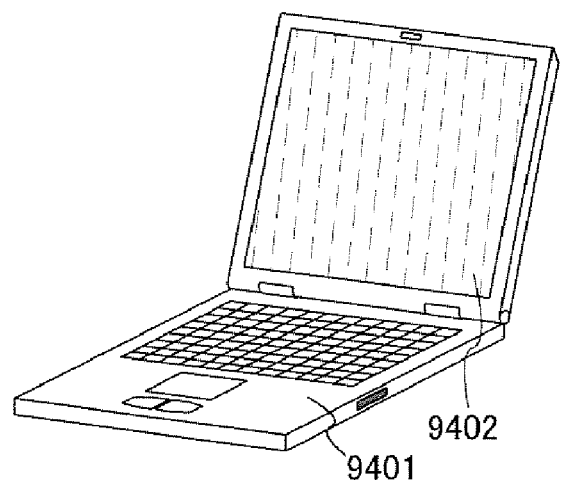

A portable computer shown in FIG. 29E includes a main body 9401, a display portion 9402, and the like. The display device of the present invention can be applied to the display portion 9402. As a result, a manufacturing process can be simplified and cost reduction can be achieved. Therefore, a computer can be provided at low cost.

As described above, electronic devices can be provided at low cost with the use of the display device of the present invention.

This embodiment mode can be appropriately combined with any of Embodiment Modes 1 to 16.

This application is based on Japanese Patent Application serial no. 2006-279206 filed in Japan Patent Office on Oct. 12, 2006, the entire contents of which are hereby incorporated by reference.

What is claimed is:

1. A method for manufacturing a semiconductor device, comprising the steps of:
   forming a first conductive layer;
   forming an insulating layer over the first conductive layer;
   contacting an end of a tube to the insulating layer, wherein the end of the tube opens and the periphery of the tube is supported by a supporting film;
   supplying a treatment agent to the insulating layer through the tube to form an opening, which reaches the first conductive layer, in the insulating layer; and
   forming a second conductive layer at least in the opening to be in contact with the first conductive layer.

2. The method for manufacturing the semiconductor device according to claim 1, wherein the second conductive layer is formed by discharging a composition including a conductive material through the tube.

3. The method for manufacturing the semiconductor device according to claim 1, wherein the treatment agent is sucked and removed through the tube after being discharged from the tube.

4. The method for manufacturing the semiconductor device according to claim 1, wherein the tube has a needle shape.

5. The method for manufacturing the semiconductor device according to claim 1, wherein the treatment agent is an etching gas or an etchant.

6. A method for manufacturing a semiconductor device, comprising the steps of:
    forming a first conductive layer;
    forming a first insulating layer over the first conductive layer;
    forming a second insulating layer over the first insulating layer;
    embedding an end of a tube into the second insulating layer to form a first opening;
    supplying a treatment agent to the first insulating layer through the tube to form a second opening, which reaches the first conductive layer, in the first insulating layer; and
    forming a second conductive layer at least in the first opening and the second opening to be in contact with the first conductive layer.

7. The method for manufacturing the semiconductor device according to claim 6, wherein the second conductive layer is formed by discharging a composition including a conductive material through the tube.

8. The method for manufacturing the semiconductor device according to claim 6, wherein the treatment agent is sucked and removed through the tube after being discharged from the tube.

9. The method for manufacturing the semiconductor device according to claim 6, wherein the tube has a needle shape.

10. The method for manufacturing the semiconductor device according to claim 6, wherein the treatment agent is an etching gas or an etchant.

11. A method for manufacturing a semiconductor device, comprising the steps of:
    forming a gate electrode layer;
    forming a gate insulating layer adjacent to the gate electrode layer;
    forming a semiconductor layer adjacent to the gate insulating layer;
    forming a source electrode layer and a drain electrode layer adjacent to the semiconductor layer;
    forming an insulating layer over the source electrode layer and the drain electrode layer;
    connecting an end of a tube to be in contact with the insulating layer, wherein the periphery of the tube is supported by a supporting film;
    supplying a treatment agent to the insulating layer through the tube to form an opening, which reaches the source electrode layer or the drain electrode layer, in the insulating layer; and
    forming a pixel electrode layer at least in the opening to be in contact with the source electrode layer or the drain electrode layer.

12. The method for manufacturing the semiconductor device according to claim 11, wherein the treatment agent is sucked and removed through the tube after being discharged from the tube.

13. The method for manufacturing the semiconductor device according to claim 11, wherein the tube has a needle shape.

14. The method for manufacturing the semiconductor device according to claim 11, wherein the treatment agent is an etching gas or an etchant.

15. A method for manufacturing a semiconductor device, comprising the steps of:
    forming a semiconductor layer including a source region and a drain region;
    forming a gate insulating layer over the semiconductor layer;
    forming a gate electrode layer over the gate insulating layer;
    forming an insulating layer over the gate electrode layer;
    forming a first opening in the insulating layer by using a first tube;
    supplying a treatment agent to the insulating layer through the first tube to form a second opening, which reaches the source region, in the insulating layer and the gate insulating layer;
    forming a source electrode layer to be in contact with the source region at least in the first opening and the second opening;
    forming a third opening in the insulating layer by using a second tube;
    supplying a treatment agent to the insulating layer through the second tube to form a fourth opening, which reaches the drain region, in the insulating layer and the gate insulating layer; and
    forming a drain electrode layer to be in contact with the drain region at least in the third opening and the fourth opening.

16. The method for manufacturing the semiconductor device according to claim 15, wherein the treatment agent is sucked and removed through the first tube and the second tube after being discharged from the first tube and the second tube.

17. The method for manufacturing the semiconductor device according to claim 15, wherein each of the first tube and the second tube has a needle shape.

18. The method for manufacturing the semiconductor device according to claim 15, wherein the treatment agent is an etching gas or an etchant.

19. The method for manufacturing the semiconductor device according to claim 1, wherein the tube and the supporting film are removed after the opening is formed.

20. The method for manufacturing the semiconductor device according to claim 6, wherein the tube is removed after the openings are formed.

21. The method for manufacturing the semiconductor device according to claim 11, wherein the tube and the supporting film are removed after the opening is formed.

22. The method for manufacturing the semiconductor device according to claim 15, wherein the first and second tubes are removed after the openings are formed.

23. The method for manufacturing the semiconductor device according to claim 1, wherein the periphery of the tube is in direct contact with the supporting film.

24. The method for manufacturing the semiconductor device according to claim 11, wherein the periphery of the tube is in direct contact with the supporting film.

* * * * *

UNITED STATES PATENT AND TRADEMARK OFFICE
CERTIFICATE OF CORRECTION

PATENT NO. : 7,968,453 B2
APPLICATION NO. : 11/870530
DATED : June 28, 2011
INVENTOR(S) : Koichiro Tanaka et al.

It is certified that error appears in the above-identified patent and that said Letters Patent is hereby corrected as shown below:

In the Specification:

Column 10, line 25, "536h provided with the opening" should read "536b provided with the opening"

Column 51, line 11, "copper phtbalocyanine (abbreviation: CuPc)" should read "copper phthalocyanine (abbreviation: CuPc)"

Column 55, line 27, "a seating substrate" should read "a sealing substrate"

Column 63, line 65, "having tow concentration" should read "having low concentration"

Column 65, line 34, "which ROB light-emitting diodes" should read "which RGB light-emitting diodes"

Column 76, line 7, "whereby tight emitted" should read "whereby light emitted"

Column 78, line 2, "high-vision ROB full-color" should read "high-vision RGB color"

Signed and Sealed this
Thirteenth Day of March, 2012

David J. Kappos
*Director of the United States Patent and Trademark Office*